(12) United States Patent
Guidash et al.

(10) Patent No.: US 9,264,639 B2
(45) Date of Patent: Feb. 16, 2016

(54) FEEDTHROUGH-COMPENSATED IMAGE SENSOR

(71) Applicant: Rambus Inc., Sunnyvale, CA (US)

(72) Inventors: Michael Guidash, Rochester, NY (US); Jay Endsley, San Jose, CA (US); John Ladd, Santa Clara, CA (US); Thomas Vogelsang, Mountain View, CA (US); Craig M. Smith, Spencerport, NY (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/616,546

(22) Filed: Feb. 6, 2015

(65) Prior Publication Data

US 2015/0229859 A1    Aug. 13, 2015

Related U.S. Application Data

(60) Provisional application No. 62/091,408, filed on Dec. 12, 2014, provisional application No. 62/076,011, filed on Nov. 6, 2014, provisional application No. 61/954,517, filed on Mar. 17, 2014, provisional application No. 61/937,436, filed on Feb. 7, 2014.

(51) Int. Cl.
*H04N 5/374* (2011.01)
*H04N 5/365* (2011.01)
(Continued)

(52) U.S. Cl.
CPC .............. *H04N 5/374* (2013.01); *H04N 5/3577* (2013.01); *H04N 5/365* (2013.01); *H04N 5/378* (2013.01); *H04N 5/3765* (2013.01); *H01L 27/14643* (2013.01)

(58) Field of Classification Search
CPC ... H04N 3/1512; H04N 5/374; H04N 5/3741; H04N 5/3745; H04N 5/37457; H04N 3/1506; H01L 27/14643

See application file for complete search history.

(56) References Cited

U.S. PATENT DOCUMENTS 6,515,318 B2 * 2/2003 Tsunai ........................... 257/239
6,635,857 B1 * 10/2003 Kindt ......................... 250/208.1

(Continued)

FOREIGN PATENT DOCUMENTS

| EP | 2109306 A2 | 10/2009 |
|---|---|---|
| JP | 2002-199282 A | 12/2002 |
| WO | WO-2006-124346 A1 | 11/2006 |

OTHER PUBLICATIONS

PCT International Search Report and Written Opinion dated Jul. 9, 2015 in International Application No. PCT/US2015/014912. 14 pages.

(Continued)

*Primary Examiner* — Nelson D. Hernández Hernández
(74) *Attorney, Agent, or Firm* — Charles Shemwell

(57) ABSTRACT

A control pulse is generated a first control signal line coupled to a transfer gate of a pixel to enable photocharge accumulated within a photosensitive element of the pixel to be transferred to a floating diffusion node, the first control signal line having a capacitive coupling to the floating diffusion node. A feedthrough compensation pulse is generated on a second signal line of the pixel array that also has a capacitive coupling to the floating diffusion node. The feedthrough compensation pulse is generated with a pulse polarity opposite the pulse polarity of the control pulse and is timed to coincide with the control pulse such that capacitive feedthrough of the control pulse to the floating diffusion node is reduced.

13 Claims, 41 Drawing Sheets

(51) Int. Cl.
*H04N 5/378* (2011.01)
*H04N 5/376* (2011.01)
*H04N 5/357* (2011.01)
*H01L 27/146* (2006.01)

(56) References Cited

U.S. PATENT DOCUMENTS

| | | | |
|---|---|---|---|
| 6,696,687 B1* | 2/2004 | Tomisaki et al. | 250/370.09 |
| 8,299,513 B2* | 10/2012 | Dai | 257/292 |
| 2004/0190092 A1 | 9/2004 | Silverbrook et al. | |
| 2006/0065813 A1* | 3/2006 | Yamaguchi | 250/208.1 |
| 2006/0261246 A1* | 11/2006 | Krymski | 250/208.1 |
| 2008/0179642 A1 | 7/2008 | Lee et al. | |
| 2008/0284762 A1 | 11/2008 | Sakloka et al. | |
| 2010/0157120 A1* | 6/2010 | Compton et al. | 348/294 |
| 2012/0120300 A1* | 5/2012 | Dai | 348/340 |
| 2012/0193546 A1 | 8/2012 | Okada | |
| 2012/0218451 A1 | 8/2012 | Rajasekaran | |

OTHER PUBLICATIONS

PCT Invitation to Pay Additional Fees dated Apr. 29, 2015 with Results of the Partial International Search for Int'l. Application PCT/US2015/014912. 5 pages.

* cited by examiner

Conditional-Read

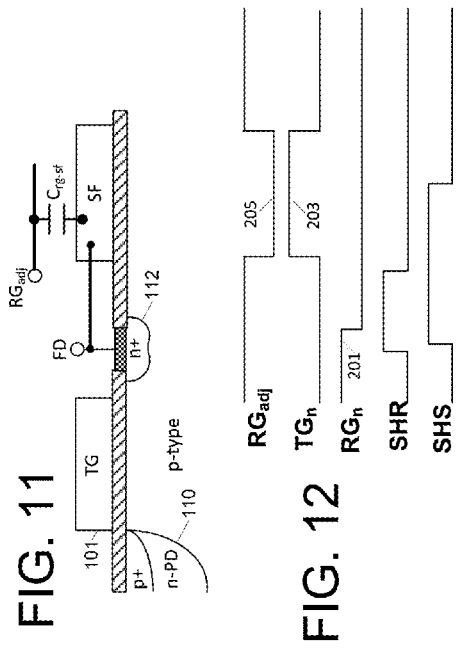

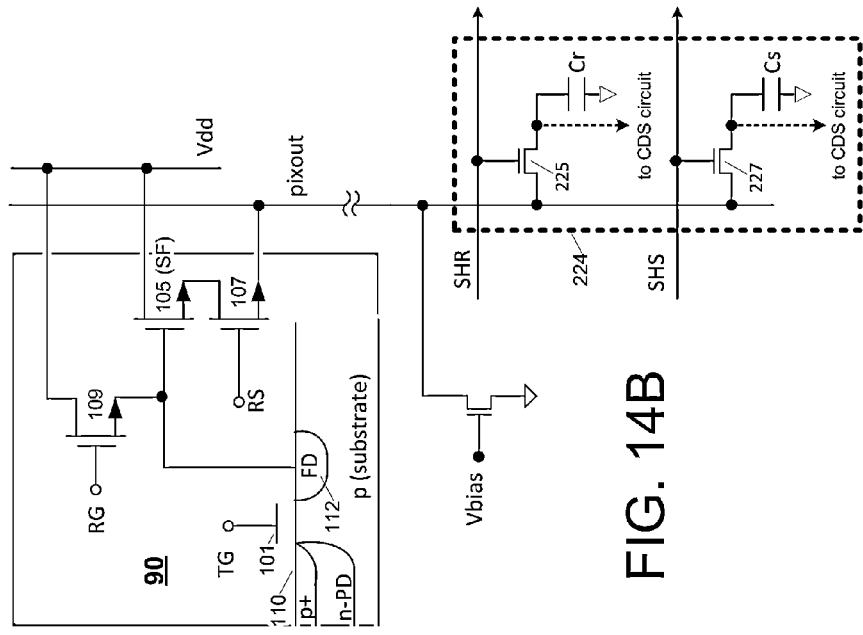
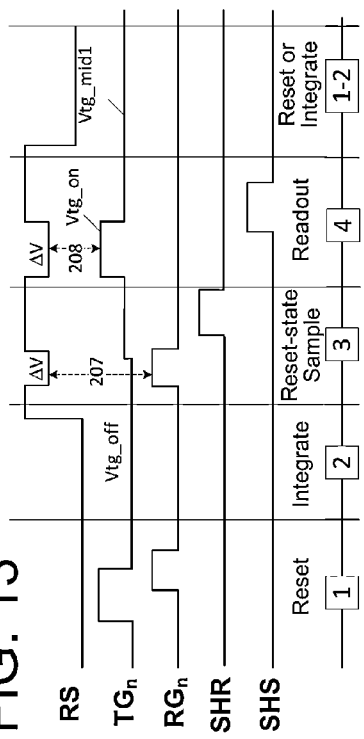
FIG. 13
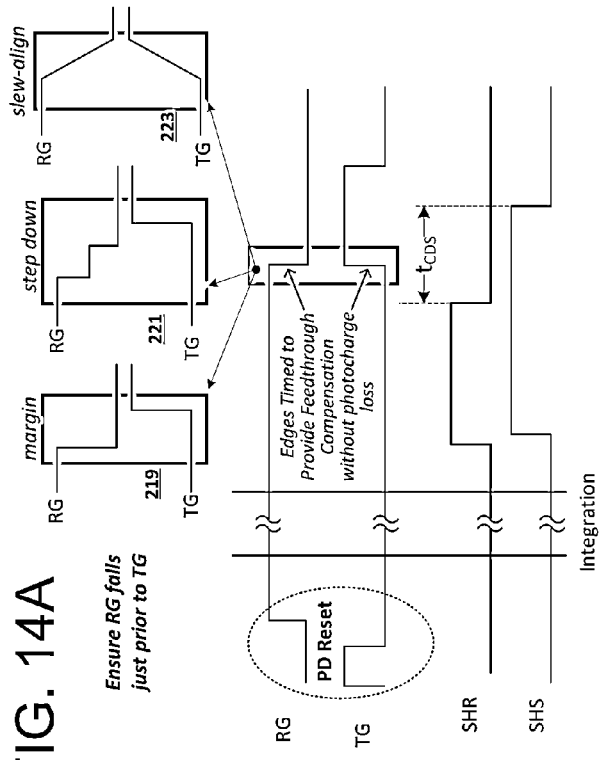
FIG. 14A
FIG. 14B

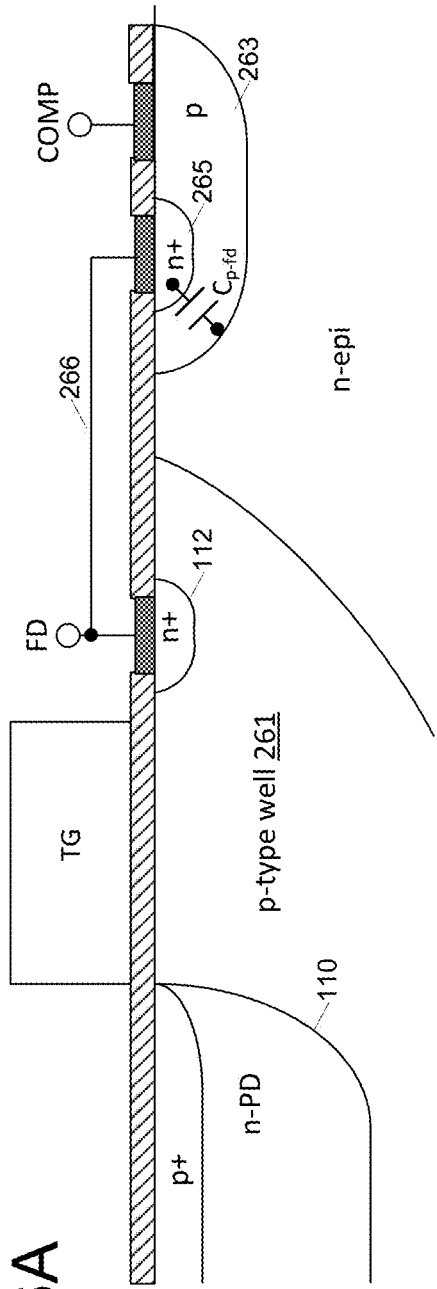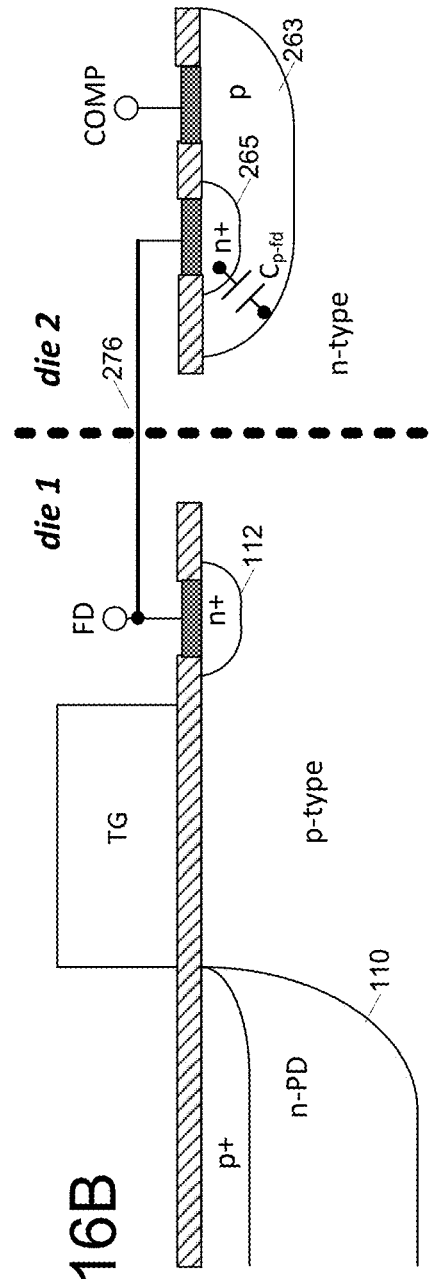
FIG. 16A
FIG. 16B

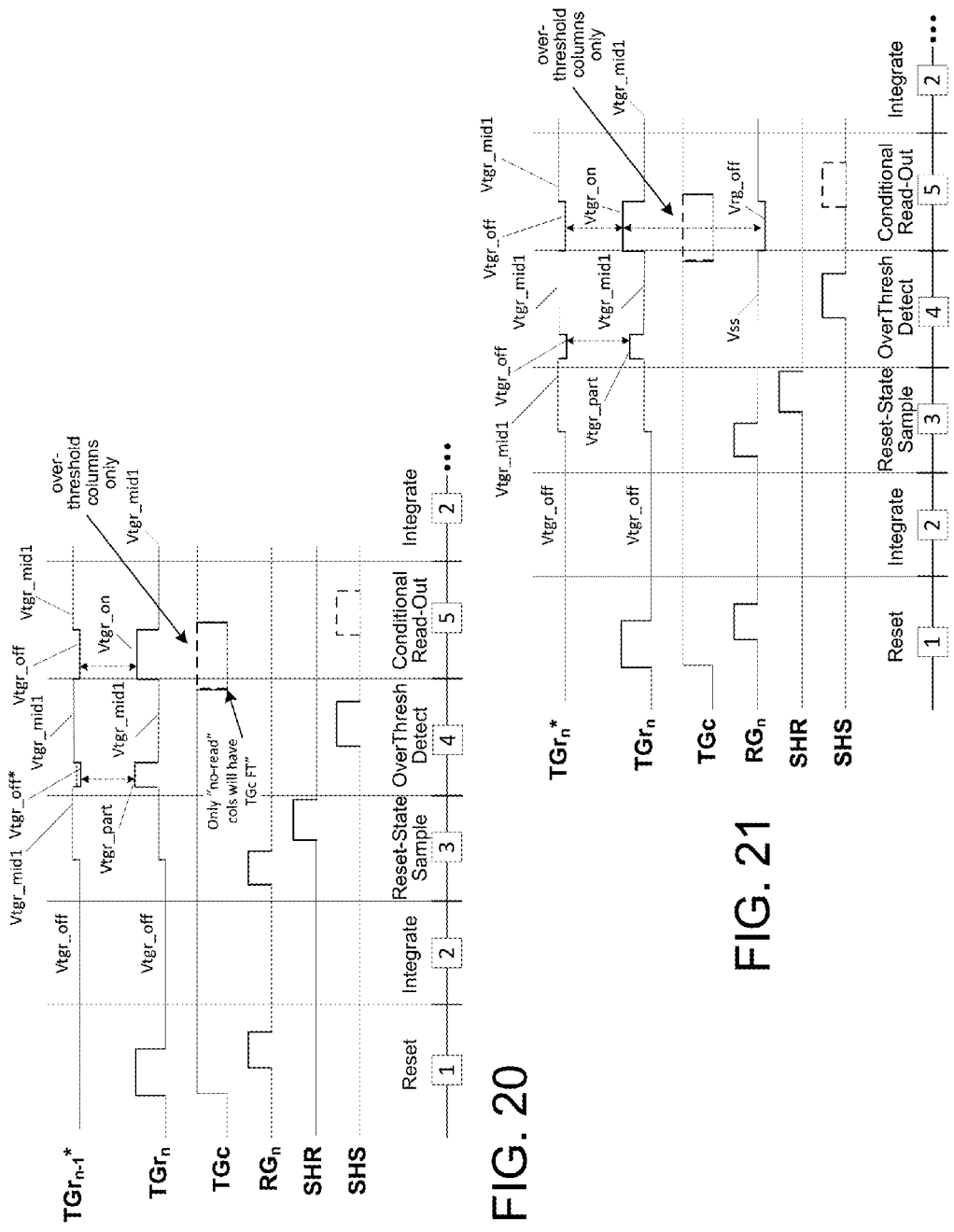

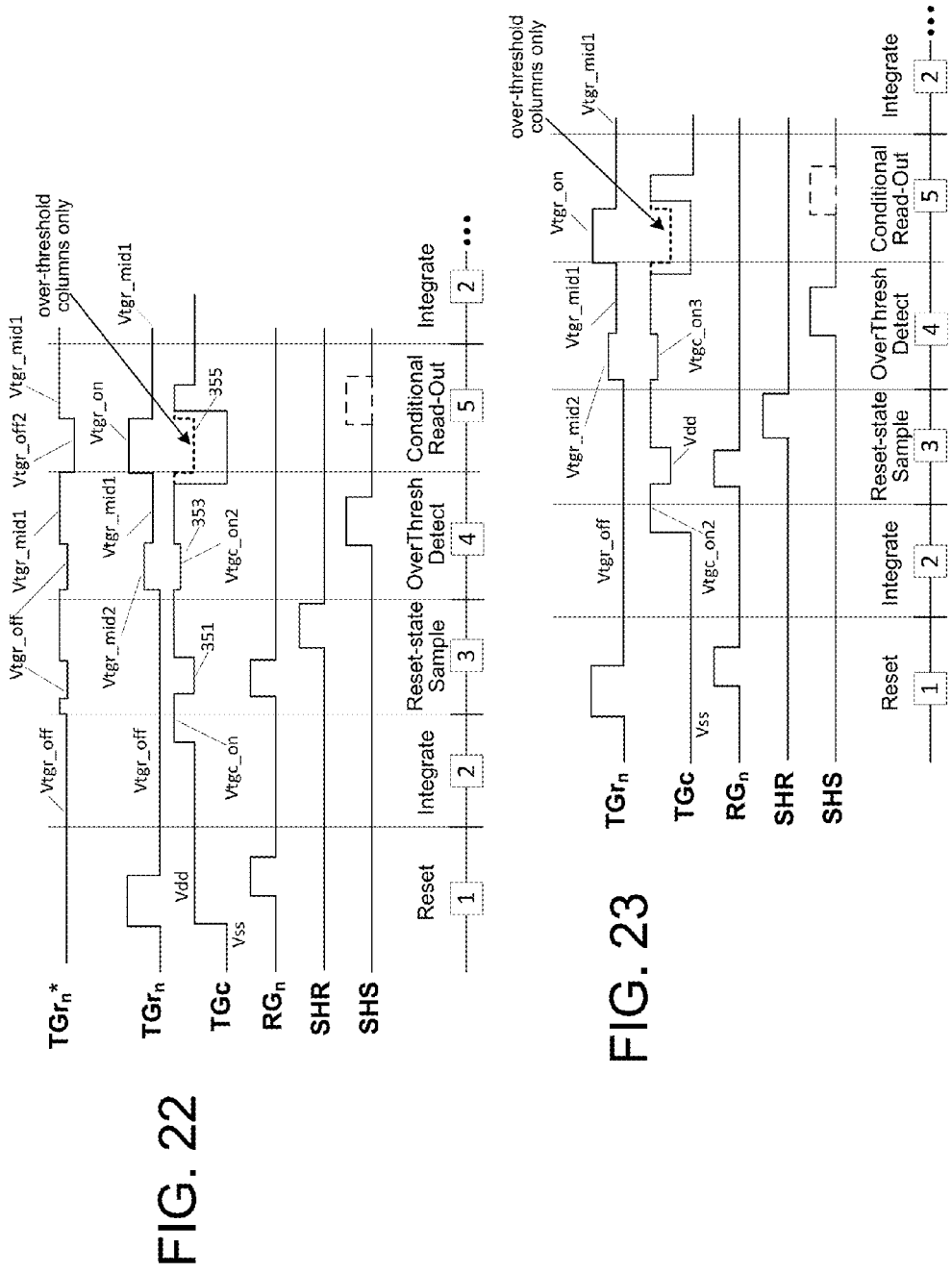

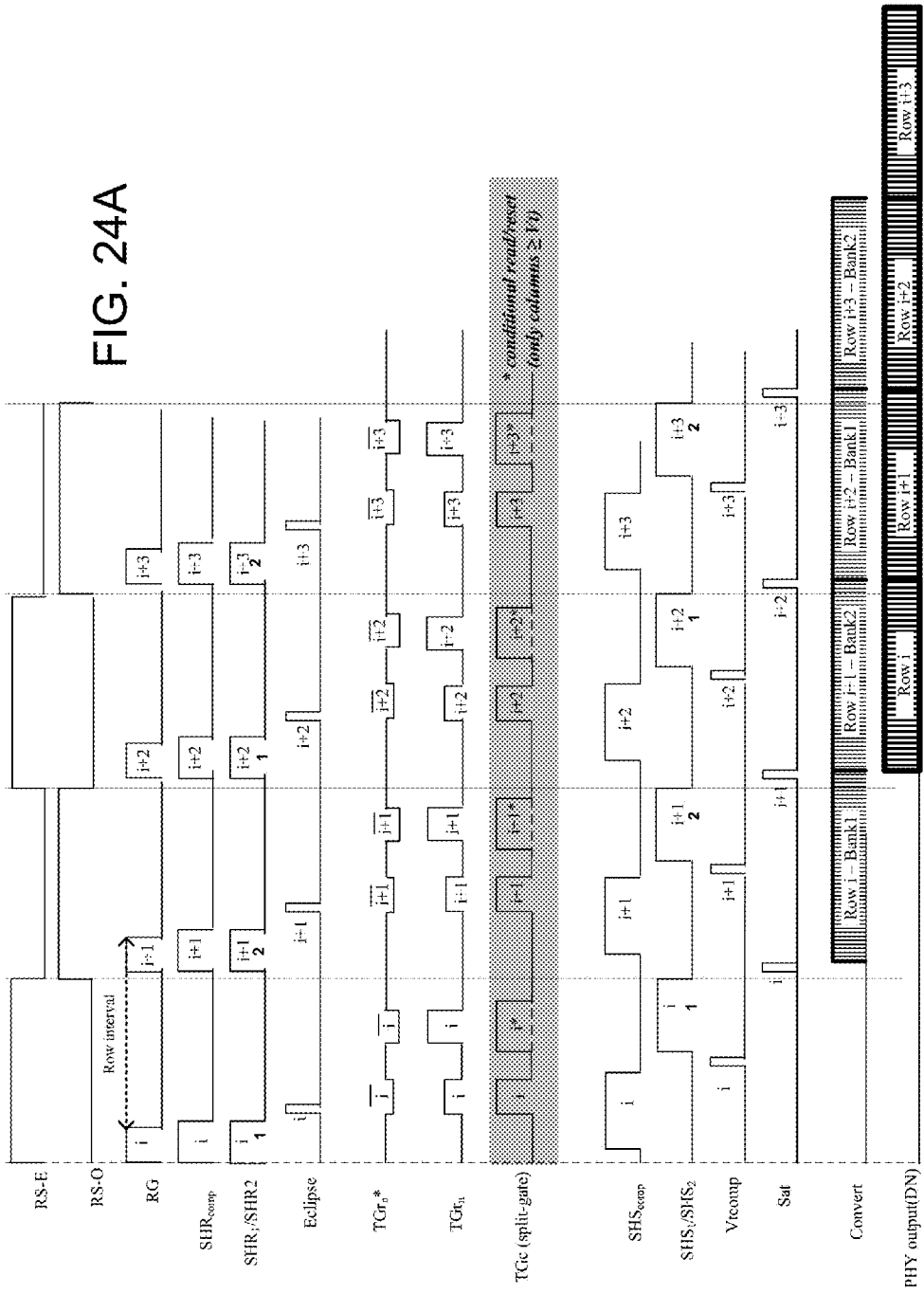

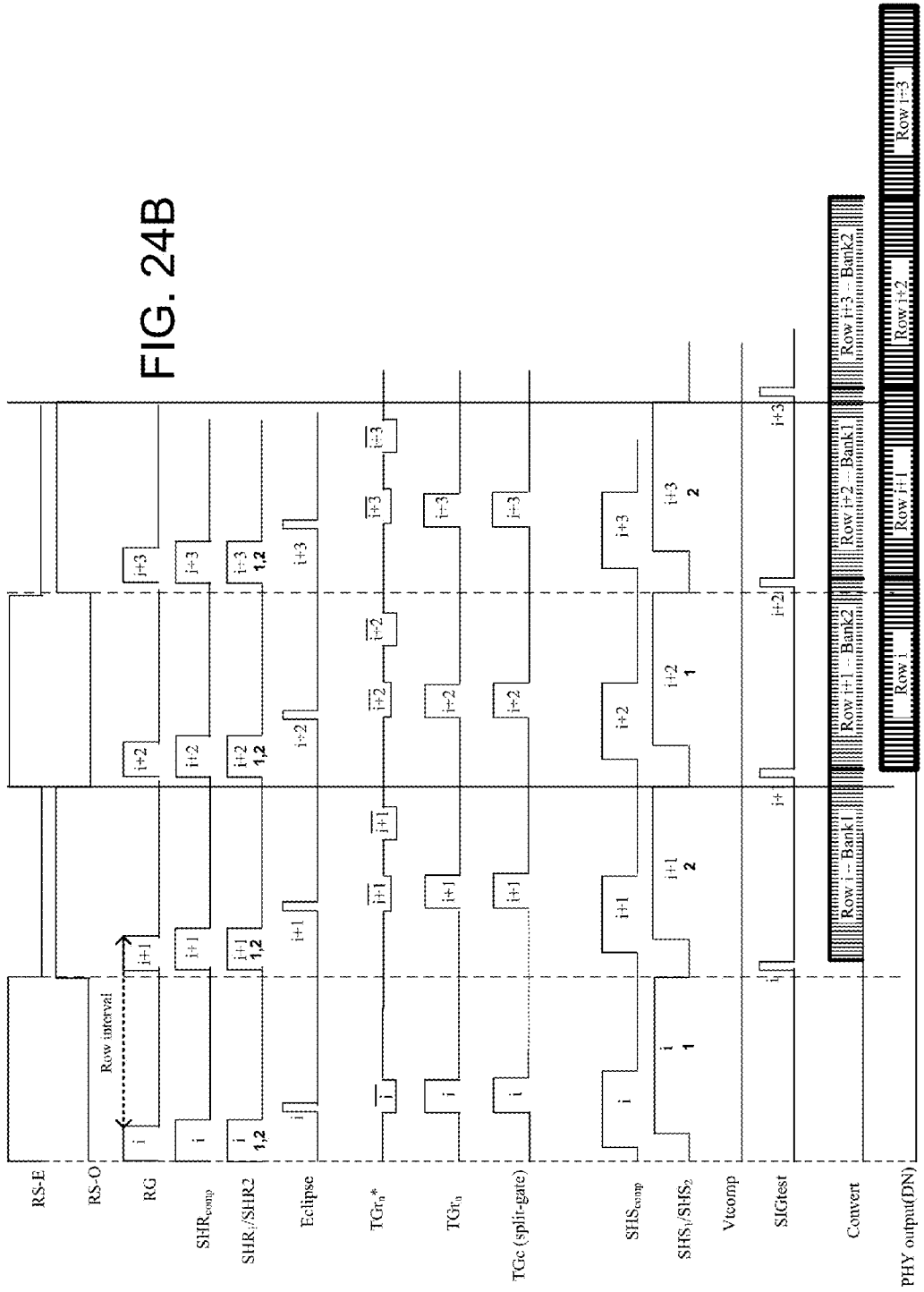

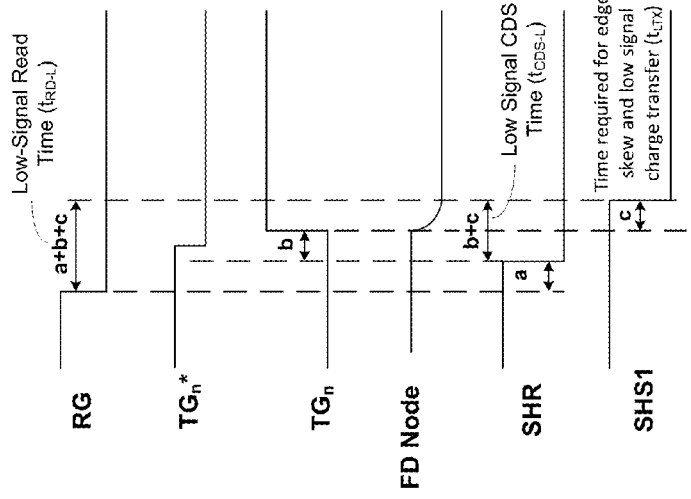
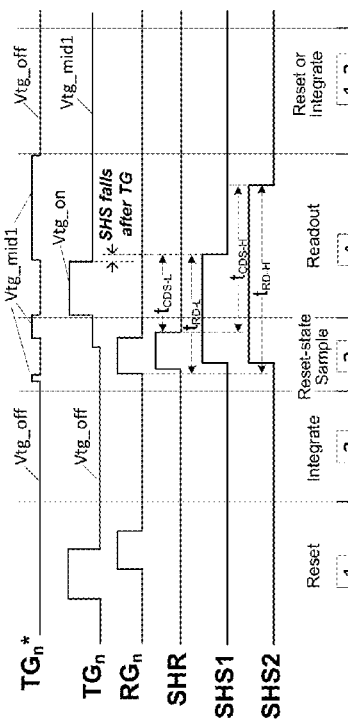
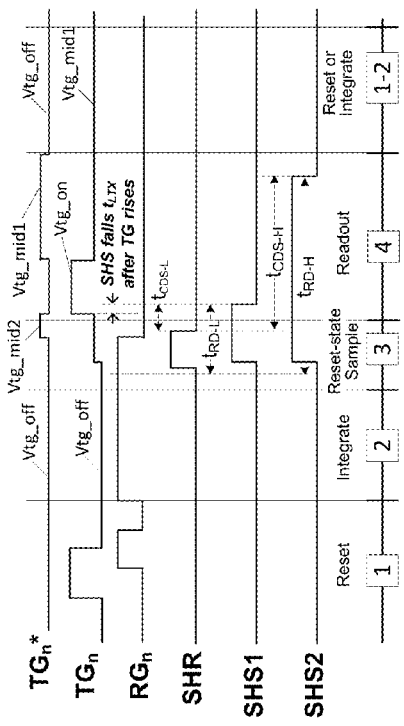

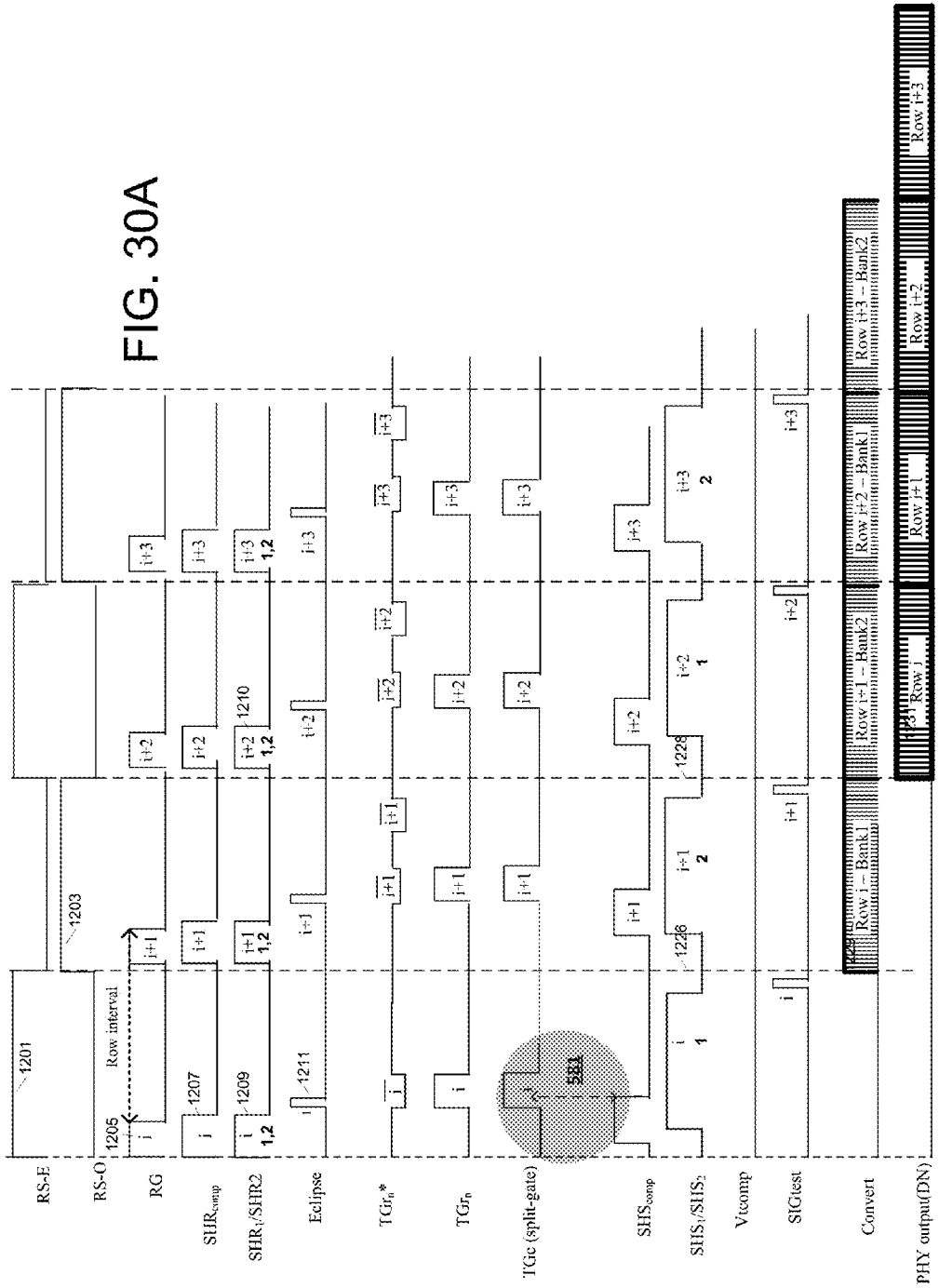

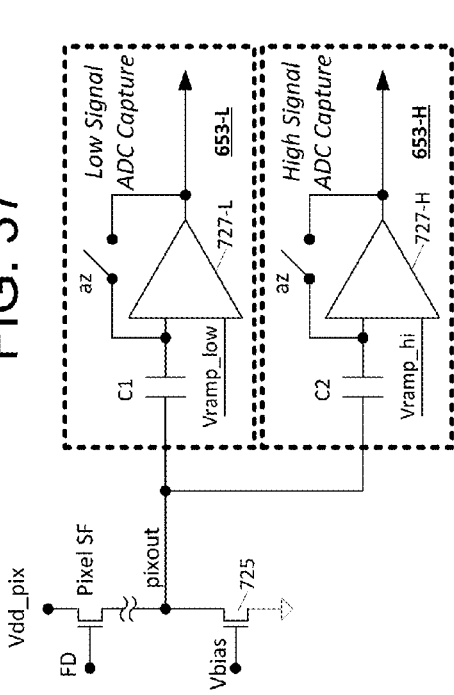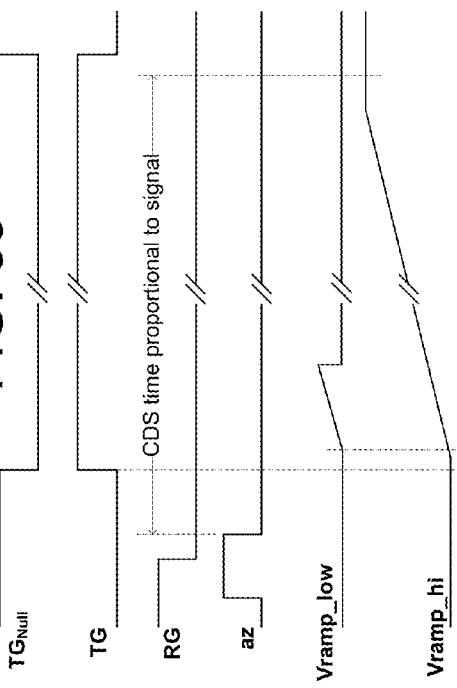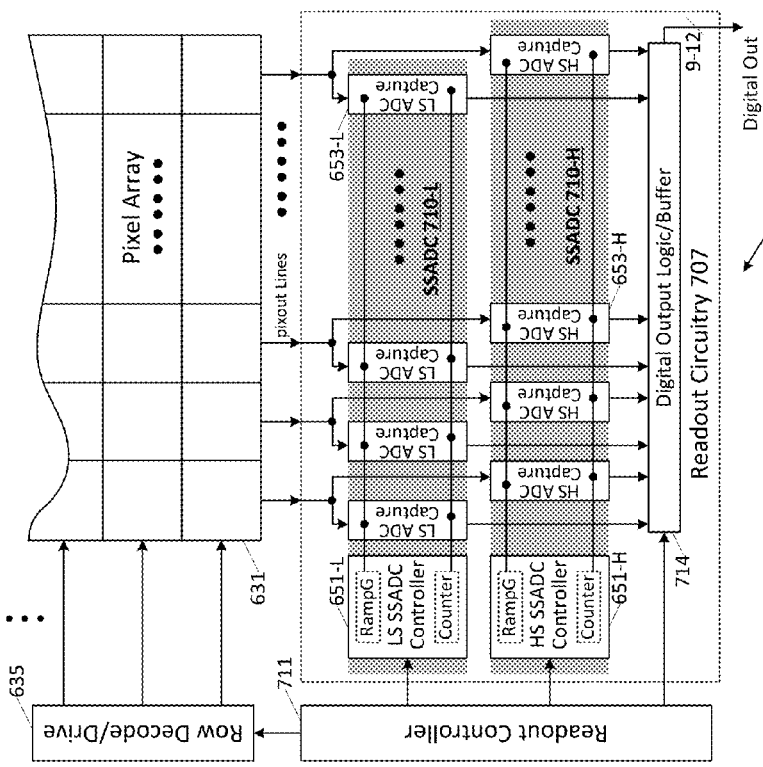

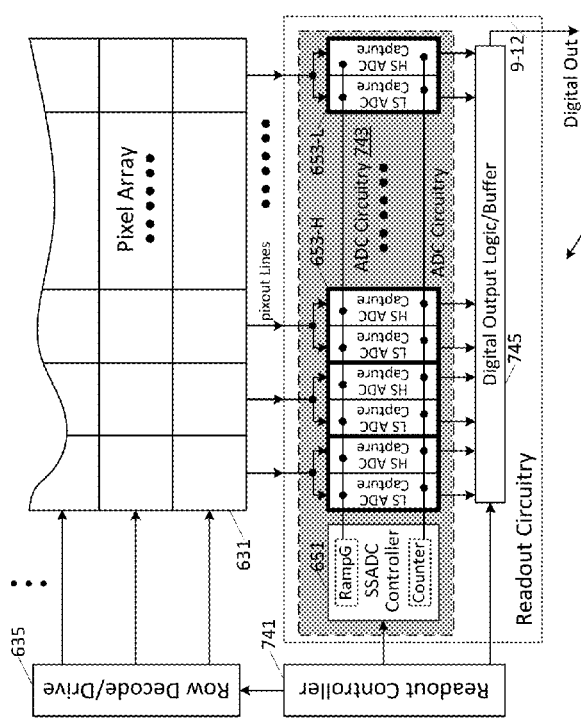
FIG. 39
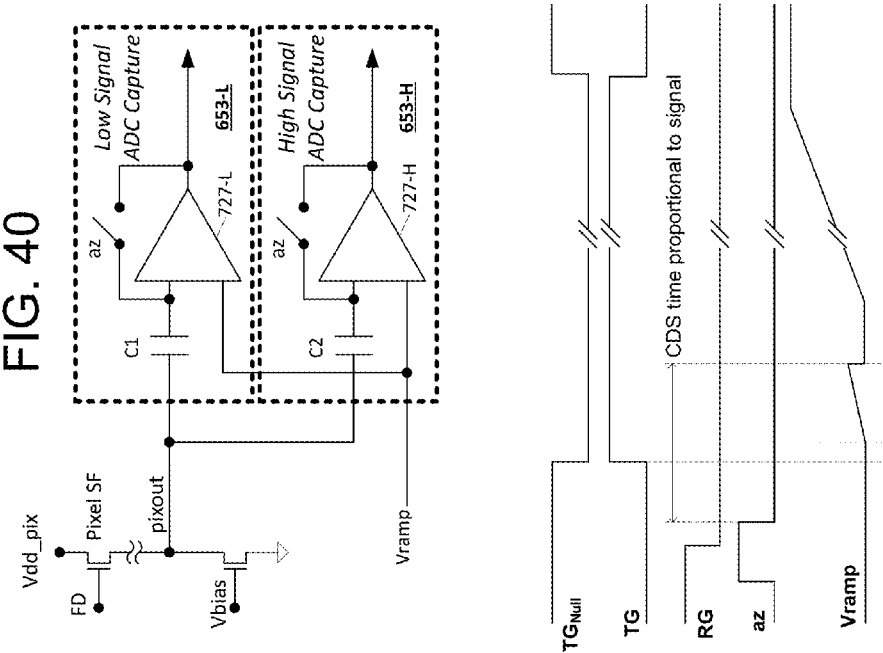
FIG. 40
FIG. 41

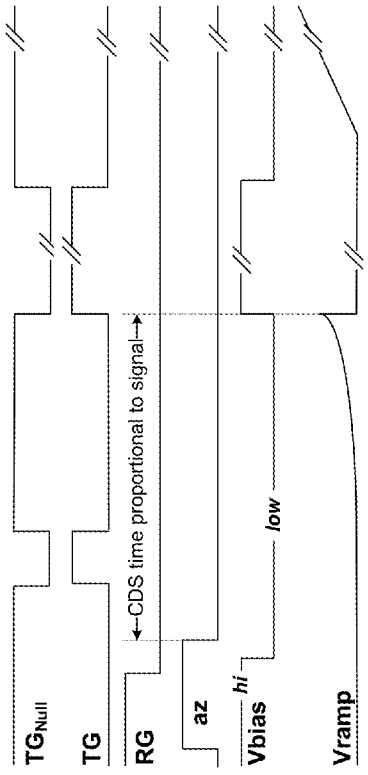
FIG. 44
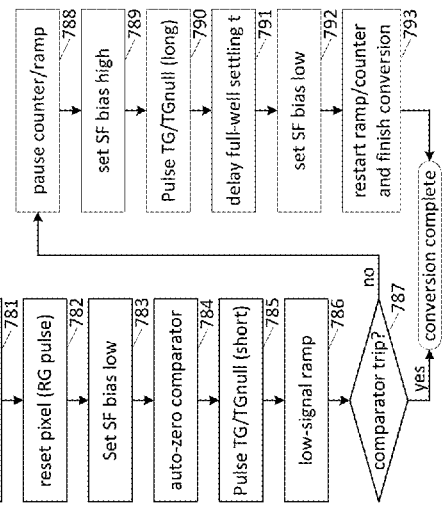
FIG. 45
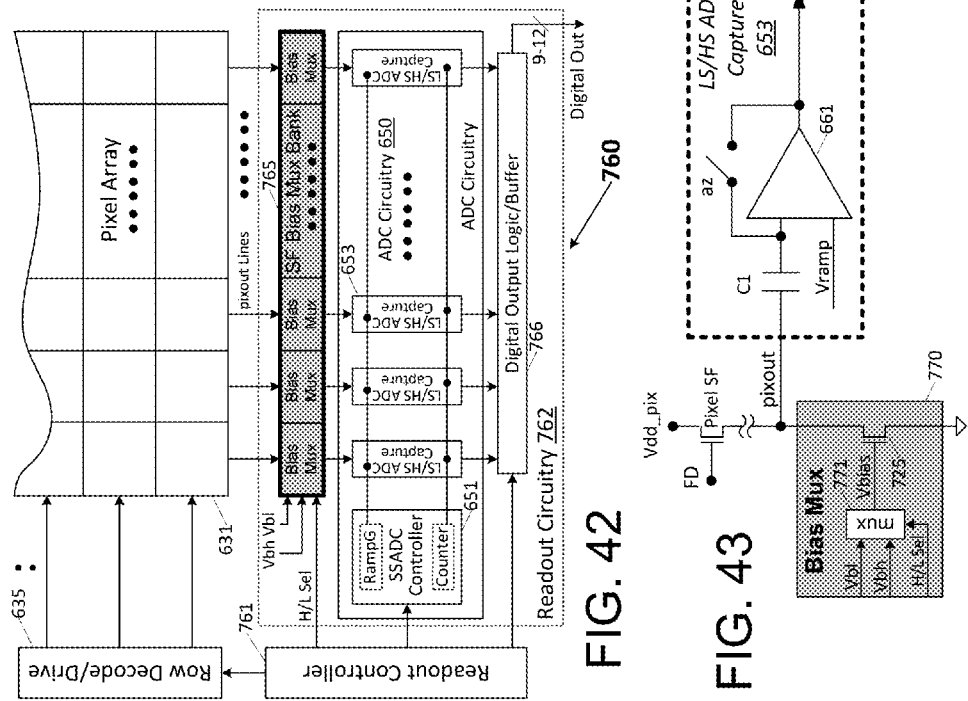
FIG. 42
FIG. 43

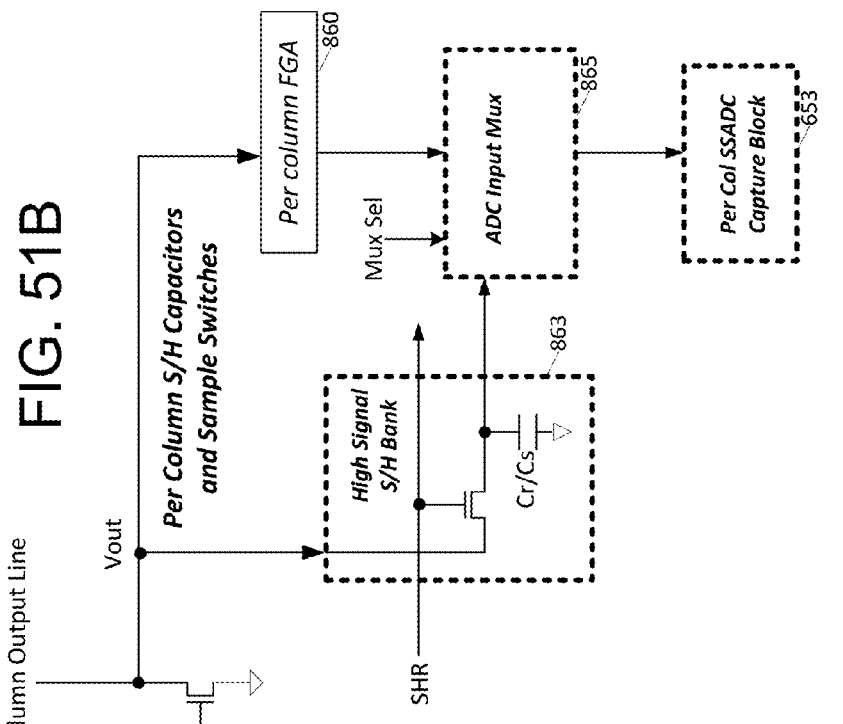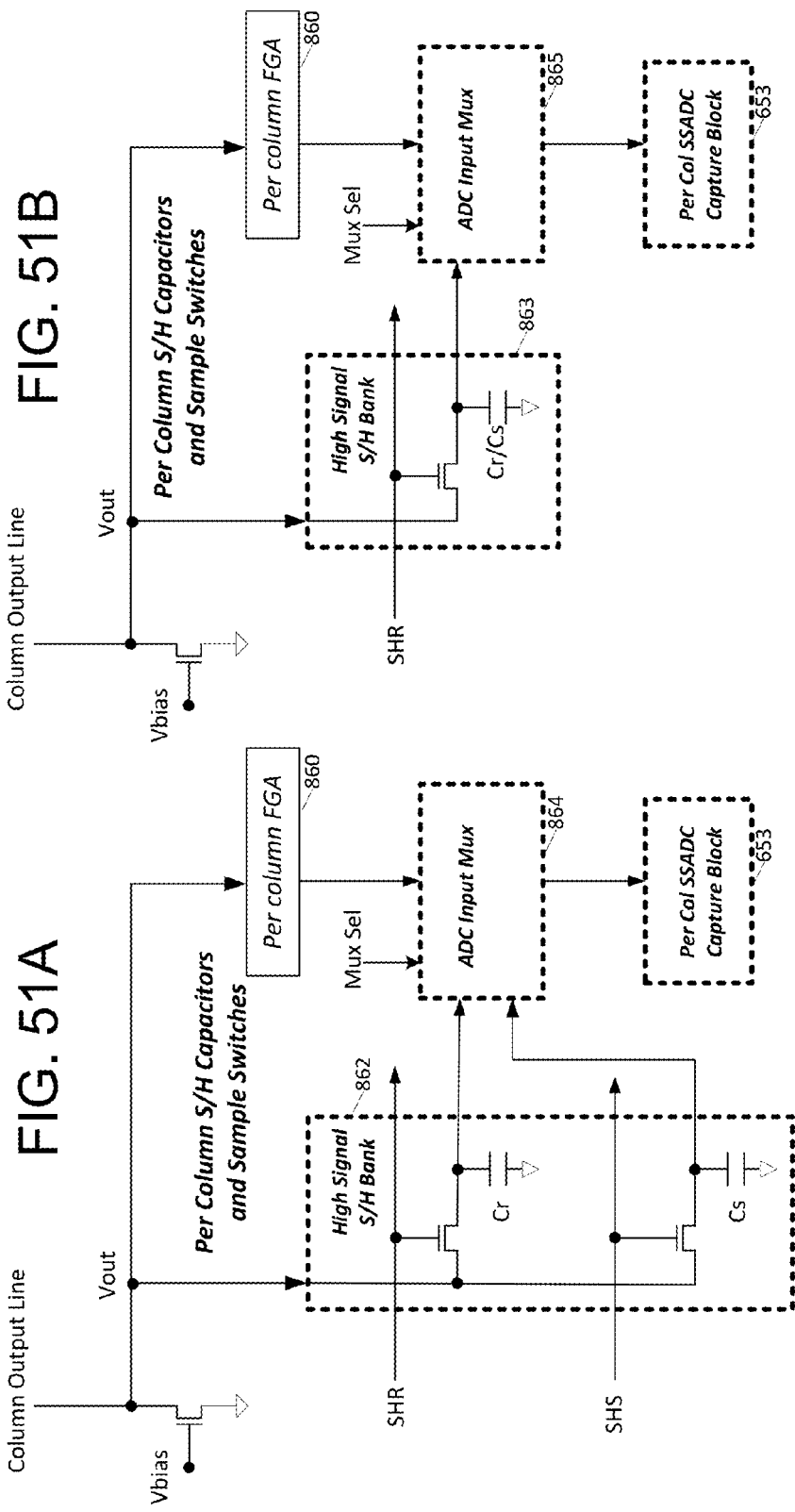
FIG. 51B
FIG. 51A

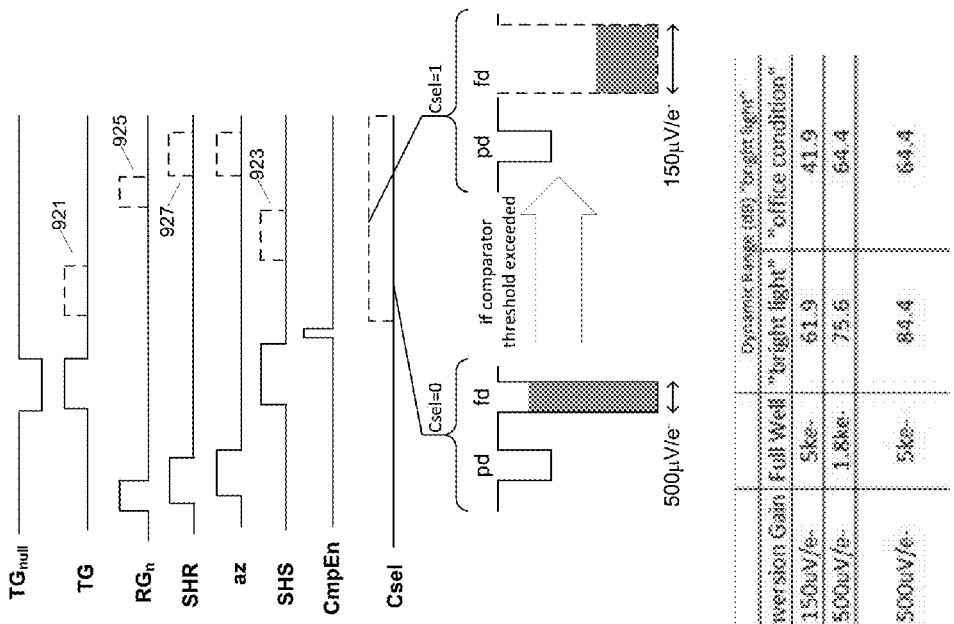
FIG. 57B
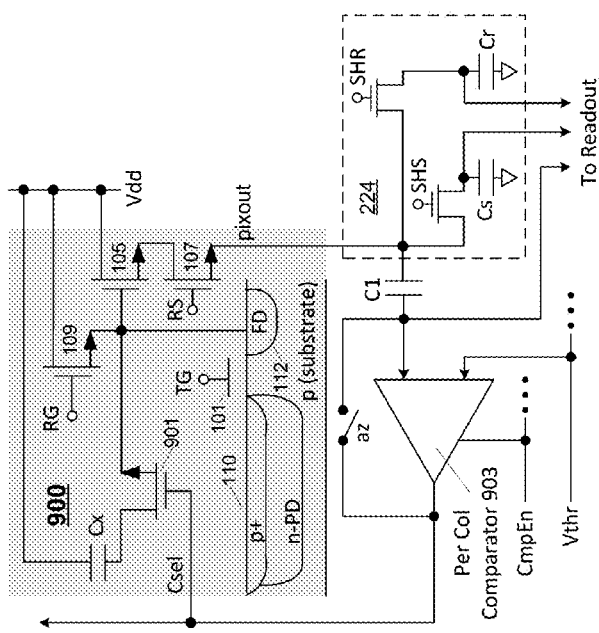
FIG. 57A
FIG. 57C

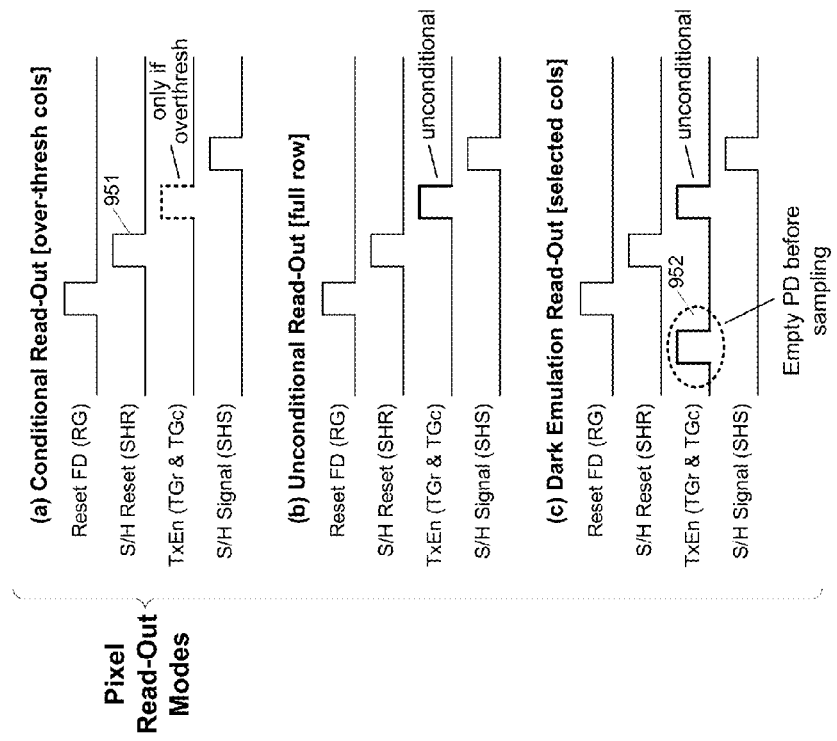
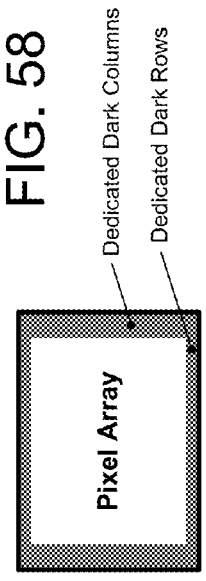
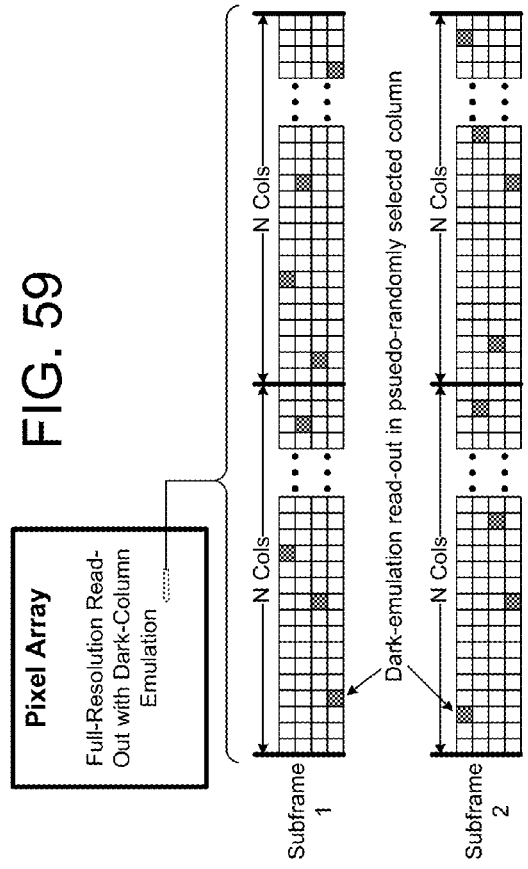

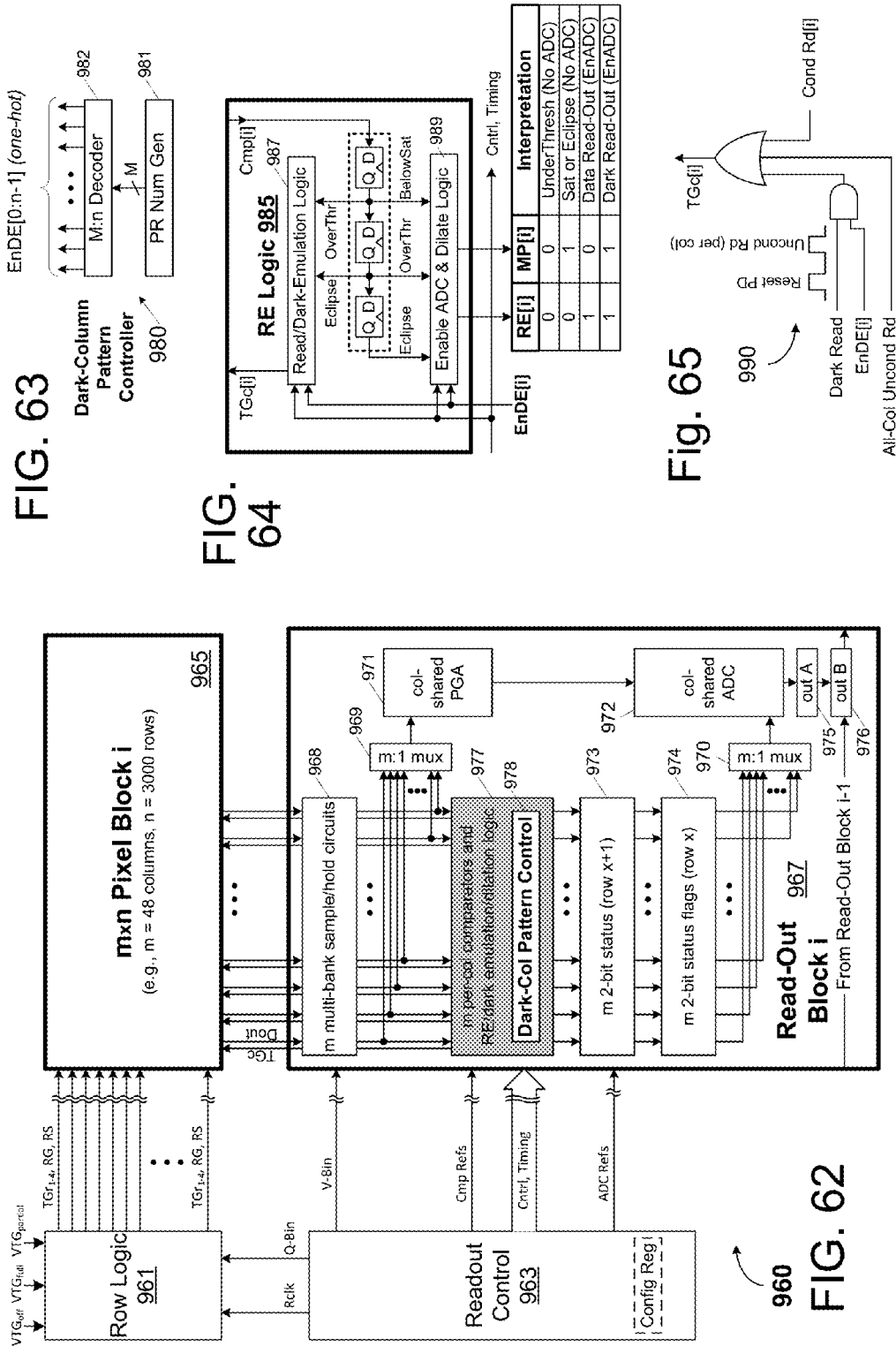

FEEDTHROUGH-COMPENSATED IMAGE SENSOR

CROSS-REFERENCE TO RELATED APPLICATIONS

This application hereby claims priority to and incorporates by reference each of the following U.S. Provisional Patent Applications:

| Application No. | Filing Date | Title |
| --- | --- | --- |
| 61/937,436 | Feb. 07, 2014 | Differential Transfer Signaling for Low-Noise, High-Speed Pixel Readout |
| 61/954,517 | Mar. 17, 2014 | Differential Transfer Signaling for Low-Noise, High-Speed Pixel Readout |
| 62/076,011 | Nov. 06, 2014 | Image Sensor Readout with Transfer-Gate Nulling Ultra Low Noise Readout Architectures |
| 62/091,408 | Dec. 12, 2014 | |

TECHNICAL FIELD

The present disclosure relates to the field of integrated-circuit image sensors.

BACKGROUND

Low-light performance continues to be a challenge for CMOS image sensors. In particular, as pixel geometries continue to shrink, second-order sampling inaccuracies have caused readout noise to climb. And, while the SNR (signal-to-noise ratio) loss is somewhat countered in medium-to-bright light conditions by increased resolution, in office lighting conditions, the reduced electron capture of small pixels pushes signal levels so low that readout noise is dominating performance at a wider range of the illumination spectrum.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which:

FIG. 8 illustrates an exemplary set of feedthrough compensation pulses conveyed via neighboring TG control lines of a shared-floating-diffusion unit cell;

FIG. 9 illustrates an exemplary feedthrough compensation approach in which neighboring transfer-gate signal lines are used to compensate the reset-gate feedthrough to the floating diffusion, and then used in combination with a negative-polarity reset-gate pulse to compensate for transfer-gate feedthrough;

FIG. 10 illustrates an additional capacitive coupling to the floating diffusion node ("FD") of a single-mode 4T pixel that may be exploited to compensate for control-signal feedthrough;

FIG. 11 illustrates an exemplary routing of an adjacent-row reset-gate signal line in proximity to the source-follower gate (SF) of a target-pixel to yield a desired capacitive coupling;

FIG. 12 illustrates an exemplary readout timing for an architecture that implements control-signal feedthrough compensation at least in part via one or more neighboring RG lines;

FIG. 13 presents an exemplary pixel readout timing diagram in which a negative pulse on a row-select signal line compensates for feedthrough from a transfer-gate signal line or reset-gate signal line;

FIG. 14A illustrates an alternative TG null timing approach, applicable at least to 4T pixel architectures, including, without limitation, the single-mode and dual-mode 4T pixels shown in FIGS. 1A and 1B;

FIG. 14B illustrates a high level schematic diagram for a single-mode pixel and per column circuit elements for readout of the pixel;

FIG. 16A illustrates an alternative in-pixel compensation structure embodiment in which a photodiode and floating diffusion node are formed within a p-well that has been implanted into an n-substrate or n-epi material;

FIG. 16B illustrates the in-pixel compensation arrangement of FIG. 16A, but with the p-well and floating diffusion node implement in separate integrated circuit dies or wafers;

FIG. 20 illustrates an exemplary pixel readout timing diagram for a conditional-read pixel in which feedthrough compensation pulses are generated on one or more neighboring row-based transfer-gate lines (TGr);

FIG. 21 illustrates an exemplary pixel readout timing diagram for a conditional-read pixel in which feedthrough compensation pulses are generated on neighboring TGr lines and on a local reset-gate line (RG);

FIG. 22 illustrates an exemplary pixel readout timing diagram in which column transfer-gate control line, TGc, is used in conjunction with neighboring TGr lines to compensate TGr and RG feedthrough;

FIG. 23 illustrates an exemplary pixel readout timing diagram in which TGc is used to provide feedthrough compensation;

FIGS. 24A and 24B illustrate exemplary pixel readout timing diagrams for conditional-read pixels with feedthrough compensation;

FIG. 28 illustrates a compressed-CDS timing arrangement in which the falling edge of the sample-and-hold control signal for capturing low-light signal-state samples does not occur until sometime after the falling edge of the transfer-gate control signal;

FIG. 29A illustrates an alternative compressed-CDS timing approach in which a low-light signal-state sample is captured before the falling edge of the transfer-gate pulse;

FIG. 29B illustrates an expanded view of the low-light CDS operation in FIG. 29A;

FIGS. 30A and 30B illustrate respective unconditional and conditional pixel readout timing that may be achieved using the shortened low-light CDS sampling approach discussed in reference to FIGS. 28, 29A and 29B;

FIG. 36 illustrates an embodiment of dual direct conversion image sensor having separate (respective) ADCs for bifurcated low-signal and high-signal readout paths; and FIG. 37 illustrates more detailed embodiments of low-signal ADC capture and high-signal ADC capture circuits that may be used to implement the low-signal and high-signal capture blocks in FIG. 36.

FIG. 38 is an exemplary timing diagram illustrating operations with respect to embodiments of FIGS. 36 and 37;

FIG. 39 illustrates an alternative embodiment of a dual direct conversion image sensor;

FIG. 40 illustrates embodiments of low-signal and high-signal ADC capture blocks that may be implemented within the single-slope ADC (SSADC) of FIG. 39;

FIG. 41 illustrates an exemplary high-level timing diagram corresponding to operation within ADC capture blocks shown in FIGS. 39 and 40;

FIG. 42 illustrates another embodiment of a dual direct conversion image sensor;

FIG. 43 illustrates an embodiment of a per-column bias multiplexer that may be implemented within the bias multiplexer bank of FIG. 42;

FIGS. 44 and 45 illustrate an exemplary timing diagram and flow diagram for such a switched-bias readout approach that leverages the image sensor and bias multiplexer embodiments shown in FIGS. 42 and 43;

FIGS. 51A and 51B illustrate optional readout path architectures that may be implemented within the single direct conversion image sensor of FIG. 50;

FIG. 57A illustrates an embodiment of a variable-c FIG. 73 illustrates a pixel array having shielded dark correction blocks;

FIG. 57B is an exemplary timing diagram corresponding to a readout operation within variable-conversion-gain pixel of FIG. 57A;

FIG. 57C is a table of exemplary CDS times, readout noise levels, conversion gains and dynamic range that may be achieved by a variable-conversion-gain, feedthrough-compensated, bifurcated readout path image sensor embodiment according to embodiments described herein;

FIG. 58 illustrates a pixel array having shielded dark correction blocks;

FIG. 59 illustrates an exemplary dark-emulation with respect to a full-resolution pixel array;

FIG. 60 illustrates exemplary timing diagrams for a number of pixel read-out modes within a conditional-read image sensor, including the conditional and unconditional read-out modes described above as well as a dark-emulation read-out mode;

FIG. 62 illustrates an exemplary image sensor architecture that supports emulated-dark read-out operations discussed in reference to FIGS. 59 through 61;

FIG. 63 illustrates an embodiment of a dark-column pattern controller that may be used to implement the pattern controller of FIG. 62;

FIG. 64 illustrates an embodiment of a read-enable logic circuit modified to support dark-emulation read-out;

FIG. 65 illustrates an embodiment of a read/dark-emulation logic circuit that may be deployed within the read-enable logic circuit of FIG. 64;

DETAILED DESCRIPTION

Image sensors that compensate for disruptive control-signal feedthrough during pixel readout operations are disclosed in various embodiments. More specifically, one or more feedthrough compensation signals are asserted in combination with readout-control signals in a number of embodiments to null (i.e., negate, cancel or substantially reduce) control-signal feedthrough to the floating diffusion node of a four-transistor (4T) pixel. By this operation, the substantial delay otherwise required for feedthrough settling is eliminated (or at least significantly reduced), permitting a dramatically shortened time between successive samples of the floating diffusion in a correlated double-sampling (CDS) operation and thus provide reduction of pixel readout noise. In a number of embodiments, the time between "reset-state" sampling or readout and "signal-state" sampling or readout are brought close to overlap, yielding nanoseconds-order CDS time and sub 1-electron pixel read-out. In other embodiments, the compressed CDS time is leveraged to enable novel readout architectures and techniques, including correlated photon counting without the use of noisy (and slow to recover) avalanche sensors. To accommodate and exploit the different noise considerations and delay times that bear on low-light and brighter light pixel signals, two or more separate pixel readout paths are provided to speculatively readout accumulated photocharge (i.e., reading out via at least one path on the speculation that a low-signal level of photocharge has accumulated, and via the other path on the speculation that a higher-signal level of photocharge has been accumulated) with post-readout selection of a finalized pixel value. As discussed below, different amplification levels, ADC operation, pixel conversion gain, timing and so forth may be applied with respect to such "bifurcated" readout-path embodiments (though more than two readout paths may be provided), with varying degrees of parallelism between the two paths. In yet other embodiments, different conversion gains are applied with respect to low-signal and higher-signal readout paths, thus further reducing low-signal noise without compromising dynamic range. These and other embodiments, features and configurations are described in greater detail below.

Pixel Architectures/Readout Modes Enhanced by Feedthrough Compensation

Figure 1B:
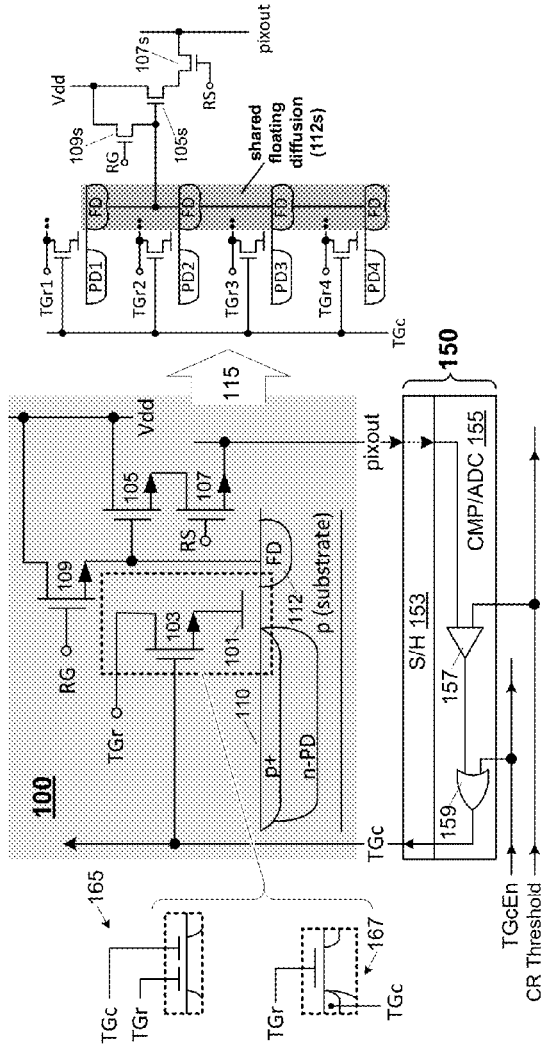
FIGS. 1A and 1B illustrate exemplary embodiments of single-mode and dual-mode pixels to which various feedthrough compensation and readout techniques and architectures may be applied.
Figure 1A:
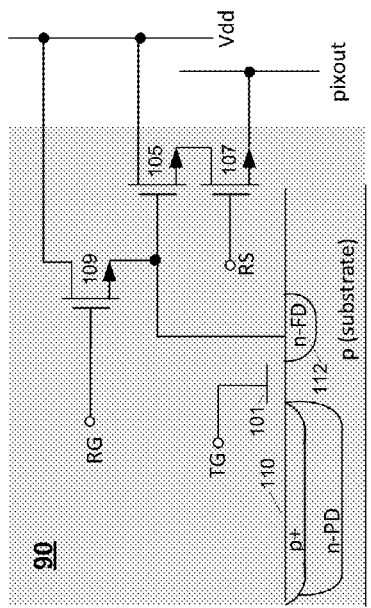

FIGS. 1A and 1B illustrate exemplary embodiments of single-mode and dual-mode pixels (90 and 100, respectively) to which various feedthrough compensation and readout techniques and architectures may be applied. As shown, both pixels include a photodiode 110 (a pinned photodiode in this example) and floating diffusion node 112 switchably interconnected via transfer gate 101. A reset transistor 109, controlled by reset-gate line (RG) is coupled between the floating diffusion node and a supply voltage rail (Vdd or Vdd-pix, for example), and a source-follower transistor 105 and row-select transistor 107 are coupled as shown between the supply voltage rail and a pixel output line, a signal line referred to herein as "pixout" that extends column-wise across the pixel array (i.e., array of pixels 90 or 100) to a readout circuit block. As shown, floating diffusion node 112 in both single-mode pixel 90 and dual-mode pixel 100 is coupled to the gate of the source-follower transistor 105 which is coupled in turn to the pixout line via the row-select transistor 107. By this arrangement, when row-select transistor is turned on (RS is asserted), a constant load current flowing on the pixout line generates a voltage on the pixout line that follows (i.e., rises and falls according to) the voltage produced by the charge level of the floating diffusion node. Accordingly, the level of photocharge accumulated (or integrated) within the photodiode over a given interval may be ascertained by switching on the transfer gate to enable photocharge transfer from photodiode 110 to floating diffusion node 112 (which is generally reset or precharged to draw the accumulated photocharge off the photodiode when the transfer gate 101 is switched on) and asserting RS to yield a signal representative of the floating diffusion voltage produced by the charge level on the pixout line. Because of its capacitive/floating character, floating diffusion node 112 is susceptible to the many sources of noise in the pixel array and host image sensor. Accordingly, in a number of embodiments herein, photocharge readout is accomplished in a two-phase "correlated double-sampling" operation in which a noise signal and photocharge+noise signal are sampled one after the other and then differenced to cancel the noise component. More specifically, prior to photocharge transfer, the floating diffusion is reset (e.g., coupled to Vdd or Vdd-pix via reset-transistor 109 in response to RG assertion) and then the reset-state of the floating diffusion node (i.e., reset including kTC noise level) is captured in an analog or digital sampling (or conversion) operation. After the reset-state capture, photocharge is transferred by activation of transfer gate 101 to establish the "signal state" of the floating diffusion, which includes the reset-state/noise level plus the photocharge level floating diffusion. The signal-state is then captured so that, in either the analog or digital domain, the reset-state measurement may be subtracted from the signal-state measurement to cancel/negate the reset-state component and thus yield the desired photocharge signal level. As the readout of the floating diffusion level for both the reset and signal states is subject to various high-frequency and low-frequency noise sources, noise cancellation efficacy of the correlated double-sampling (CDS) operation is highly dependent on the temporal proximity of the reset-state and signal-state samples. As discussed in further detail below, this proximity or "CDS time," is constrained by numerous factors relating to settling times for the floating diffusion node and/or pixout lines following floating diffusion reset and photocharge transfer events.

In the case of single-mode pixel 90, a row-based transfer-gate control signal (TG) is coupled directly to transfer gate 101 as shown. When TG is raised, transfer gate 101 is switched on and photocharge transfer is commenced. By contrast, dual-mode pixel 100 includes both row-based and column-based transfer-gate control signals, TGr and TGc, which act in combination to permit row and column control over the transfer gate (e.g., via transfer-enable transistor and alternatives as discussed below) and thus column-by-column selectivity regarding photocharge transfer from the photodiode to floating diffusion. As discussed below, this column-selectivity permits pixels within a selected row of a pixel array to be "conditionally" readout—that is, readout only if a threshold level of photocharge is determined to have accumulated within the pixel's photodiode over a given frame or subframe interval. By forcing the TGc signal on (or even holding it high), the dual-mode pixel may be readout "unconditionally," in effect operating in the "unconditional" readout mode of the single-mode pixel. Thus, while single-mode pixel 90 is readout unconditionally in response to TG assertion, dual mode pixel 100 may be readout conditionally or unconditionally at any readout interval. The following sections describe the conditional-read operation in greater detail to provide insight into particular challenges that may apply as the various single-mode-pixel CDS compression techniques and bifurcated readout techniques and architectures disclosed herein are applied to dual mode pixels.

FIG. 1B illustrates an exemplary column readout circuit and logic together with the dual mode pixel described above. As shown, column read-out circuit and logic 150 includes a sample-and-hold circuit block 153 (e.g., including switches and capacitive elements for sampling and temporarily holding analog signals output onto read-out line, pixout) and a comparator/ADC circuit block 155. During an overthreshold detection operation, a phase of a conditional-read operation that may precede or be executed after reset-state sampling, a transfer-enable signal (TGcEn) is pulsed concurrently with application of partial-on potential ($V_{TG-Partial}$) on transfer gate line TGr. The transfer-enable pulse passes through logic OR gate 159 to drive TGc high, thus switching on transfer-enable transistor 103 so that $V_{TG-Partial}$ is applied to transfer gate 101, thereby enabling a partial charge transfer to floating diffusion 112 as discussed below. Signal levels representative of the charge state of floating diffusion 112 (and thus photodiode 110 following the partial charge-transfer operation) are captured within sample and hold block 153 and supplied to comparator 157 within comparator/ADC block 155. The output of comparator 157 is supplied, via logic OR gate 159, to the TGc control line so that, after TGcEn goes low, TGc either remains high or goes low according to whether the charge integration state within photodiode 110 exceeds or does not exceed a conditional-read threshold ("CR Threshold").

If an overthreshold condition is detected (i.e., output of comparator 157 is high so that TGc remains asserted after TGcEn goes low), a subsequent assertion of a full-transfer control potential, $V_{TG-Full}$, on row control line TGr enables a full charge transfer from photodiode 110 to floating diffusion node 112 and thus a full read-out of the photodiode state. More specifically, pixout is driven according to floating diffusion charge level and an analog-to-digital conversion (ADC) operation is selectively enabled within an ADC circuit (not specifically shown) of comparator/ADC logic 155. By contrast, if the partial-read result indicates an under-threshold condition (i.e., output of comparator 157 low), TGc will go low at deassertion of TGcEn, thereby switching off transfer-enable transistor 103 to prevent application of $V_{TG-Full}$ at transfer gate 101 and thus disabling/suppressing photocharge transfer (i.e., preventing/bypassing the full-read operation). Accordingly, photocharge integrated within an underthreshold pixel will remain in photodiode 110 until a subsequent read-out operation, effectively lengthening the exposure interval for that pixel.

Referring again to dual-mode pixel 100 (also referred to herein as a "conditional-read" pixel), a row-select transistor 107 is coupled between the source follower 105 and the read-out line (pixout) to enable multiplexed access to the column read-out line by respective rows of pixels within the larger pixel array. That is, row-select lines ("RS") are coupled to the control inputs of row-select transistors 107 within respective rows of pixels and operated on a one-hot basis to select one row of pixels for sense/read-out operations at a time. A reset transistor 109 is also provided within the pixel to enable the floating diffusion to be switchably coupled to the supply rail (i.e., when a reset-gate line (RG) is activated) and thus reset. The photodiode itself may be reset along with the floating diffusion by fully switching on transfer gate 101 (e.g., by asserting TGc while TGr is high) and reset transistor 109 concurrently, or by connecting the photodiode to a reset-state floating diffusion. These reset and row-select operations also apply within the single-mode pixel of FIG. 1A.

Still referring to FIG. 1B, various charge-transfer control arrangements may be used instead of transfer-enable gate 103. In one embodiment, shown for example at 165, transfer-enable transistor 103 is replaced by a second section of a split transfer gate in which part of the gate is controlled by TGc and the other part by TGr, requiring both signals to be at least partially asserted in order to lower the electrostatic barrier between the photodiode and floating diffusion. This "split-gate" arrangement enables application of a negative TGr voltage (and/or deassertion of TGc) during charge accumulation, for example, to more fully block the transfer path between photodiode 110 and floating diffusion 112. Also, the split-gate embodiment permits TGc to be deasserted during photocharge integration without floating the transfer-gate (i.e., as would happen upon lowering TGc in an embodiment employing transfer-enable transistor 103). In another embodiment, shown at 167, the TGc potential may be directly coupled to a pinning layer of photodiode 110, thus raising and lowering the potential of the photodiode relative to the electrostatic barrier formed by transfer gate 101. In yet another embodiment, transfer-enable transistor 103 may be implemented by a P-type transistor (as opposed to the N-type transistor shown in FIG. 1B), also enabling negative voltages to be applied via TGr. In that case, OR gate 159 may be replaced by a NOR gate to establish the desired active-low TGc assertion state.

To reduce pixel footprint (i.e., die consumption area), a single floating diffusion node and corresponding read-out/reset circuitry (i.e., transistors 105, 107, 109) may be shared by two or more pixels in a "pixel unit cell," thus reducing the per-pixel transistor count and enabling charge-binned (reduced spatial resolution) imaging modes. As shown in detail view 115, for example, a single floating diffusion node 112s is shared by a column of four pixels (denoted by respective photodiodes PD1-PD4), as is read-out circuitry formed by amplifier transistor 105s and row-select transistor 107s and reset transistor 109s. In this four-row by one-column "4×1" pixel unit cell (various others are possible, including configurations that span two or more columns of pixels), four pixels are implemented by a total of eleven transistors (four of which are transfer gates 101), thus effecting an average transistor count of 2.75 (i.e., "2.75T") per pixel. Similar "shared floating diffusion" pixel unit cells may be implemented with respect to the single-mode pixel of FIG. 1A. Also, as discussed in greater detail below, the TG, TGr and TGc lines may be routed in both single-mode and dual-mode pixel arrays to achieve nominally uniform capacitive coupling between the respective TG control lines and gates to shared floating diffusion 112s and thus enable controlled feedthrough nulling through assertion of nulling signals on one or more otherwise inactive row-based transfer-gate lines.

Figure 2:
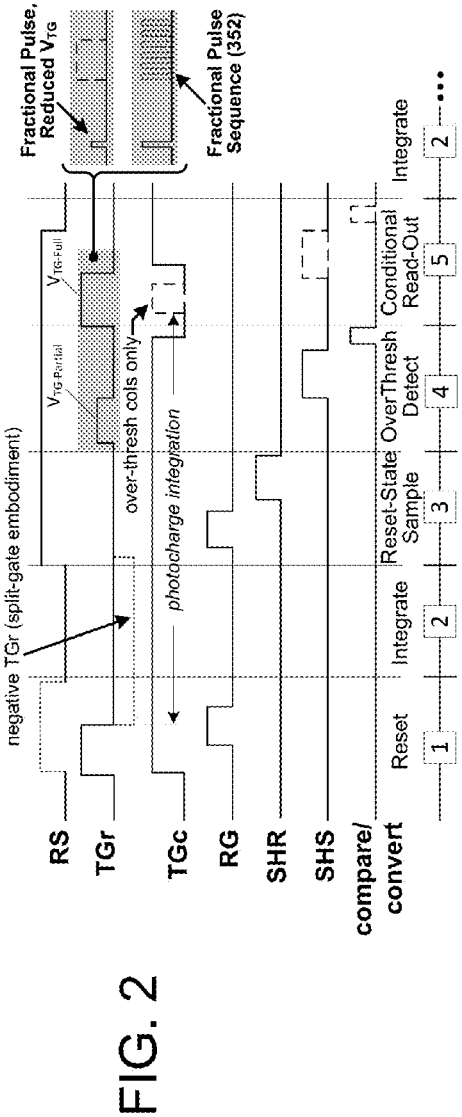
FIG. 2 is a timing diagram illustrating an exemplary pixel cycle within the dual mode pixel of FIG. 1B.

FIG. 2 is a timing diagram illustrating an exemplary pixel readout cycle within the dual mode (or "conditional-read") pixel of FIG. 1B. As shown, the pixel readout cycle is split into five intervals or phases corresponding to distinct operations executed to conditionally read out or refrain from reading out the pixel state. In the first phase (phase 1), a reset operation is executed within the photodiode 110 and floating diffusion 112 by concurrently asserting the appropriate logic high signals on the TGr, TGc and RG lines to switch on transfer-enable transistor 103, transfer gate 101 and reset transistor 109, thereby switchably coupling photodiode 110 to the supply rail via transfer gate 101, floating diffusion 112 and reset transistor 109 (the illustrated sequence can begin with an unconditional reset (e.g., at the start of a frame interval), and can also begin from a preceding conditional read-out/reset operation). To conclude the reset operation, the TGr and RG signals (i.e., signals applied on like-named signal lines) are lowered to appropriate "off" levels, thereby switching off transfer gate 101 (and reset transistor 109) so that the photodiode is enabled to accumulate (or integrate) charge in response to incident light in the ensuing integration phase (phase 2). Lastly, although the row-select signal goes high during the reset operation shown in FIG. 2, this is merely a consequence of an implementation-specific row decoder that raises the row-select signal whenever a given row address is decoded in connection with a row-specific operation (e.g., raising the TGr and RG signals during reset directed to a given row). In an alternative embodiment, the row decoder may include logic to suppress assertion of the row-select signal during reset as indicated by the dashed RS pulse in FIG. 2. Additionally, the reset transistor may be left on or partially on during the integration phase.

At the conclusion of the integration phase, correlated double sampling is executed with respect to the floating diffusion to effect a conditional or unconditional read operation. Starting with the conditional-read case, the floating diffusion is reset (i.e., by pulsing the RG signal to couple the floating diffusion to the supply rail) and then sampled by a sample-and-hold element within the column read-out circuit. This "reset-state" sampling operation (shown as phase 3 in FIG. 2), in effect, samples the reset-state of floating diffusion 110 and is executed in the embodiment of FIGS. 1B and 2 by asserting the row-select signal (RS) for the pixel row of interest while pulsing a reset-state sample-and-hold signal (SHR) to convey the state of floating diffusion 110 to the sample-and-hold element (e.g., a switch-accessed capacitive element, not shown in FIG. 1B) within the column read-out circuit via read-out line, pixout.

Figure 3:
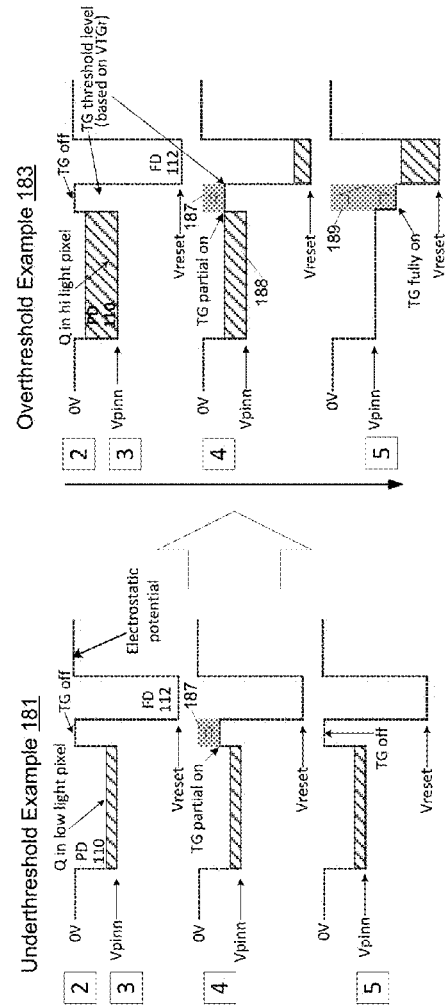
FIG. 3 illustrates exemplary electrostatic potential diagrams for a photodiode, transfer gate and floating diffusion to illustrate underthreshold (low-light) and overthreshold (brighter-light) read-out operations, respectively.

After acquiring the reset-state sample in phase 3 of a conditional-read operation, an overthreshold detection operation is executed in phase 4 by raising the TGr line to the partially-on, "overthreshold-detection" potential, $V_{TG\text{-}partial}$, concurrently with switching on transfer-enable transistor 103 (i.e., by asserting a logic high TGc signal as discussed above). By this operation, $V_{TG\text{-}Partial}$ is applied to transfer gate 101 to switch the transfer gate to a "partial on" state ("TG partial on"). Referring to FIG. 3, electrostatic potential diagrams for a photodiode (a pinned photodiode in this example), transfer gate and floating diffusion (corresponding to photodiode 110, transfer gate 101 and floating diffusion 112 of FIG. 1B) are shown at 181 and 183 to illustrate underthreshold (low-light) and overthreshold (brighter-light) read-out operations, respectively. Note that the depicted levels of electrostatic potential are not intended to be an accurate representation of the levels produced in an actual or simulated device, but rather a general (or conceptual) representation to illustrate the operation of the pixel read-out phases.

Starting with underthreshold/low-light example 181, the level of charge accumulated within the photodiode at the time of the overthreshold detection operation (phase 4) does not rise to the threshold level required for charge to spill over (i.e., be transferred) to the floating diffusion via the shallow channel potential (187) of the partially-on transfer gate. Accordingly, because the accumulated charge level does not exceed the transfer threshold (or spillover threshold) established by application of $V_{TG\text{-}Partial}$ to the control node of transfer gate 101, there is no charge transfer from the photodiode to the floating diffusion and the accumulated charge instead remains undisturbed within the photodiode. By contrast, in overthreshold/bright-light example 183, the higher level of accumulated charge does exceed the transfer threshold so that a portion of the accumulated charge (i.e., that subset of charge carriers that are above the transfer gate partially-on electrostatic potential) spills over into floating diffusion node 112, with the residual accumulated charge remaining within the photodiode as shown at 188.

Still referring to FIGS. 2 and 3, prior to conclusion of overthreshold detection phase 4, the charge level of the floating diffusion is sampled and held within a signal-state sample-and-hold element (i.e., in response to assertion of signal SHS) to yield a threshold-test sample—the difference between the signal-state sample and the previously obtained reset-state sample and thus a correlated double sample—to be evaluated with respect to a conditional-reset threshold as described above.

In one embodiment, the conditional-read threshold is an analog threshold (e.g., to be compared with the threshold-test sample in a sense amplifier in response to assertion of a compare/convert strobe signal) set or programmed to a setting above the sampling noise floor, but low enough to enable detection of minute charge spillover via the shallow transfer gate channel. Alternatively, the threshold-test sample may be digitized in response to assertion of the compare/convert signal (e.g., within an analog-to-digital converter that is also used to generate the finalized pixel sample value) and then compared with a digital conditional-reset threshold, again, set (or programmed to a setting) above the noise floor, but low enough to enable detection of trace charge spillover.

However evaluated, if the threshold-test sample indicates that no detectable spillover occurred (i.e., threshold-test sample value is less than conditional-reset threshold), the photodiode is deemed to be in the underthreshold state shown in the low-light example of FIG. 3 and the TGc line is held low in the ensuing conditional read-out phase (phase 5, the final phase) to disable transfer gate 101 for the remainder of the conditional read-out operation—in effect, disabling further read-out from photodiode 103 and thus enabling the photodiode to continue integrating charge without disruption for at least another sampling interval. By contrast, if the threshold-test sample indicates an overthreshold condition (i.e., threshold-test sample greater than conditional-reset/transfer threshold), then the TGc line is pulsed high, (or alternately is maintained high) during the conditional read-out phase concurrently with application of a fully-on, "remainder-transfer" potential, $V_{TG\text{-}Full}$, to the TGr line, thereby enabling the remainder of the charge (i.e., charge 188 as shown in the bright-light example of FIG. 3) within photodiode 110 to be transferred to floating diffusion 112 via the full-depth transfer-gate channel (189). By this operation, between the over-threshold transfer in phase 4 and the remainder transfer in phase 5, the charge accumulated within the photodiode since the hard reset in phase 1 is fully transferred to the floating diffusion where it may be sensed in a pixel read-out operation.

In the embodiment shown, the pixel-readout operation is effected by pulsing the SHS signal in read-out phase 5 to capture the post-charge-transfer signal-state of the floating diffusion and thus permit a correlated double sampling with respect to the floating diffusion reset-state sample acquired in phase 3. As shown, a compare/convert strobe is asserted at the conclusion of phase 5 to trigger an ADC operation with respect to the CDS pixel readout. As demonstrated by the dashed SHS and compare/convert pulses, SHS and/or compare/convert may optionally be suppressed in read-out phase 5 in absence of an overthreshold detection.

Still referring to FIG. 2, the conditional read-out of the photodiode (i.e., effected by asserting TGc in conjunction with application of $V_{TG\text{-}Full}$ on TGr) effectively resets the photodiode (i.e., drawing off all charge to the floating diffusion), while suppression of the conditional read-out leaves the integration state of the photodiode undisturbed. Accordingly, execution of the conditional read-out operation in phase 5 conditionally resets the photodiode in preparation for integration anew in the succeeding sampling interval (i.e., the succeeding "subframe interval" or "subframe" for short) or refrains from resetting the photodiode to enable cumulative integration in the subsequent sampling interval. Thus, in either case, a new integration phase follows phase 5, with phases 2-5 being repeated for each subframe of the overall frame (or exposure) interval, before repeating the hard reset in a new frame. In other embodiments, where cumulative integration is permitted across frame boundaries, the hard reset operation shown at phase 1 may be executed to initialize the image sensor and omitted for an indeterminate period of time thereafter. Also, instead of the hard reset operation shown in phase 1, an unconditional read/reset may be effected following the final subframe of a frame interval or, if desired, in any non-final subframe by unconditionally asserting TGc during read-out phase 5.

An unconditional readout of dual-mode pixel 100 may be carried out generally as described with respect to FIG. 2, except that the operations shown in readout phase 5 are executed without regard to the under/overthreshold evaluation in phase 4. More specifically, the phase-4 threshold evaluation may be carried out as shown in FIG. 2 and then ignored (e.g., overridden by continued assertion of TGcEn during readout phase 5), or the threshold evaluation may be omitted altogether to yield a four-phase CDS pixel readout. In general, such four-phase readout sequences are illustrated below with respect to image sensor embodiments that may employ but do not require conditional-read capability and/or image sensors having single-mode pixel arrays. Thus, column-line control over transfer gate 101 may be provided but unused (e.g., during certain subframes and/or sensor operating modes) or may be omitted altogether. Also, the transfer-gate control signal is generally designated "$TG_n$" (with 'n' denoting the $n^{th}$ row of an image sensor) in four-phase readout diagrams and may be representative of either exclusively row-based transfer-gate control (i.e., column-line omitted and thus a single-mode pixel array) or logical combination of row- and column-based transfer-gate control.

Mitigating Floating Diffusion Disruption Due to Control Signal Feedthrough

Figure 4:
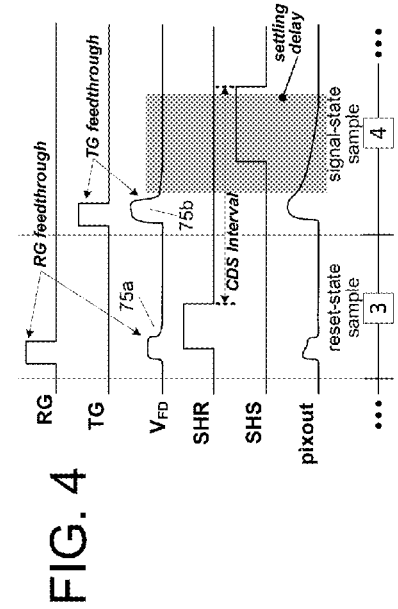
FIG. 4 illustrates a capacitive feedthrough phenomenon that tends to prolong the CDS (correlated-double-sampling) readout interval and, consequently, increase temporal noise and constrain pixel conversion gain within the single-mode and dual-mode pixels of FIGS. 1A and 1B.

FIG. 4 illustrates a capacitive feedthrough phenomenon that tends to prolong the CDS readout interval and, consequently, increase temporal noise and constrain pixel readout conversion gain within the single-mode and dual-mode pixels of FIGS. 1A and 1B. More specifically, control signal pulses, particularly on the reset-gate (RG) and transfer-gate (TG) control lines, tend to capacitively couple (i.e., feedthrough) to the floating diffusion node of the pixel, creating feedthrough transients on the floating diffusion node as shown at 75a and 75b. Accordingly, to provide sufficient time for the pixel output line (pixout) to settle to its correct value, a delay is generally imposed between the falling edge of the feedthrough-producing signal (i.e., the "feedthrough source") and the falling edges of the reset-state and signal-state sample-and-hold pulses, SHR and SHS, respectively. More specifically, a first settling delay is imposed between the falling edge of the RG pulse and the falling edge of SHR (the reset-state sample-and-hold pulse) to provide time for the RG feedthrough to settle, and a second even longer settling delay is imposed between the falling edge of the TG pulse and SHS (the signal-state sample-and-hold pulse) to provide time for the TG feedthrough to settle. As shown, the TG-feedthrough-imposed settling delay falls directly within the CDS interval marked by the falling edges of SHR and SHS and, indeed, may constitute the dominant portion of the CDS time, particularly for low-light (small) signal levels. Unfortunately, capacitive feedthrough increases with the reduced process geometries required to build ever-smaller pixels. Making matters worse, full-well capacity and responsivity tends to decrease with pixel size, so that smaller pixels generally require higher conversion gain to maintain image readout signal-to-noise ratio (SNR). The magnitude of the TG feedthrough will increase with higher conversion gain causing even longer settling time and correspondingly longer CDS time. This increase in CDS time will increase the read noise and thus counter the SNR improvement intended by the higher conversion gain. Thus, the TG feedthrough settling requirement limits the magnitude of conventional conversion gains that can be used and thus limits the ability to reduce input-referred noise.

To appreciate the disruption/delay imposed by control-signal feedthrough, consider some exemplary component and timing values. For example, the minimum pulse width of control signals entering the pixel array, such as reset (RG) and transfer-gate control (TG), is constrained by the RC time constant of their respective control lines so that a row-line resistance of ~1000 ohms and capacitance of ~0.5 pF yields a 500 picosecond RC time constant. To achieve 2-sigma settling, the entire rise and fall of the respective control pulses can be accomplished in ~2 ns and thus very rapidly.

By contrast, pixel output settling times are orders of magnitude longer. The source-follower bias current is typically on the order of 3 µA-10 µA (i.e., to avoid fixed pattern noise and shading caused by voltage drops across the source follower and pixout line) so that, even in the dark, a pixout settling time delay on the order of 1-3 µs is generally imposed during signal-state sampling to compensate for control-signal feedthrough. This can be understood from the slew-rate limitation dictated by $V(t)=1/C\int i(t)dt$, where i(t) is, for example, 3 µA, and C is the combined capacitance of pixout line and the sampling capacitors and other parasitic capacitance of the pixout line. A typical value might be 2 pF. Even though the sensor is in the dark, feedthrough-induced disturbance of the pixout line can be roughly 500 mV to 1000 mV (e.g., depending on the coupling capacitance of the TG to the floating diffusion and the total capacitance of the floating diffusion), so that an exemplary pixout settling time following TG pulse feedthrough can be calculated as t=(500 mV/3 µA)*2 pF=333 ns. Because of the large voltage jump, several times the slew settling time is required in practice in order to achieve matching between pixels and columns, yielding a 1 µs to 3 µs delay overall.

As FIG. 4 shows, there is a large disruption on the floating diffusion and pixout because of TG pulse feedthrough. This leads to a number of undesirable effects including extended CDS times (i.e., to account for the substantial settling delays detailed above), high row-wise temporal noise and, unless settling time is made long enough to accommodate the worst-case columns in the array, fixed pattern noise due to mismatch in column and pixel settling. More generally, the CDS transfer function is a band-pass function that rejects noise at frequencies outside the bandpass, but passes in-band noise into the readout signal. The CDS time determines the lower/bottom frequency of the bandpass (the upper frequency being determined by the bandwidth of the source follower and other circuits in the CDS readout path) so that feedthrough-imposed extension of the CDS time widens the bandpass and thus increases readout noise.

TG-Nulling/Active-Stabilization

Figure 5:
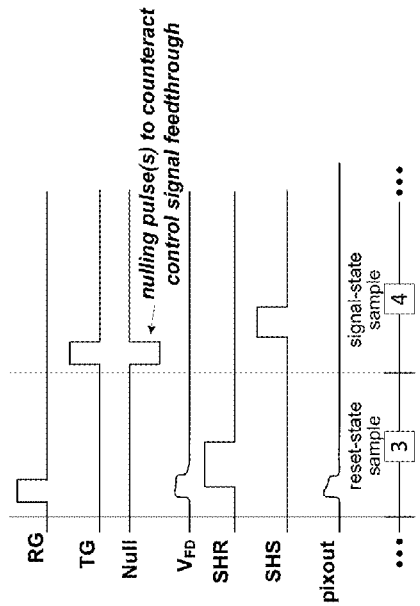
FIG. 5 illustrates an exemplary assertion of a feedthrough compensation pulse on one or more row-based and/or column-based signal lines that extend in proximity to the floating diffusion nodes within a selected respective row or column of pixels.

In an embodiment shown generally in FIG. 5, a feedthrough compensation pulse (or "nulling" pulse) is asserted on one or more row-based and/or column-based signal lines (shown collectively as "Null") that extend in proximity to the floating diffusion nodes within a selected respective row or column of pixels, there being at least one such "nulling" line for each pixel row and/or each pixel column. The nulling pulse counteracts (i.e., cancels, negates, mitigates or otherwise compensates) capacitive feedthrough resulting from application of the TG pulse during the photocharge sampling phase, reducing floating diffusion and pixout settling times and thus reducing CDS time and corresponding temporal noise during pixel readout. Although not specifically shown in FIG. 4, a nulling pulse may additionally be generated in coordination with other control signal pulses (e.g., during partial-TG pulse during overthreshold detection in a conditional-read pixel, concurrently with the RG pulse that precedes reset-state sampling and so forth). Also, while the nulling pulse is shown as transitioning from 0 v to a negative voltage, any low-going pulse (i.e., negative-polarity pulse) that transitions from a positive to a negative voltage, or from a positive voltage to a less positive voltage may alternatively be applied. More generally, nulling pulses may be generated at appropriate times and with appropriate amplitudes and polarities to counteract any control signal feedthrough including, for example and without limitation, feedthrough from the row-select signal assertion (RS), reset-gate signal assertion (RG) as well as various other row and column control signals discussed below.

In general, the nulling signal line is routed across or in proximity to one or more target rows or columns of pixels to effect parasitic capacitive coupling to the floating diffusions of the pixels, and may or may not be connected to pixel transistors within the pixel row being read-out (i.e., the "active" pixel row). In a number of embodiments, for example, the nulling signal line may be implemented by one or more row control lines for a pixel row (or rows) that neighbors the active row (e.g., is adjacent or proximal to the active row), while in other embodiments, the nulling signal line may be implemented by a dedicated nulling line (i.e., line provided solely to convey a null signal pulse), and in yet other embodiments the nulling signal line may be a control signal line for the active pixel row itself. In further embodiments, combinations of dedicated nulling lines and neighbor-row control lines, and/or active-row control lines may yield a desired feedthrough compensation, and in yet further embodiments, column control lines and or dedicated column nulling lines may be used in addition to or instead of row-based nulling lines. In all such cases the nulling signal conveyed on the nulling line(s) performs a counter coupling to eliminate or substantially mitigate any net control-signal feedthrough to the floating diffusion node—an effect referred to herein alternately as "feedthrough compensation," "feedthrough nulling" and "floating-diffusion stabilization."

Whether implemented by row-based and/or column-based signal lines, nulling lines can be placed near (or likely above) the vertical row-based floating diffusion trace (and thus near the floating diffusion regions for respective pixels), and the distance from pixout and the column-based transfer-gate control line (i.e., TGc) can also be controlled. There is significant freedom to adjust both or either of the width of the nulling line and proximity to other lines (such as TGr, pixout and TGc) to yield an ideal "counter-coupling" effect. Also, the amount of "counter-coupling" can be tuned from a voltage standpoint, for example, using run-time and/or production time calibration operations and on-chip or off-chip calibration circuitry. In practice, the TG-null pulse amplitude can be made quite large (without reliability risk), particularly where it is not driving a node or a gate. For example, an on-chip switched-capacitor "booster" can be used to achieve negative-polarity or positive-polarity feedthrough compensation pulses with amplitudes of 10 v or more, though smaller pulse amplitudes may also suffice.

Still referring to FIGS. 4 and 5, while feedthrough compensation enables arbitrarily small CDS periods approaching the time constant of pixout line, meaningful image production requires a CDS period long enough to read out non-negligible photocharge according to $V(t)=1/C\int i(t)dt$, where pixout signal following the TG pulse is now representative of photocharge, not parasitic voltage coupling. Observing that the unfettered pixout settling time is dependent on the level of photocharge transfer, it follows that low-light signals may be sampled with lower settling delay than brighter-light signals—an insight exploited in a number of embodiments detailed below. As an example, single photons may be counted without regard to a slew rate limitation. As another example, the CDS period can be arbitrarily shortened or extended based on the imaging condition (i.e. very short for known low-light and high-ISO scenes). Other techniques may be applied in alternative embodiments.

Another consideration that arises with enablement of very short duration CDS ("compressed CDS") and thus a very low noise pixel is how practically to achieve sub-electron read-noise performance in view of additional readout circuit noise from components in the readout path after the pixel source follower transistor. This added noise may arise from circuits such as the sample and holds, gain amplifiers and analog-to-digital converters (ADCs). Assuming that the read noise of a compressed-CDS pixel readout (e.g., 10 ns-100 ns CDS duration) will be much lower than typical readout circuit noise, then the capacitor size of the sample-and-holds may be chosen accordingly. That is, given a sub-electron-noise pixel (i.e., noise less than single electron), then capacitance of capacitive sample-and-hold elements may be increased to reduce the readout circuit noise addition.

Compressed-CDS (i.e., sub-electron) pixel readout also permits adoption of higher conversion-gain architectures to reduce post source-follower noise. For example and without limitation, an architecture that yields a 500 uV/e– conversion gain instead of 100 uV/e– will effectively reduce noise post-source follower by 5×. A number of such high-conversion-gain embodiments are discussed in greater detail below.

Various embodiments disclosed herein enable the CDS duration to be compressed to the theoretical RC constant of the pixout line itself, reducing CDS time by an order of magnitude or more (e.g., from 1 µs to 100 ns or less), greatly reducing temporal source-follower readout noise and pixel fixed pattern noise/column fixed pattern noise in the dark. The following sections detail pixel feedthrough compensation schemes (i.e., floating diffusion stabilization through TG-nulling and other active compensation techniques) that may be applied, for example and without limitation, in otherwise standard CMOS image-sensor pixels and sensor architectures as well as in specialized or otherwise non-standard pixel and sensor architectures.

Baseline Feedthrough Compensation

A baseline embodiment for floating-diffusion feedthrough compensation includes an added signal wire and attendant decoder/driver dedicated to feedthrough nulling. In a number of embodiments, this dedicated nulling signal line (or "coupling" or "compensation" signal line) extends row-wise across the pixel array to match skew and droop over the array of the row-control pulses and signals to be compensated. In alternative embodiments, column-based nulling lines may be used instead of or in addition to row-based lines, with column signal timing, waveform shaping and/or signal line routing designed to match skew and droop of the specified feedthrough signals to be compensated. In yet other embodiments, existing control signal lines may be leveraged to carry nulling signals. Also, transistors or other active components may be provided within individual pixels to provide feedthrough compensation instead of or as a supplement to signal-line-based compensation, though potentially at the cost of reduced fill factor.

With respect to the exemplary waveform diagrams and embodiments described herein, it should be noted that feedthrough compensation need not be "perfect" in order to achieve the advantageous effects. For example, the pulse edges of the compensation signals do not have align exactly with the signal pulse edges that produce the feedthrough disturbance, nor are matching voltage swings, coupling capacitances (or products of voltage swings and coupling capacitances) required between the feedthrough-compensation pulse and control signal that produces the feedthrough.

Figure 6:
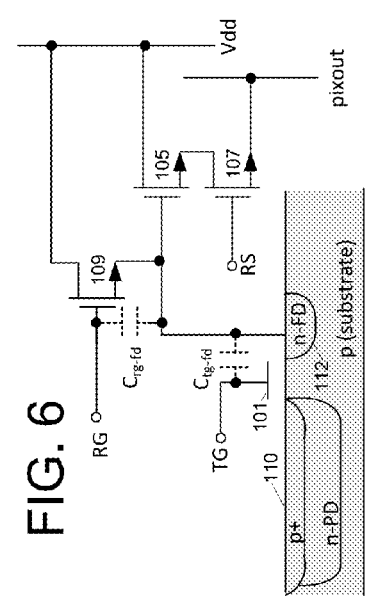
FIG. 6 illustrates exemplary coupling capacitances between transfer-gate and reset-gate control signal lines and the floating diffusion node of the single-mode (4T) pixel of FIG. 1A.

FIG. 6 illustrates exemplary coupling capacitances between TG and RG control signal lines and the floating diffusion node, FD, of the single-mode (4T) pixel of FIG. 1A. In a first-order analysis, which may apply equally to the dual mode pixel of FIG. 1B, the coupling capacitances between TG and FD (i.e., "$C_{tg\text{-}fd}$") and between RG and FD ("$C_{tg\text{-}rg}$") will yield a feedthrough signal on the floating diffusion node that follows the pulses from TG and RG signals. With regard to the TG pulse, for example, the magnitude of the feedthrough signal ($\Delta V_{FT}$) is given by:

$$\Delta V_{FT} = \Delta V_{tg} * (C_{tg\text{-}fd}/C_{fd}) \quad (1)$$

Where $\Delta V_{tg}$ is the voltage swing of the TG pulse and $C_{fd}$ is the total capacitance of the floating diffusion node.

Note that the pixel conversion gain is generally adjusted by decreasing $C_{fd}$ (i.e., conversion gain=$q/C_{fd}$) meaning that, if the feedthrough to the floating diffusion is not compensated, the $\Delta V$ of the feedthrough will increase as the conversion gain is increased. This larger feedthrough then imposes longer floating diffusion node and pixout settling delays and thus increases the CDS time. On the other hand, by compensating the floating-diffusion feedthrough, conversion gain may be increased without appreciably increasing settling time, and thus further reduce input-referred read noise.

Leveraging Pixel Control Lines to Effect Feedthrough Compensation

An alternative to adding a dedicated feedthrough compensation signal line is to use existing control signal lines and structures in the subject pixel for feedthrough compensation—an approach that avoids added floating-diffusion capacitance (as may occur when a signal line or lines are added to accomplish feedthrough compensation) and thus avoids changing the pixel conversion gain. In a number of embodiments, row-based control signal lines for neighboring pixel rows within a row of four floating-diffusion-sharing pixel cells (e.g., individual 4×1 unit cells as shown at 115 in FIG. 1B, though transfer-enable transistors 103 may be omitted in single-mode embodiments) are employed to convey feedthrough compensation pulses. These neighbor-row control lines may be routed to closely match the clock skew and droop of the feedthrough-sourcing signal line (i.e., the "source line") and, in the case of a distributed or otherwise shared floating diffusion, may exhibit capacitive coupling to the floating diffusion that matches that of the source line. For example, a source TG line and three neighboring TG lines may be routed uniformly across a row of four-pixel unit cells and exhibit uniform capacitive coupling with respect to the shared floating diffusion within each unit cell so that capacitive feedthrough resulting from control signals conveyed on the source TG line may be nulled by compensation signals conveyed on any other of the unit-cell TG lines or combination of the other TG lines. The same techniques can be applied with respect to pixels having respective (unshared) floating diffusion nodes, though higher compensation voltage swings may be needed in some cases. Also, as discussed below, compensation pulses may also be conveyed via RG signal lines and RS (row-select) signal lines, as well as column signal lines, like the column transfer-gate control line, TGc.

Figure 7:
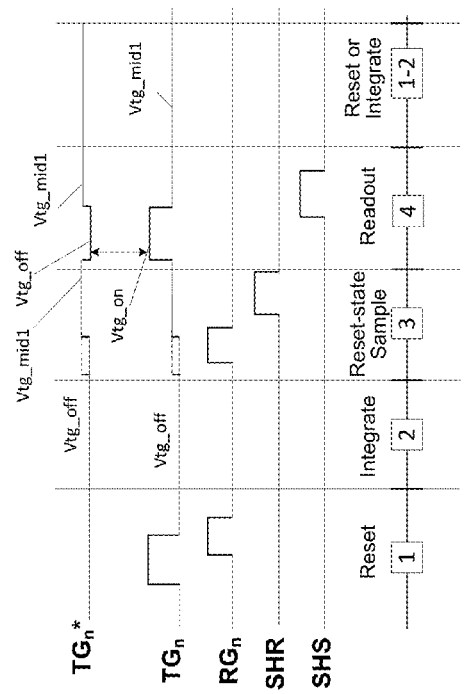
FIG. 7 is an exemplary pixel readout timing diagram illustrating reset, exposure and readout with respect to pixel row 'n' and feedthrough compensation conveyed via one or more neighboring TG control lines of a shared-floating-diffusion pixel unit cell.

FIG. 7 is an exemplary pixel readout timing diagram illustrating reset, exposure and readout with respect to pixel row 'n' (i.e., controlled by $RG_n$ and $TG_n$) and feedthrough compensation conveyed via one or more neighboring TG control lines, designated $TG_n*$, of a shared-FD unit cell. In one embodiment, compensation pulses are asserted simultaneously on multiple neighboring TG lines to limit the compensation pulse amplitude (voltage swing) required on any single line (i.e., as compared to the pulse amplitude if only one neighboring TG line was used to convey the compensation pulse). By this arrangement, relatively low compensation pulse voltages can be implemented and applied without affecting pixel performance, (e.g. GIDL (gain-induced drain leakage), Qsat, or blooming). Use of a single neighboring TG line to compensate feedthrough, while feasible, may require a larger voltage swing on the compensating line and may impose additional design considerations to ensure gate reliability and avoid GIDL during readout, driver implementation challenges, etc. As an example, if the $TG_n$ pulse exhibits a 2.5V swing, the negative pulse amplitude required on three neighboring $TG_n*$ lines of a 4×1 shared-FD pixel cell is 2.5V/3=0.83V, instead the full 2.5V needed if a single $TG_n*$ line was used for feedthrough compensation.

In the embodiment of FIG. 7, the four TG lines in the unit cell have substantially the same FD coupling capacitance, $C_{tg\text{-}fd}$. Consequently, because the transfer-control pulse conveyed on $TG_n$ will have a voltage swing of Vtg_vsf=Vtg_on−Vtg_mid1, Vtg_mid1 may be set such that Vtg_mid1−Vtg_off=(Vtg_vsf/3) to yield feedthrough compensation pulse amplitudes of Vtg_vsf/3 (and thus, collectively, the desired Vtg_vsf compensation level) on each of the three TGn* lines by pulsing those lines from Vtg_mid1 to Vtg_off and back. Note that all four of the TG lines in the quad pixel unit cell are initially transitioned from Vtg_off to Vtg_mid (a signal level chosen to avoid gate-induced drain leakage to the FD node) in preparation for the feedthrough-compensated CDS readout—a transition that may be safely (non-disruptively) effected at any time between end of the integration phase and the falling edge of the SHR pulse.

FIG. 8 illustrates an exemplary set of feedthrough compensation pulses conveyed via neighboring TG control lines (TGn*) of a shared-FD unit cell, and via the RG line of the target pixel row ($RG_n$), thus permitting even smaller negative pulse swings on the feedthrough-compensating signal lines. For example, in an embodiment in which $C_{rg\text{-}fd}$ approximately matches $C_{tg\text{-}fd}$ and in which Vtg_mid1−Vtg_off=Vtg_vsf/4, each of lines TGn* may be negatively-pulsed from Vtg_mid1 to Vtg_off and back simultaneously with assertion of a same-amplitude compensation pulse on RG to yield the desired feedthrough compensation.

In the embodiment of FIG. 9, the $TG_n$* signal lines are used to compensate the RG feedthrough to the floating diffusion, and then used in combination with the $RG_n$ pulse as shown in FIG. 8 to compensate for $TG_n$ feedthrough. That is, when the $RG_n$ is pulsed high the $TG_n$* signal lines are pulsed low at 185 by an appropriate voltage swing to compensate the $RG_n$ feedthrough. Later, at 186 and 187, respectively, feedthrough compensation pulses are generated on $TG_n$* and $RG_n$ to collectively compensate $TG_n$ feedthrough compensation.

While described in reference to a particular 4T pixel that forms part of a shared-floating diffusion node architecture, the feedthrough compensation techniques illustrated in FIGS. 7-9 may also be employed with other 4T pixel architectures such as switched-supply row-select architectures, reset-through-output architectures or others. In all cases, the TG and RG signal lines in the pixel unit cell can be used to cancel, negate or otherwise compensate specific sources of feedthrough to the floating diffusion node.

FIG. 10 illustrates an additional capacitive coupling to the floating diffusion node ("FD") of a single-mode 4T pixel 90 that may be exploited to compensate for control-signal feedthrough—in this case with respect to the RG line of an adjacent pixel (for unshared-FD architectures) or pixel unit cell (for shared-FD architectures). In a number of embodiments, the adjacent RG line, "$RG_{adj}$," is purposefully designed and laid out with respect to the floating diffusion node of the target pixel to yield the desired coupling capacitance, $C_{rgadj\text{-}fd}$. As an example, in one implementation, a metal layer formation of the $RG_{adj}$ line is extended into the neighboring (target) pixel in a designed proximity to the target pixel's floating diffusion node. In another implementation, the $RG_{adj}$ line is disposed immediately adjacent the FD-to-source-follower connection for the neighboring (target) pixel and/or routed in proximity to the source-follower gate of the target pixel. As the exemplary embodiment of FIG. 11 illustrates, the proximal routing of signal line $RG_{adj}$ to the source-follower gate (SF) of the target-pixel effects a capacitive coupling, $C_{rg\text{-}sf}$, that is electrically equivalent to $C_{rgadj\text{-}fd}$ by virtue of the electrical interconnection between the source-follower gate and floating diffusion node. Various additional/alternative layout and design techniques may employed to achieve/tune the desired coupling capacitance.

FIG. 12 illustrates an exemplary readout timing for an architecture that implements control-signal feedthrough compensation at least in part via one or more neighboring RG lines. In the example shown, pixel row 'n' is being readout, with $RG_n$ and $TG_n$ being pulsed at 201 and 203 to reset the floating diffusion node and enable photocharge transfer, respectively. The adjacent RG signal line, RGadj may be the RG line from a pixel row above or below the row containing the pixel being readout (i.e., the target pixel) or, in the case of a pixel unit cell in which a single RG line is shared among all the pixels in the unit cell, the RG line from an adjacent unit cell. Where $RG_{adj}$ corresponds to the previously-read out neighboring pixel row (i.e., $RG_{n-1}$), $RG_{adj}$ would normally be in the "on-state" as that pixel row has been readout and is now integrating or waiting to integrate. In that case, $RG_{adj}$ can then be pulsed off and on to effect a negative-polarity pulse 205 that counteracts (i.e., compensates for) feedthrough of $TG_n$ pulse 203 without effect on the neighboring pixel row (i.e., row n−1). While not specifically shown in FIG. 12, the $RG_{adj}$ line could also be used to compensate the feedthrough from the RG pulse.

While neighbor-row TG and local RG control lines are particularly effective for compensating feedthrough from a source line to the floating diffusion (i.e., in shared-FD unit cells, those neighboring lines tend to be physically adjacent the floating diffusion node and thus couple effectively to the FD, primarily through the gate to drain overlap capacitance), the RS signal line and row-select transistor gate may also be used for feedthrough compensation. FIG. 13, for example, presents an exemplary pixel readout timing diagram in which a negative pulse on the RS line compensates for (i.e., negates in whole or part) the feedthrough from a TG or RG source line. As shown at 207 and 208, the negative RS pulses ride upon an active (e.g., asserted to a logic high state in this example) RS signal. The voltage swing, ΔV, of the negative RS pulse required to cancel the feedthrough will depend on the coupling capacitance between the RS line and the floating diffusion node. Larger compensation voltage swings may be implemented in embodiments where the RS gate and/or signal line are not physically adjacent (or otherwise do not sufficiently capacitively-couple to) the floating diffusion, so long as the negative-going compensation pulse does not disrupt the row-select function of the RS line. To achieve a sufficient compensation voltage swing on RS that is compatible with allowable pixel and drive circuit voltages, the RS to FD coupling capacitance may be purposefully increased (e.g., by routing part of the RS gate poly close to the source-follower (SF) gate, routing the RS signal-line interconnect over the FD-to-SF gate interconnect, etc.) Alternatively (or additionally), RS compensation pulses may be applied in combination with the above-described $TG_n$* and RG compensation pulses.

Alternate TG Null Timing

FIG. 14A illustrates an alternative TG null timing approach, applicable at least to 4T pixel architectures, including, without limitation, the single-mode and dual-mode 4T pixels shown in FIGS. 1A and 1B. This TG feedthrough cancellation or compensation method can be applied in conjunction with various feedthrough-compensated readout techniques, including the bifurcated read-path and/or variable conversion gain techniques described below. The specific example shown in FIG. 14A is particularly applicable to readout of low-light signals to achieve fast CDS times and low read noise.

A generalized single-mode pixel 90 and readout circuit block diagram is shown in FIG. 14B, with corresponding timing diagram shown in FIG. 14A. Referring to FIGS. 14A and 14B, initially the photodiode 110 (PD) is reset by pulsing the transfer gate line (TG) and raising the reset gate line (RG) as shown. After TG goes low, photocharge integration commences and RG is left on or partially on to provide blooming protection. At the start of a CDS readout, the row select (RS) signal for desired row is asserted and the source follower 105 (SF) is connected to the column output line, pixout. Next the reset-state sample-and-hold control signal (SHR) signal and signal-state sample-and-hold-signal control signal (SHS) are raised (e.g., concurrently or one after the other as shown) to switchably couple capacitors Cr and Cs of sample-and-hold circuit 224 to the pixout line (i.e., via access transistors 225, 227) and thus charge to the reset-state potential thereon. Shortly thereafter SHR goes low, switching off transistor 225 to store (or capture) the reset-state of the floating diffusion node 112 (FD) on reset-state sample-and-hold capacitor, Cr. Note that while SHR is shown as falling shortly before RG, SHR may alternatively be lowered between the RG falling edge and the subsequent TG rising edge.

At this point, feedthrough-compensated photocharge transfer is enabled by lowering RG and raising TG in a manner that enables the negative RG feedthrough to cancel or substantially reduce (i.e., compensate for) positive TG feedthrough. To avoid lost photocharge, the RG signal starts to go low prior to (and, in one embodiment, as close as possible to) the TG signal going high. The proximity of the RG falling edge and TG rising edge are constrained by timing control and charge transfer, (see inset 219 in FIG. 14A). The TG rising edge does not occur prior to the RG falling edge since this will cause at least some portion of the charge transferred from the PD to the FD to be swept out to the supply Vdd via reset transistor 109.

Alternately the RG signal can go partially lower, (see inset 221 in FIG. 14A), prior to the rising edge of TG and the full falling edge of RG. This provides two benefits; (1) the RG feedthrough can be matched to the TG feedthrough since RG and TG may have inherently different coupling capacitances to the FD, and (2) this produces a barrier from the FD to the RG region to prevent charge loss of the initial small amount of signal transferred from the PD as TG is turned on. The RG and TG edges cancel each other's feedthrough to the FD and the column output line can settle quickly for small signals, (as previously described). Next, the SHS signal falls to sample the signal+reset level onto capacitor Cs.

Referring to inset 223 of FIG. 14A, the TG and RG edges can also be designed to fall more slowly to provide more timing margin for placement of edges to avoid charge loss.

Feedthrough Compensation Using Added Signal Lines and/or Pixel Components

Figure 15A:
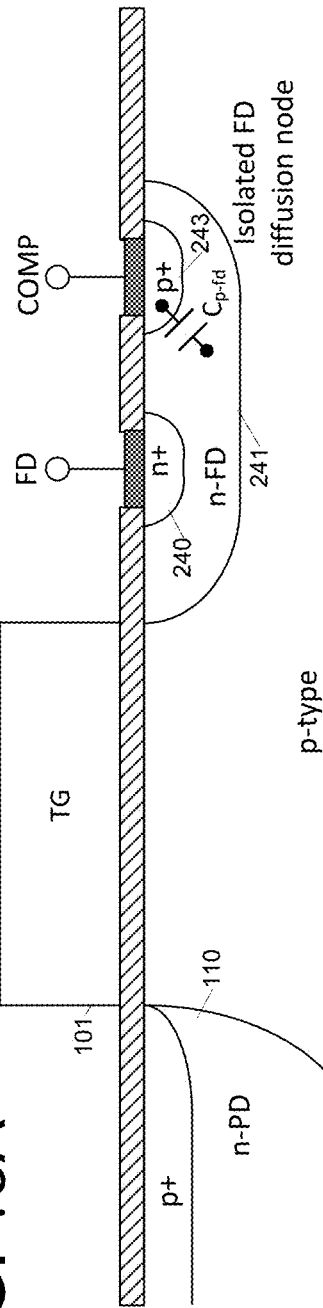
FIGS. 15A and 15B illustrate an alternative feedthrough compensation approach in which a dedicated compensation signal line is coupled to an in-pixel compensation structure.
Figure 15B:
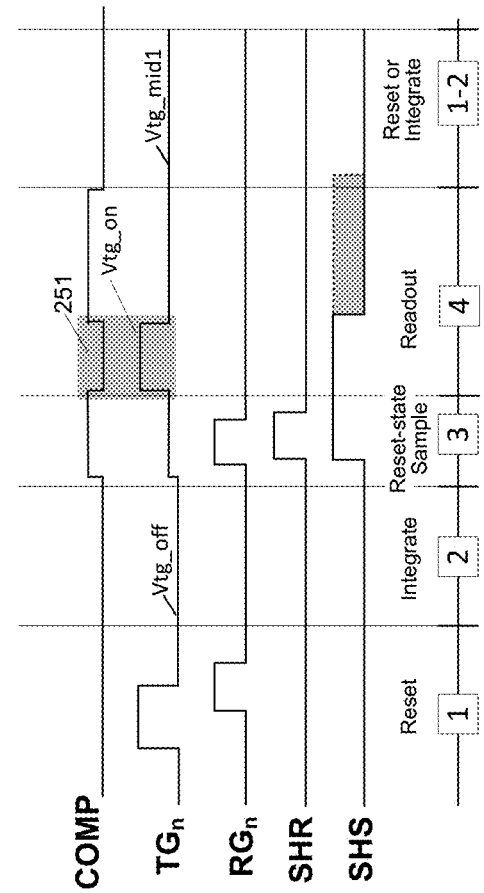

FIGS. 15A and 15B illustrate an alternative feedthrough compensation approach in which a dedicated compensation signal line ("Comp") is coupled to an in-pixel compensation structure. Referring first to the pixel cross-section embodiment shown in FIG. 15A, a somewhat heavily n-doped floating diffusion node 240 (n+) is formed within a more lightly doped n-type isolation well 241 together with a p+ compensation node 243. By this arrangement, the floating diffusion node is effectively extended to the size of the n-type isolation well 241 (while maintaining isolation between the n+ and p+ nodes 240, 243) so that a capacitive coupling "$C_{p\text{-}fd}$" is formed between the p+ node 243 and the floating diffusion. Consequently, a negatively pulsed feedthrough compensation signal applied to the isolated p-region 243 via the compensation line will capacitively couple to the floating diffusion and thus may be used to compensate for (i.e., negate or otherwise mitigate) undesired control-signal feedthrough. An example of this operation with respect to TG-feedthrough is illustrated in FIG. 15B. In the embodiment shown, the compensation line is raised to a predetermined baseline potential, and thereafter pulsed negatively, from the baseline potential to a below-baseline potential and back as shown at 251, simultaneously with assertion of the $TG_n$ pulse, thereby compensating for $TG_n$ feedthrough.

The required voltage swing on the negative-polarity compensation pulse (and thus the baseline potential to which the compensation signal is armed in the embodiment of FIG. 15B) is dependent on $C_{p\text{-}fd}$ and is made small enough to avoid a large dark current (or breakdown or punch-through) in the p+ to n-FD junction.

FIG. 16A illustrates an alternative in-pixel compensation structure embodiment in which photodiode 110 and floating diffusion node 112 are formed within a p-well 261 that has been implanted into an n-substrate or n-epi material. An isolated p-region 263 is formed outside of the p-well and a separate n+ diffusion 265 is formed inside of the isolated p-region. This n+ diffusion 265 in isolated p-region 263 is connected to the n+ floating diffusion node 112 (e.g., by metal layer connection or poly 266) and the isolated p-region 263 is connected to the COMP signal line. By this arrangement a negative-polarity COMP pulse will capacitively couple from the isolated p-region 263 to the n+ diffusion 265 (i.e., by virtue of capacitance Cp-fd as shown) and therefore to the floating diffusion via the n+ diffusion-to-FD interconnect 266, thus compensating for control-signal feedthrough to the floating diffusion.

The approach shown in FIG. 16A can also be used for 3D (three-dimensional) stacked sensors or other multi-die arrangements. Referring to FIG. 16B, for example, floating diffusion node 112 and isolated p-region 263 are fabricated as in FIG. 16A, but disposed on separate (respective) integrated circuit dies (or wafers) that are interconnected in a die stack or other multi-die arrangement to establish connection 276 between isolated p-region 263 and floating diffusion node 112.

Figure 17:
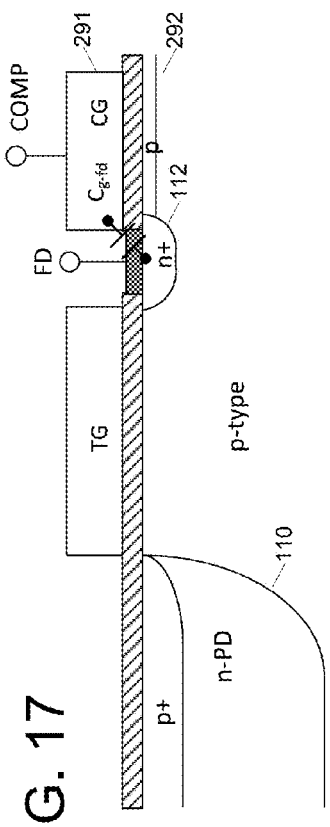
FIG. 17 illustrates another in-pixel compensation structure embodiment in which an additional compensation gate is formed adjacent the floating diffusion node to establish a desired coupling capacitance.

FIG. 17 illustrates another in-pixel compensation structure embodiment in which an additional compensation gate 291 (CG) is formed adjacent the floating diffusion node 112 to establish a coupling capacitance to the floating diffusion as shown by $C_{g\text{-}fd}$. The channel region 292 beneath the compensation gate is p-doped so that no additional transistor is formed and so that voltages applied to CG do not alter the channel potential in a manner that would affect the capacitance or charge flow of floating diffusion node 112.

Figure 18:
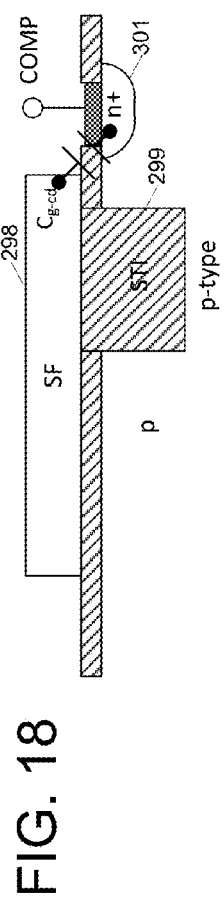
FIG. 18 illustrates a further in-pixel compensation structure embodiment.

FIG. 18 illustrates a further in-pixel compensation structure embodiment. As shown, the source-follower poly feature 298, which is electrically coupled to the floating diffusion node (connection not shown), is extended over a shallow trench isolation (STI) region 299 to an adjacent gate oxide and n+ source/drain region 301. By this arrangement, a capacitive coupling (Cg-cd) is formed between the n+ source/drain region 301 and the source-follower poly 298 and thus between the n+ source/drain region and the floating diffusion node. A compensation line (COMP) is connected to the isolated n+ source/drain region 301 as shown, so that, a negative-polarity pulse on the COMP line will capacitively couple to the floating diffusion node to compensate for control signal feedthrough.

Figure 19:
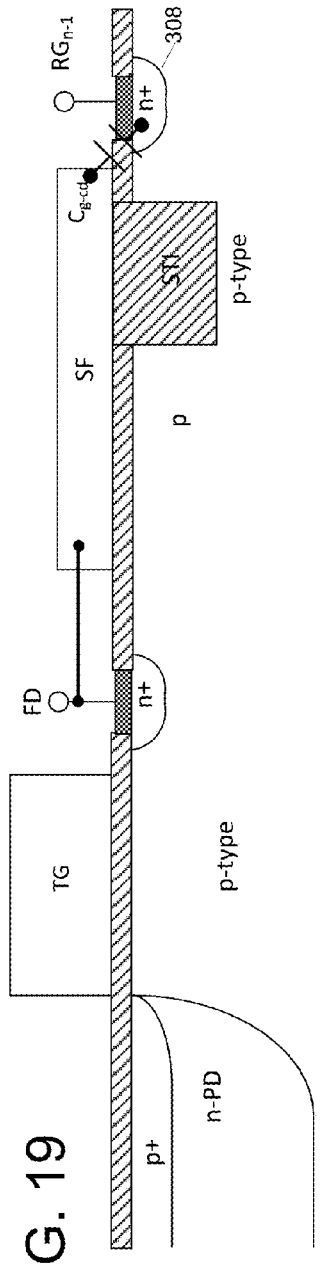
FIG. 19 illustrates an in-pixel compensation structure embodiment that enables feedthrough compensation from the reset-gate line of an adjacent pixel or adjacent pixel unit cell.

FIG. 19 illustrates an in-pixel compensation structure embodiment that enables feedthrough compensation from the RG line of an adjacent pixel or adjacent pixel unit cell (e.g., as discussed above in reference to FIGS. 10-12). As shown, adjacent pixel (or unit cell) RG line, $RG_{n-1}$, is connected to a floating drain 308 adjacent the source-follower poly and/or floating diffusion node of the target pixel to create the desired $C_{rg\text{-}sf}$.

Feedthrough Compensation within a Conditional-Read Pixel Array

While feedthrough compensation has thus far been discussed primarily with respect to single-mode 4T pixels (i.e., pixels that lack column-line transfer-gate control and thus without column-controlled conditional-read capability), the approaches and techniques disclosed may readily be extended to dual-mode (conditional-read) pixels in which a column control/feedback line (or lines) is used to enable or disable photocharge readout (i.e., photocharge transfer to floating diffusion and ensuing readout generation) according to an over/under threshold determination. For example, feedthrough compensation pulses may be generated on local RG or RS signal lines (i.e., on the instances of those lines that control reset and row-select operations within the pixel row or unit cell row for which feedthrough is being compensated) and/or neighboring RG/RS lines generally as discussed above.

FIG. 20 illustrates an exemplary pixel readout timing diagram for a conditional-read pixel in which feedthrough compensation pulses are generated on one or more neighboring TGr lines (i.e., row-based transfer-gate control signal lines, designated $TGr_{n-1}*$). The diagram shown assumes a "stacked-gate" conditional-read pixel architecture (i.e., the pixel includes a transfer-enable transistor interconnected between TGr, TGc and the pixel transfer gate as shown at 103 in FIG. 1B), so that the $TGr_n$ potential (i.e., a primary source of otherwise disruptive feedthrough) is maintained at or above a level that avoids forward biasing the drain-to-body junction of the transfer-enable transistor, and TGc is generally held high during photocharge integration (i.e., phase 2). As FIG. 20 shows, negatively-directed feedthrough compensation pulses are generated in a manner analogous to generation of feedthrough compensation pulses on the neighboring TG lines shown in FIG. 8. As with the $TG_n$ and $TG_n*$ lines shown in FIG. 8, $TGr_n$ and $TGr_n*$ may be routed to respective pixels within a shared-FD unit cell. Also, as with $TG_n*$, by using conveying multiple feedthrough compensation pulses on respective neighboring TGr lines in the same shared unit cell, the compensation pulse amplitude required on any single neighboring TGr line can be reduced, thus enabling generation of relatively low compensation voltages that will not disrupt pixel performance (e.g. GIDL, Qsat, blooming).

In contrast to the various unconditional read operations discussed above, the conditional-read operation involves two $TGr_n$ pulses at different amplitudes—a first $TGr_n$ pulse for partial charge transfer (during overthreshold-detection phase 4) having a voltage swing Vtgr_vsp=Vtgr_part−Vtgr_mid1, and second $TGr_n$ pulse for full charge transfer (during conditional readout phase 5) having a voltage swing Vtgr_vsf=Vtgr_on−Vtgr_mid1. In the particular embodiment shown, Vtrg_mid1 is set so that Vtgr_mid1−Vtgr_off=Vtgr_vsf/3.

As explained above in reference to FIGS. 1B, 2 and 3, the full charge transfer pulse amplitude is greater than the partial transfer pulse amplitude (Vtgr_vsf>Vtgr_vsp) so that different levels of feedthrough compensation are needed. In one embodiment, the different partial-transfer and full-transfer feedthrough-compensation levels are achieved by varying the number of compensation pulse contributors between those two operations and thus avoiding generation of an additional $TGr_n*$ voltage level. That is, compensation pulses are applied on N neighboring TGr lines to compensate for full-transfer TGrn feedthrough, and on M neighboring TGr lines to compensate for partial-transfer $TGr_n$ feedthrough, where M is less than N in accordance with the difference between Vtgr_vsf and Vtgr_vsp. In another embodiment, an additional Vtgr_off level is provided for the partial TG pulse feedthrough compensation. This is indicated in FIG. 20 by the dotted line for the partial feedthrough compensation pulse and signal name Vtgr_off*. In a further embodiment not shown in FIG. 20, the partial transfer TGr pulse is implemented as a pulse with a substantially shorter width than the full transfer pulse. In this case the amplitudes of the negative-polarity compensation pulses for partial and full photocharge-transfer may be the same.

FIG. 21 illustrates an exemplary pixel readout timing diagram for a conditional-read pixel in which feedthrough compensation pulses are generated on neighboring TGr lines ($TGr_n*$) and on the local RG line ($RG_n$). In the particular arrangement shown, $TGr_n*$ and $RG_n$ are all negatively pulsed to compensate for full-transfer $TGr_n$ feedthrough, while only the $TGr_n*$ lines (or a subset thereof) are pulsed to compensate for partial-transfer $TGr_n$ feedthrough. Other feedthrough compensation combinations of $TGr_n*$ and $RG_n$ are possible.

FIG. 22 illustrates an exemplary pixel readout timing diagram in which column transfer-gate control line, TGc, is used to compensate TGr and RG feedthrough, either exclusively or in combination with neighboring TGr lines and/or the local $RG_n$ line. The layout of the transfer-enable transistor (i.e., element 103 of FIG. 1B) and/or TGc signal line may purposefully designed/altered to achieve a desired coupling capacitance with respect to the floating diffusion node. Also, to avoid disruption of the pixel cycle, any negative-polarity compensation pulses on the TGc line are implemented such that the logic-level signal applied on TGc remains undisturbed. Accordingly, in embodiments where TGc is maintained predominantly at a high logic level (e.g., Vdd) throughout the integration, reset-state sampling, overthreshold detection and conditional-readout phases of the pixel cycle, TGc is elevated to voltage level (Vtgc_on) above the high logic level during the reset-state sampling, overthreshold detection and conditional readout phases to permit negative-pulse amplitudes that will not cause the TGc signal to fall below the logic-high voltage level. Thus, TGc is pulsed negatively from Vtgc_on to Vdd and back at 351 to compensate for $RG_n$ feedthrough, is pulsed somewhat less negatively from Vtgc_on to Vtgc_on2 and back at 353 to compensate feedthrough from the lower-amplitude $TGr_n$ pulse applied to effect partial transfer, and is then conditionally (i.e., according to the over/under threshold determination) pulsed again from Vtgc_on to Vdd and back at 355 to compensate feedthrough from the higher-amplitude full-transfer $TGr_n$ pulse. As shown, for those pixel columns determined not to exceed the conditional-read threshold, TGc is driven low to prevent photocharge transfer and thus prevent pixel readout.

Although $TGr_n*$ signals may be applied to compensate control-signal feedthrough in split gate conditional-read pixels in generally the same way as described for stacked gate embodiments, the direct connection of the TGc signal to the transfer gate (i.e., portion thereof) brings additional considerations. For one, the capacitive coupling between the TGc line and floating diffusion tends to be significantly increased (i.e., in a split-gate vs. stacked gate embodiment) by virtue of FD-adjacent layout, reducing the requisite compensation pulse amplitudes. An exemplary pixel readout timing diagram for use of TGc for $TGr_n$ feedthrough is shown in FIG. 23. As shown, TGc is raised to Vtgc_on2 at the conclusion of integration phase 2, then pulsed negatively to Vdd and back to compensate RGn feedthrough prior to reset-state sampling. Thereafter, TGc is pulsed negatively from Vtgc_on2 to Vtgc_on3 and back to compensate for the partial-transfer pulse on $TGr_n$ and then conditionally pulsed from Vtgc_on2 to Vdd and back to compensate for the full-transfer pulse on $TGr_n$. As in the embodiment of FIG. 22, TGc is driven low during the full-transfer pulse on TGrn for those pixels (in respective columns) determined not to exceed the conditional-read threshold.

FIGS. 24A and 24B illustrate exemplary readout timing diagrams for conditional-read pixels with feedthrough compensation. More specifically, FIG. 24A presents exemplary readout control signals and waveforms with respect to conditional-read operations within pixel rows i, i+1, i+2 and i+3 (i.e., rows that may be but are not necessarily physically adjacent one another), and thus partial-transfer and full-transfer pulses on respective TGr control lines (designated "TGr$_n$") for those pixel rows. By contrast, FIG. 24B illustrates control signals and waveforms for unconditional read operations within the same conditional-read pixel array. In both cases, the TGc line is assumed to be coupled to a split-gate photocharge transfer structure, though stacked-gate structures may be used in alternative embodiments. Also, it is assumed in this example that the neighboring TGr signals used for feedthrough compensation (i.e., TGrn*) are coupled to pixels that share a floating diffusion node with the pixel coupled to TGr$_n$. In other embodiments, other local and neighboring control signal lines may be used instead of or in addition to the TGr$_n$* lines, and TGr$_n$* may apply to neighboring pixels that do not share a floating diffusion. Also, as discussed above, in-pixel feedthrough compensation structures and corresponding compensation control lines may be provided to enable feedthrough compensation with or without contribution from existing pixel control lines.

Figure 25A:
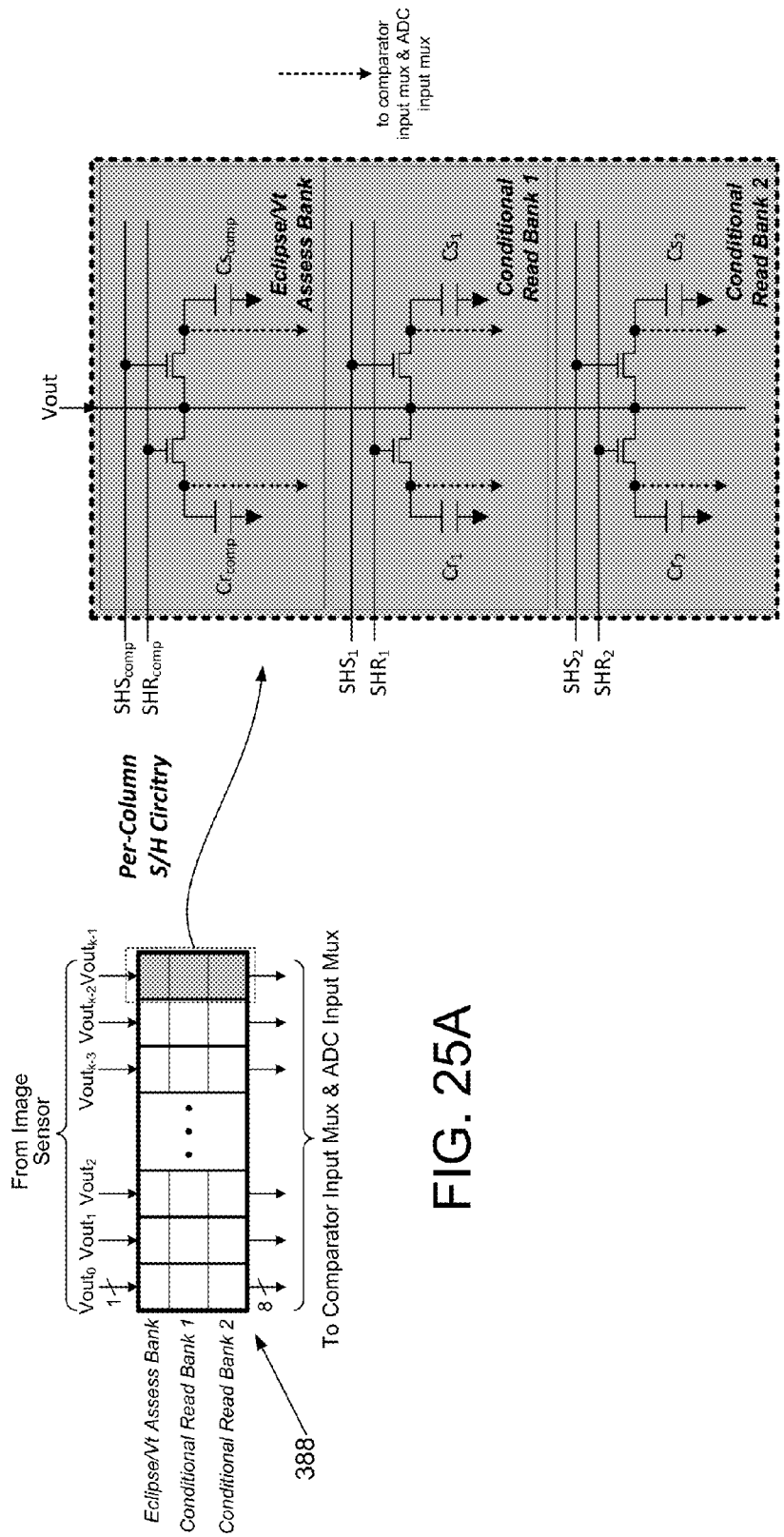
FIGS. 25A-25C illustrate embodiments of a per column sample and hold block, comparator/sense-amplifier, and per n-column PGA and ADC blocks that may be used to effect the readout operations illustrated in FIGS. 24A and 24B.
Figure 25C:
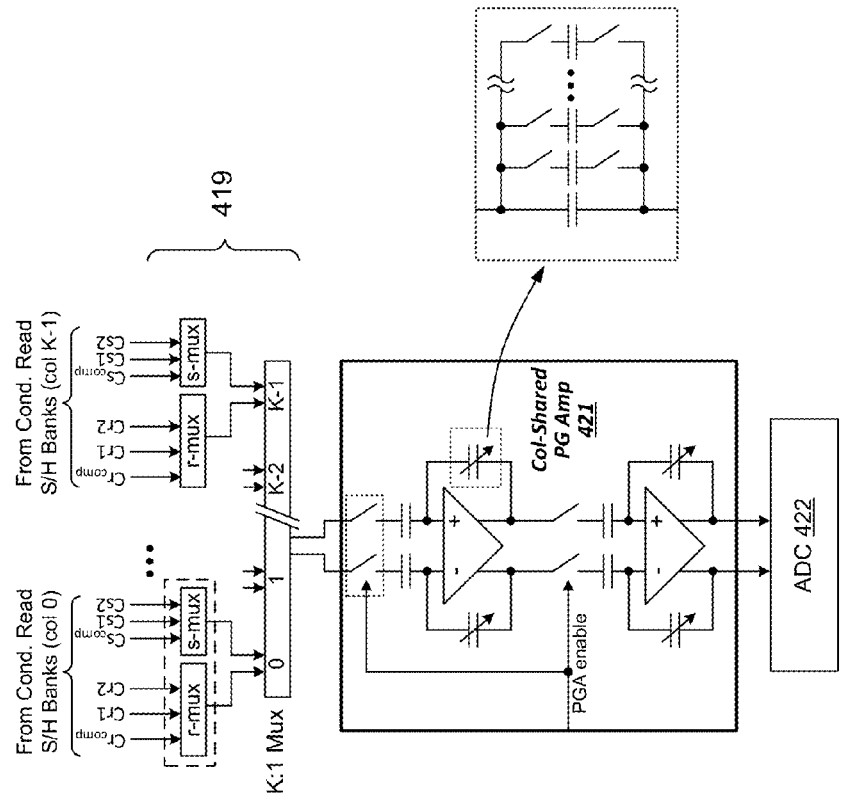
Figure 25B:
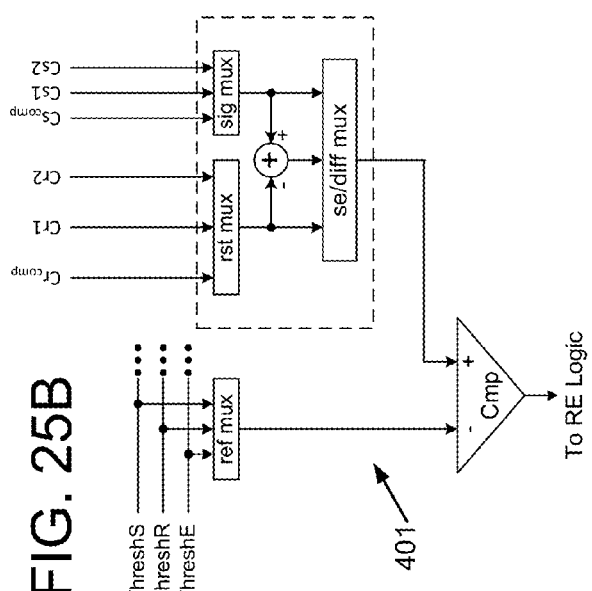

The timing diagrams presented in FIGS. 24A and 24B are associated with the readout circuitry diagrams in FIGS. 25A-25C, which illustrate embodiments of per column sample and hold blocks 388 (FIG. 25A), comparator/sense-amplifier 401 (FIG. 25B), and per n-column PGA and ADC blocks 419, 421 and 422 (FIG. 25C). Notable features of the readout timing include, without limitation:

For conditional sub-frame readouts, the partial transfer readout can be done with short CDS time and short read time. Since the partial transfer and threshold assessment operation are to determine whether the signal integrated in the PD and transferred to the FD is larger than a specified threshold, it is not necessary to have an SHS time and pixout settling time that is long enough to charge a storage capacitor Cs to a high light or saturated pixel level. It is only necessary to have an SHS time and pixout settling time that is long enough to charge Cs to the specified threshold level, (which is a very small signal for the partial transfer threshold detection method). With this method the pixel read noise for the partial transfer and threshold assessment can be made to be very low and thus increase the detection sensitivity, (reduce the number of electrons required to trip the comparator), of the threshold assessment.

For conditional sub-frame readouts, the full-conditional transfer readout can be done with an SHS time and pixout settling time that is long enough to charge Cs to a high light or saturated pixel level. Since the threshold level is typically set to half of full well for example, the conditional full transfer readouts will be signals higher than half of full well and it is not necessary to have the lowest read noise due to the signal being photon shot noise limited. The CDS time and read noise cannot be short and low respectively since the partial transfer and threshold assessment time has elapsed between the falling edge of SHR and the falling edge of the conditional SHS. Note that this time and read noise may be reduced by having a very short partial transfer and threshold assessment readout enabled by the feedthrough compensation.

Because the CDS time is reduced for the partial transfer readout, the read time and row time can be diminished. May be able to reduce from 3 sequences that are pipelined in the sample and hold to two sequences that are pipelined in the sample and hold. This would reduce the number of S/H capacitor banks required which will shrink die size.

For unconditional sub-frame readouts, the time slot normally reserved for partial transfer and threshold assessment is used for the full transfer unconditional readout. With this approach, described in greater detail below, a bifurcated (dual) readout or dual SHS technique can be utilized to optimize the readout for both low and high light signal levels. Also, since no partial or conditional sequence occurs in an unconditional sub-frame, the low light SHS can use the comparator S/H bank and the high light signal readout can use the readout S/H bank, (no added banks or signals are required).

Figure 26:
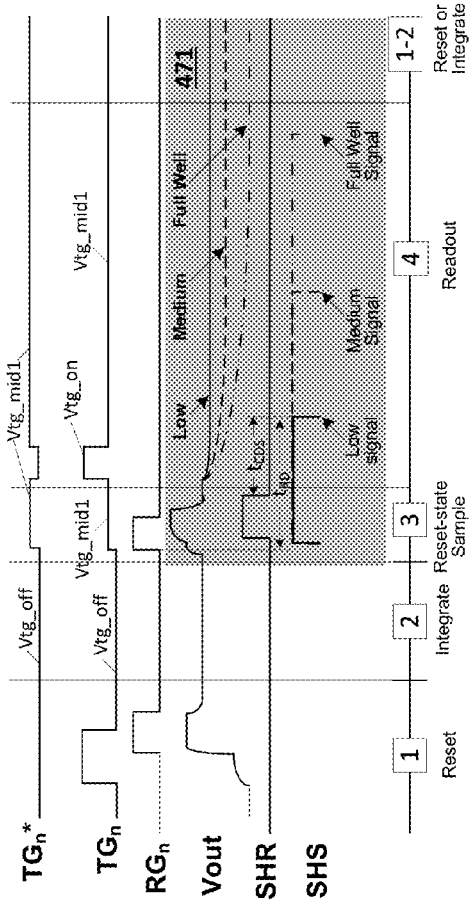
FIG. 26 illustrates an exemplary compressed-CDS pixel readout timing diagram enabled by feedthrough compensation.

Bifurcated Low-Light/Bright-Light Readout Paths—Leveraging Compressed CDS for Enhanced Low-Light SNR FIG. 26 illustrates an exemplary compressed-CDS pixel readout timing diagram enabled by feedthrough compensation (e.g., using techniques shown in FIGS. 7-9). As shown, now that control-signal feedthrough disturbances to the floating diffusion and pixout have been compensated, SHS (the signal-state sample-and-hold control signal) can rise at the same time as SHR (the reset-state sample-and-hold control signal) in order to pre-charge the signal-state storage capacitor to the reset level prior to photocharge transfer from photodiode to floating diffusion. Also, for low-light (small) signal readout, the CDS time is now constrained primarily by the TG$_n$ pulse width and thus may be on the order of 30-50 nanoseconds, or possibly less. In the case of a medium to bright-light ("large") signal readout, however, additional time may be required after the falling edge of the TG$_n$ pulse to fully charge the sample-and-hold capacitance to the correspondingly higher level—a circumstance accommodated by extending the SHS pulse width at penalty of increased pixel read noise. FIG. 26 illustrates this timewise-SHS extension within shaded region 471, contrasting the highly compressed (and thus low-noise) CDS time possible for low-light signals with the longer, higher-noise CDS time needed for medium and bright-light signals, reaching a maximum duration at the full-well potential of the photodiode.

Recognizing that the SNR of small, low-light signals will suffer most if CDS time is extended to accommodate all lighting conditions, a number of embodiments detailed below oversample the signal-state of the floating diffusion, capturing a first signal-state sample after a compressed-CDS time corresponding to a fixed or programmable threshold between small low-light and brighter-light signals (the "intermediate" threshold), and then capturing a second signal-state sample after a longer CDS time sufficient to accommodate larger (brighter-light) signals within the perceptible range of the image sensor. The brighter-light CDS result (or low-light CDS result) may then be evaluated pixel by pixel to determine which of the two signal-state samples should be output as the finalized CDS value, for example, by comparing the brighter-light CDS value (before or after digitization) to the intermediate threshold (or an offset from the intermediate threshold), selecting the brighter-light CDS result if the threshold is exceeded and selecting the low-light CDS result otherwise.

Figure 27A:
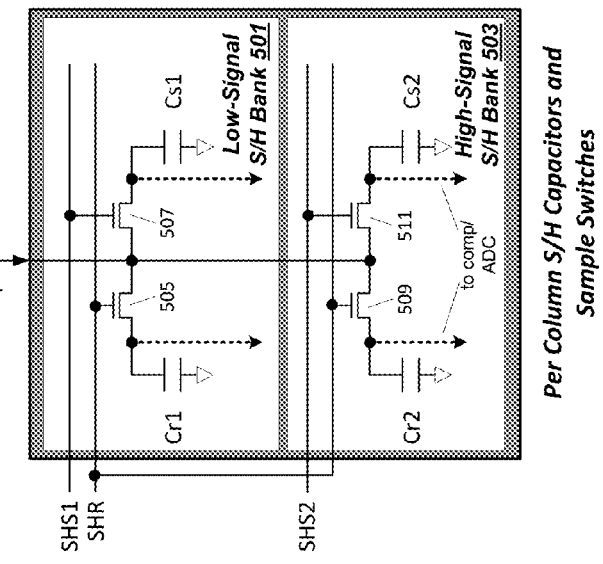
FIGS. 27A and 27B illustrate an exemplary S/H circuit embodiment and corresponding pixel readout timing diagram corresponding to the signal-state oversampling described in reference to FIG. 26.
Figure 27B:
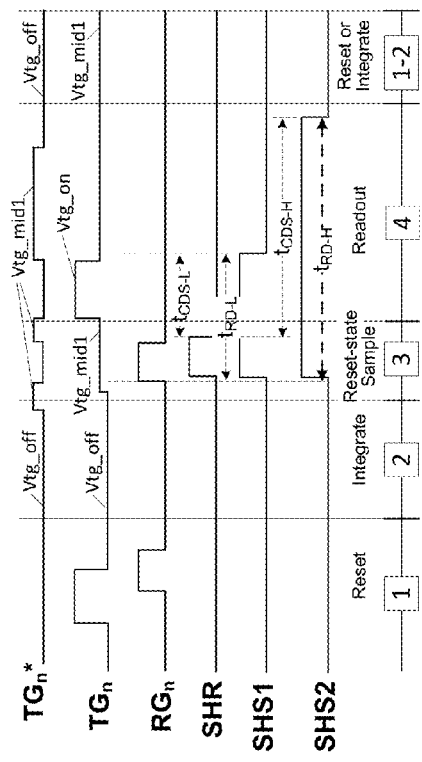

FIGS. 27A and 27B illustrate an exemplary S/H circuit embodiment and corresponding pixel readout timing diagram corresponding to the signal-state oversampling described above—a dual or bifurcated read-path approach that preserves tightly-compressed CDS times for the low-light signals that most benefit from increased noise rejection, while maintaining the longer pixout settling time needed for brighter-light signals. Referring first to FIG. 27A, the pixel readout circuitry includes two banks of sample-and-hold capacitors, a low-signal bank 501 and a high-signal bank 503. As shown, access transistors 505, 509 that switchably couple the reset-state capacitive elements Cr1, Cr2 within each of the two signal banks to the pixout line for a given pixel column are controlled by a shared SHR signal and thus are operated in parallel to capture reset-state samples. By contrast, the access transistors 507, 511 that switchably couple pixout to the sample-state capacitive elements Cs1, Cs2 within the low and high signal banks are controlled by separate low and high SHS signals, SHS1 and SHS2. By this arrangement, and by setting the SHS1 and SHS2 pulse widths to respective short and long durations, divergent CDS times are achieved for the two signal-state samples, enabling low-light-level signals to be captured after a tightly compressed CDS time within low-signal S/H bank 501, and higher-light-level signals to be captured after a longer CDS time within high signal bank 503.

FIG. 27B illustrates an exemplary dual-readout timing pattern that may be employed with respect to the dual-bank per-column sample-and-hold circuitry of FIG. 27A, emphasizing the compressed small-signal CDS and readout times effected by SHR and SHS1, and the longer large-signal CDS and readout times effected by SHR and SHS2. As shown, $RG_n$ is pulsed to reset the floating diffusion, while $TG_n^*$ are simultaneously pulsed negatively (i.e., pulsing from Vtg_mid1 to Vtg_off and back in this example) to negate feedthrough from $RG_n$ to the floating diffusion. SHR1 and SHR2 are raised with $RG_n$ to enable the signal-state capacitors Cs1 and Cs2 to charge to the baseline reset-level in preparation for eventual signal-state sampling. SHR is also raised with $RG_n$ and then lowered as shown to capture the floating-diffusion reset level on both reset capacitors Cr1 and Cr2 (i.e., as reset-state samples). Note that the SHR signal may be lowered shortly after the SHR rising edge (i.e., effecting narrow SHR pulse) as the floating diffusion node and pixout line can settle quickly without the RG feedthrough.

After capturing reset-state samples on Cr1 and Cr2, the $TG_n$ and $TG_n^*$ signals are pulsed to transfer photocharge from the photodiode to the floating diffusion (i.e., $TG_n$ is pulsed to enable the charge transfer and one or more TGn* lines are pulsed negatively to negate $TG_n$ feedthrough). As shown, SHS1 may be lowered very shortly after the falling edge of the $TG_n$ at a design-selected timing point that permits the Cs1 capacitor to be charged to signal level at least up to the intermediate threshold (i.e., capturing a signal-state sample on Cs1 corresponding to a luminance range from dark to the intermediate threshold between low-light and brighter-light signals) while maintaining low pixel read noise (i.e., due to the CDS compression); an operation made possible by the $TG_n$ feedthrough compensation. To account for the possibility that a given pixel will yield a brighter-light (above intermediate threshold) signal that will not stabilize on pixout within the compressed low-light CDS time, SHS2 goes low at a substantially later time corresponding to the pixel full-well point (i.e., pixel saturation level), thus capturing a possible bright-light signal-state sample ("large signal sample") on sample-and-hold element Cs2.

At this point, with low-light and bright-light signal-state samples captured within Cs1 and Cs2, and with reset-state samples captured within Cr1 and Cr2, the "bright-light" CDS value, SIGhigh=VCs2−VCr2, is compared to the intermediate threshold (Vref) within, for example, a comparator circuit within the column readout circuitry. As explained, the intermediate threshold is designed (and may be programmed and/or calibrated) to be slightly above a selected low-light signal level, but not above a signal level that would yield a specified pixout settling time outside the low-light CDS time. Depending on whether SIGhigh exceeds or does not exceed the intermediate threshold, Vref, either SIGhigh or SIGlow (i.e., VCs1-Vcr1) is selected, respectively, as the finalized (true) CDS representative of the pixel state (i.e., level of integrated photocharge) and is converted to a digital pixel value. By this operation, low-light pixels will retain a low read noise so that the image sensor as a whole will yield a higher low-light SNR. Also, by evaluating only SIGhigh to select between the low-light and bright light CDS captures, the low-light analog CDS signals on Cs2 and Cr2 remain undisturbed until needed for conversion and readout, thus preserving SNR of the low-light signal. Also, the SNR impact of increased brighter-light read noise resulting from the SIGhigh evaluation (i.e., for the over/under threshold determination) is negligible in view of the dominance of photon shot noise in brighter light conditions. Despite these benefits, the low-light CDS result may be used for over/under threshold determination in alternative embodiments. Similarly, despite the power savings of analog-domain selection between the low-light and brighter-light CDS values (i.e., only one CDS value need be digitized), both the low-light and brighter-light CDS values could be digitized in alternative embodiments, with the final pixel value being selected in the digital domain (e.g., comparing either or both digital samples to one or more digital threshold values). Additionally, the following alternative approaches may be implemented to evaluate the low-light or brighter-light CDS results with respect to the intermediate threshold:

A singled ended comparison can be made instead of a differential comparison, (i.e. the voltage on Cs2 (VCs2) is compared to a reference instead of VCs2-VCr2).

Comparison of SIGhigh to a reference could be done in the digital domain (i.e., with or without pre-selection digitization of SIGlow)

SIGlow and SIGhigh could be compared with one another in the analog domain or digital domain to select one or the other as the finalized CDS value;

VCs1 can be compared directly with VCs2 in the analog domain (i.e., as the reset level is the same for both) to select one or the other as the signal-state sample for the final CDS value—in such an embodiment, SIGlow or SIGhigh signal level may be generated digitally after the selected signal-state and reset-state samples have been digitized by an ADC (analog-to-digital converter).

Although embodiments having two readout paths (low-signal and high-signal) and 2× signal-state oversampling are presented in FIGS. 26, 27A and 27B and in other multiple-read-path embodiments described below, in all cases the number of read paths and corresponding oversampling factor may be extended to three or more. For example, three SHS signals and a corresponding set of three sample-and-hold banks may be provided to yield 3× oversampling and thus enable selection from among three possible CDS durations and corresponding read paths (e.g., low-light, medium-light and bright-light conditions) for the finalized pixel value.

Further CDS Compression Through TG-Asserted Signal-State Capture

In the compressed-CDS timing arrangements described thus far, the falling edge of SHS1 (i.e., sample-and-hold control signal for capturing low-light signal-state samples) does not occur until sometime after the falling edge of TG. Under this approach, emphasized in FIG. 28, the brevity of the low-light CDS time is constrained by the TG pulse width, which, for large and/or high resolution arrays, is generally more than 30 nanoseconds. And, while generating TG pulse widths on the order of 30 nanoseconds or less may be feasible in some applications, such tight pulse width demands higher power and larger area for TG decoders and drivers.

When TG feedthrough to the floating diffusion is compensated by an existing pixel signal or separate compensation signal, residual feedthrough from the rising TG edge can be made extremely small. In a number of embodiments, this circumstance is exploited by completing a low-light signal-state sample before the falling edge of the TG pulse, freeing the low-light CDS operation from the TG pulse width constraint to enable more tightly compressed CDS times. More specifically, as shown in FIG. 29A, the SHS1 pulse width is set to yield a falling edge a predetermined time, $t_{LTX}$, after the TG rising edge (and prior to the TG falling edge), with $t_{LTX}$ representing the time needed for a specified level of photocharge, corresponding to an upper end of the low-light signal range, to be transferred from the photodiode to the floating diffusion (e.g., 20e⁻, though higher or lower charge levels may be selected by design or configuration programming), and for the time needed for the pixout line to settle to the voltage representative of an upper end of the low-light signal range, including any residual feedthrough signal. FIG. 29B illustrates an expanded view of the low-light CDS operation in FIG. 29A, showing that the SHS1 falling edge occurs the predetermined $t_{LTX}$ time (designated 'c') after the TGn rising edge and thus after the floating diffusion node receives the design-specified (and/or programmatically specified) amount of charge from the photodiode. This time can be as short as 5-10 nanoseconds, thus effecting an extremely brief low-light CDS time (i.e., interval 'b' from the falling SHR edge to the rising TGn edge plus interval 'c' from the rising TGn edge to the falling SHS1 edge) on the order of 10 to 20 nanoseconds. The minimum CDS time may be limited by the time needed for the pixout line to settle to the voltage representative of an upper end of the low-light signal range, including any residual feedthrough signal. The total low-signal read time, $t_{RD-L}$, which includes the CDS time (b+c) plus the reset-state sampling time 'a' (the time between conclusion of the reset operation at the falling edge of RG and the falling edge of SHR), is also shortened. interval a+b+c (which begins from the falling RG edge) is also reduced relative to the low-signal read time required for post-TG-pulse signal-state sampling, as the TG pulse delay is avoided.

In addition to reducing the CDS time (and thus improving noise rejection), enabling low-light signal-state capture while TG remains asserted may also reduce the pixel or row read time and thus improve the sensor frame rate and/or oversampling capability. For example, for conditional-read operation, the pipelining required to achieve a desired temporal oversampling rate may be reduced. That is, the shortened low-light CDS time and read time may hasten availability of downstream readout resources (e.g., ADC converter and/or other resource shared by both low-signal and high-signal readout paths), enabling the bright-light signal-state sample to be captured at an earlier point in time (i.e., advancing the falling edge of SHS2) so that the high-signal CDS time (tCDS-H) and read time (tRD-H) to be correspondingly reduced, and thus shortening the overall dual-path readout operation.

Figure 30B:
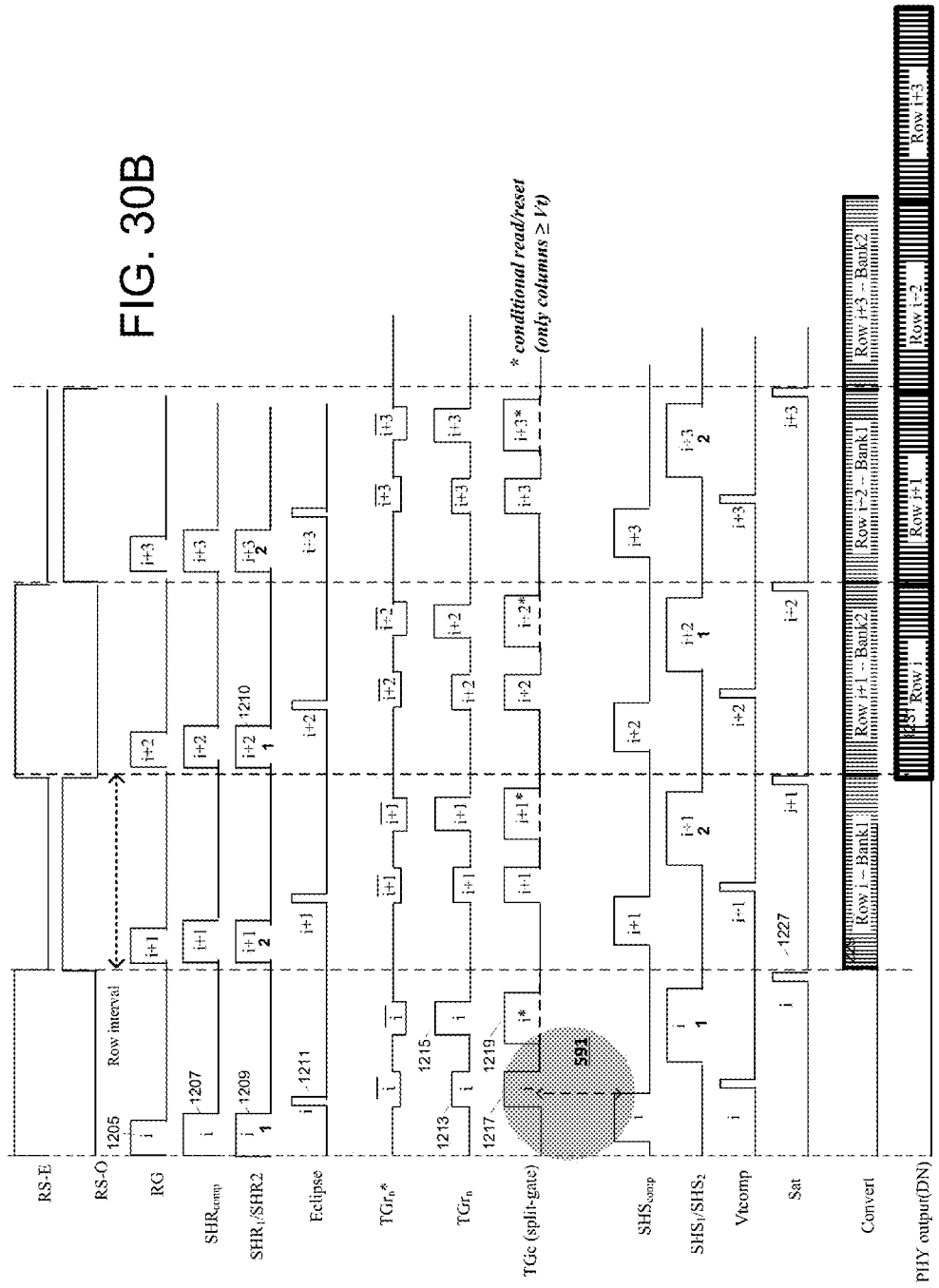

FIGS. 30A and 30B illustrate respective unconditional and conditional pixel readout timing that may be achieved using the shortened low-light CDS sampling approach discussed in reference to FIGS. 28, 29A and 29B (i.e., lowering SHS1 before TGn).

For the exemplary unconditional read timing shown in FIG. 30A, the SHRcomp and SHScomp signals effect a short CDS time for the low signal level readout. With the falling edge of SHScomp occurring prior to the falling edge of the partial TG as shown at 581, the CDS time (and therefore read noise) for the low signal readout is reduced in a manner analogous to CDS compression/read-noise reduction for the low-light samplings discussed in reference to FIGS. 28, 29A and 29B. The high signal readout is done in a pipelined manner using the SHS1 and SHS2 signal levels, (i.e. the high light readout path for even rows is done with SHS1 and Cs1, and done for odd rows with SHS2 and Cs2).

For the exemplary conditional read timing shown in FIG. 30B, the SHRcomp and SHScomp signals effect a CDS to determine whether the pixel has exceeded the threshold. With the falling edge of SHScomp occurring prior to the falling edge of the partial TG as shown at 581, the CDS time (and therefore read noise) for the threshold assessment is reduced in a manner analogous to CDS compression/read-noise reduction for the low-light samplings discussed in reference to FIGS. 28, 29A and 29B. This improved noise rejection will correspondingly improve the detection limit of the threshold assessment, which reduces the spillover loss and improves near-threshold SNR.

Dual Readout Path Residual TG Feedthrough Correction

Continuing with TG-asserted signal-state capture (i.e., SHS falling before TG), because the TG rising edge and the nulling signal(s) falling edge occur substantially simultaneously or close temporally, the TG feedthrough to the floating diffusion is substantially eliminated. Consequently, the column output signal line (pixout) will remain at or very close to the reset signal level as charge begins to transfer from the photodiode and thus settle very quickly. Despite this rapid pixout settling, there may be some residual feedthough voltage due to non-uniformity between the TG/FD coupling capacitance and the nulling-line/FD coupling capacitance, TG and nulling signal levels, etc. Any such residual feedthrough will generally yield a systemic spatial fixed pattern offset noise (FPN) that may be corrected in a number of different ways.

In one embodiment, an additional FPN correction (i.e., to account for spatial FPN from residual feedthrough of the rising edge of TG) is effected by capturing and storing of a dark frame (i.e., in the dark capture) containing the residual feedthrough. Thereafter, this dark frame digital data is subtracted from each newly readout image frame to cancel the residual feedthrough. No other added analog circuits are required.

Figure 31A:
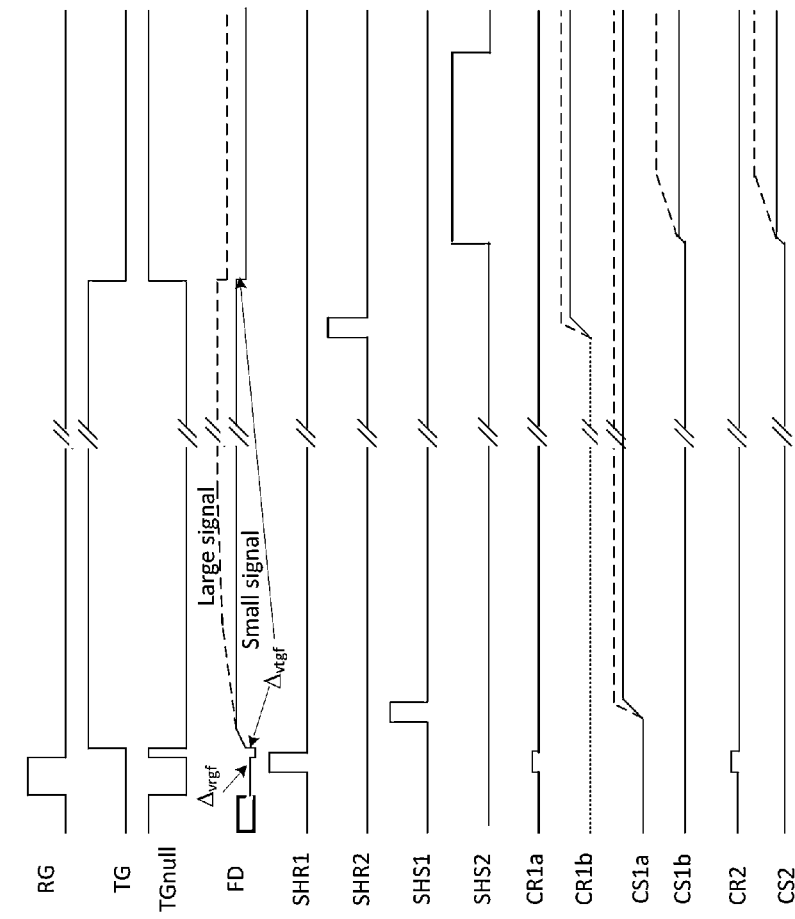
FIGS. 31A and 31B illustrate an exemplary high-level block diagram and corresponding timing diagram for an analog-domain residual feedthrough correction technique.
Figure 31B:
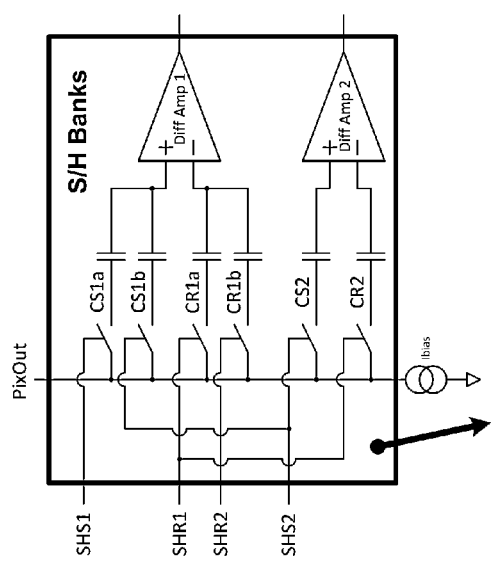

In another embodiment, instead of storing a dark frame to subtract, analog samples of the settled signal level are captured both before and after the TG falling edge using sample and hold circuitry. By sample and holding the signal value both before and after the falling edge of TG, (and rising edge of TG null signal), the difference between the TG-asserted sample and the TG-deasserted is measured to yield, as a correction value, the amount of the residual TG feedthrough. This residual feedthrough analog voltage is then subtracted in the analog domain from the CDS's signal value. In one implementation, this correction value is applied to TG-asserted CDS values on a row-by-row basis to cancel the residual TG feed-through component of those values. FIGS. 31A and 31B illustrate an exemplary high-level block diagram and corresponding timing diagram for this analog-domain residual feedthrough correction technique.

Referring to FIG. 31A, the pixel comprises a photodiode, transfer gate (TG), reset transistor with a reset gate (RG), a floating diffusion (FD), source follower input transistor (SF) and row select transistor with a row select gate (RS). The pixel also has a TGnull signal with a coupling capacitance (C1) to the FD. The TGnull signal can be implemented in many embodiments as has disclosed earlier. The per column sample and hold readout circuitry comprises a source follower constant current load (Ibias), sample and hold capacitors for storage of reset and signal voltages (Cr and Cs respectively). Sample and hold reset and sample and hold signal switches are controlled by SHR and SHS signals respectively. Two differential amplifiers (DiffAmp1 and DiffAmp2) are used to perform analog correlated double sampling (CDS) and residual TG feedthrough ($\Delta_{vtgf}$) FPN correction. DiffAmp 1 is used to determine the low-signal voltage and DiffAmp 2 is used to determine the high-signal voltage.

A representative timing diagram for the circuit in FIG. 31A is shown in FIG. 31B. Voltages on certain nodes in FIG. 31A as a result of the timing and operation of the signals in FIG. 31B are also shown in FIG. 31B. Voltages on these nodes representative of a small signal on pixout are shown as a solid line, whereas voltages on these nodes representative of a large signal on pixout are shown as a dashed line. The readout operation commences with a reset of the FD by pulsing RG. TGnull is used to compensate the RG feedthrough so that the pixout will settle quickly to the reset level. There will be some residual voltage $\Delta_{vrgf}$. After the falling edge of RG the FD is at a reset voltage with a corresponding pixout voltage $V_{RST}$. This voltage is sample and held on capacitors CR1A and CR2 via signal SHR1. Next, TG and TGnull signals are asserted and deassserted respectively. Charge begins to transfer from the PD to the FD. As discussed above, a residual feedthrough signal $\Delta_{vtgf}$ will also appear on the FD. For a small signal the FD and pixout will settle quickly, whereas a large signal will take a longer time to settle. After a sufficient amount of time to allow the targeted small signal ($V_s$) to settle the voltage level of the FD and corresponding pixout is stored on capacitor CS1$a$ via the pulse on SHS1. After the falling edge of SHS1, the voltage on CS1$a$ is Vs+$\Delta_{vtgf}$. Now after a sufficient amount of time to allow the pixel full well signal to settle to the large signal (V1), the PixOut voltage ($V_L+\Delta_{vtgf}$) is sampled and held on capacitor CR1$b$ by pulsing SHR2. Next TG and TGnull go low and high respectively. The residual feedthrough signal $\Delta_{vtgf}$ is now removed by this transition. The resulting pixout voltage is now $V_L$ and is stored on CS2 and CS1$b$ by signal pulse SHS2.

The small signal voltage S is determined via Diff Amp 1 where $$S=(CS1a+CS1-(CR1a+CR1b)=V_s-V_{RST}$$

The large signal voltage is determined by Diff Amp 2 where $$S=CS2-CR2=V_L-V_{RST}.$$

Bifurcated Low-Signal/High-Signal Readout Architectures

Ultra low noise readout architectures having bifurcated low-light and bright light (low signal/high signal) readout paths with respective short and longer CDS times are presented in a number of embodiments below. In general, the low-signal and high-signal ranges overlap at a boundary signal level where photon shot noise does not completely dominate the total temporal readout noise. That is, the high signal range extends from just below the boundary to a full-well signal level (i.e., saturated photodiode) and the low signal range extends from dark (no photocharge) to just above the boundary. As generally discussed above, CDS values are captured/generated speculatively via both the low- and high-signal paths, with either the low-signal CDS value or the high-signal CDS value being selected based on the signal level indicated by either or both of the CDS values themselves. The dual readout paths can share some or all circuit components leading up to the final selection point (e.g., amplifier, S/H bank, ADC) and thus do not, in all cases, have physically different circuit paths but rather different temporal intervals, conditions and controls.

Figure 32:
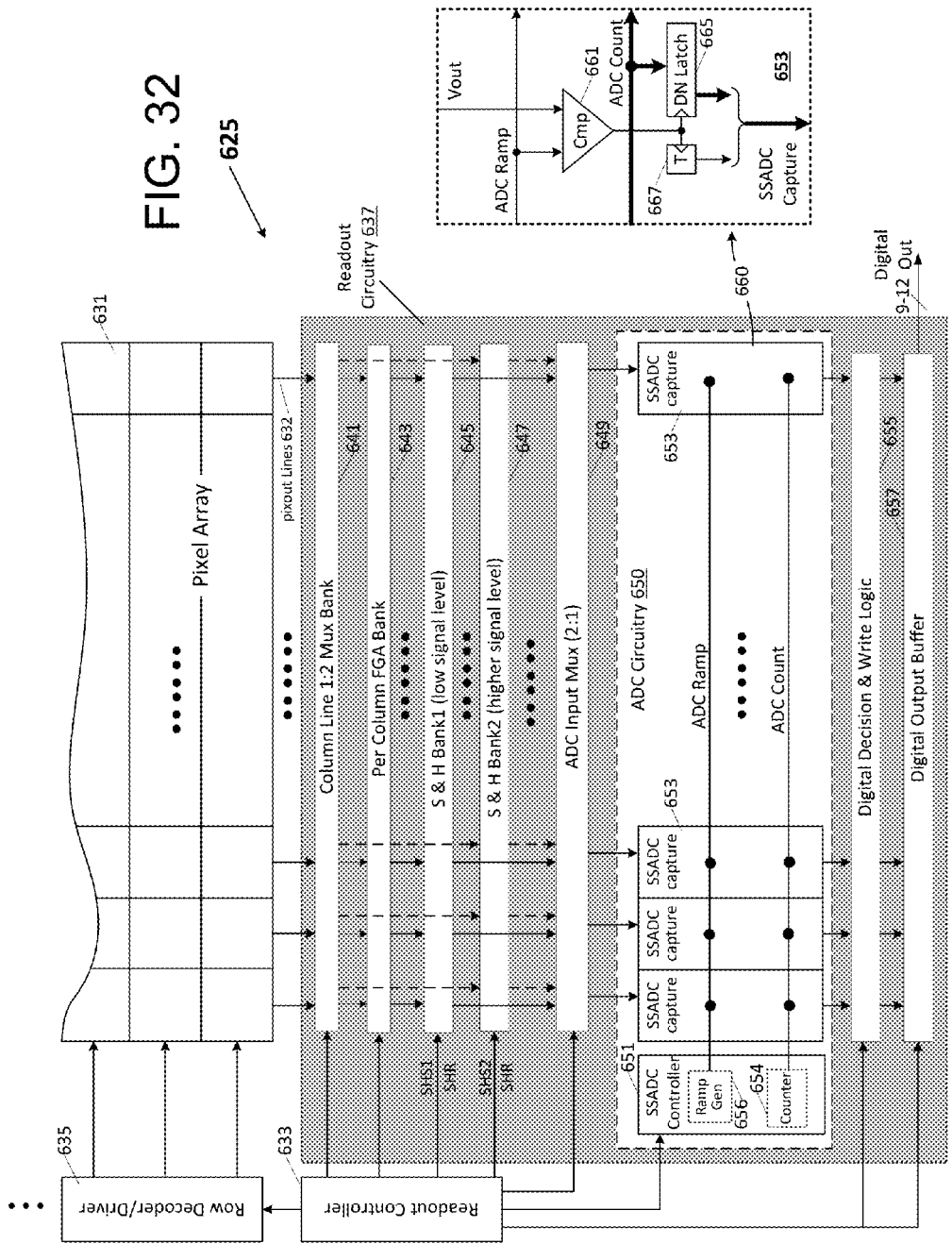
FIG. 32 illustrates an embodiment of an image sensor having a dual-S/H (sample-and-hold) bank readout architecture to enable bifurcated low-light/bright-light signal capture.

FIG. 32 illustrates an embodiment of an image sensor 625 having a dual-S/H bank readout architecture to enable bifurcated low-light/bright-light signal capture. As shown, image sensor 625 includes a pixel array 631 (e.g., rows and columns of pixels which may or may not include shared-floating-diffusion pixel unit cells), row decoder/driver 635 to generate row-control signals (e.g., RS, RG, TG) and row-based feedthrough compensation signals in any of the various permutations described above, readout circuitry 637 coupled to the column output lines (i.e., pixout or Vout) of the pixel array, and readout control logic 633 ("readout controller") to output timing, configuration and/or control signals to row decoder/driver 635 and readout circuitry 637. In the embodiment shown, readout circuitry 637 includes a column-line multiplexer bank 641, per-column fixed-gain amplifier (FGA) bank 643, low-light (low-signal) and brighter-light (high signal) sample-and-hold (S/H) banks 645, 647, ADC input multiplexer bank 649, ADC circuitry 650, decision/write logic 655 and digital output buffer 657.

Each pixout line 632 is coupled to a respective column of pixels within pixel array 631 and conveys reset-state and signal-state outputs of a selected pixel to readout circuitry 637. More specifically, in the embodiment of FIG. 32, each pixout line is coupled from output nodes of a pixel column (i.e., a column of pixels, one of which is selected at a given time by a row-based row-select signal (RS) to drive pixout) to a respective 1:2 multiplexer within multiplexer bank 641, which in turn delivers the pixout signal to either a per-column FGA within FGA bank 643, a S/H circuit within high-signal S/H bank 647, or both depending on the state of low-select/high-select mux control signals from readout controller 633.

Figure 33:
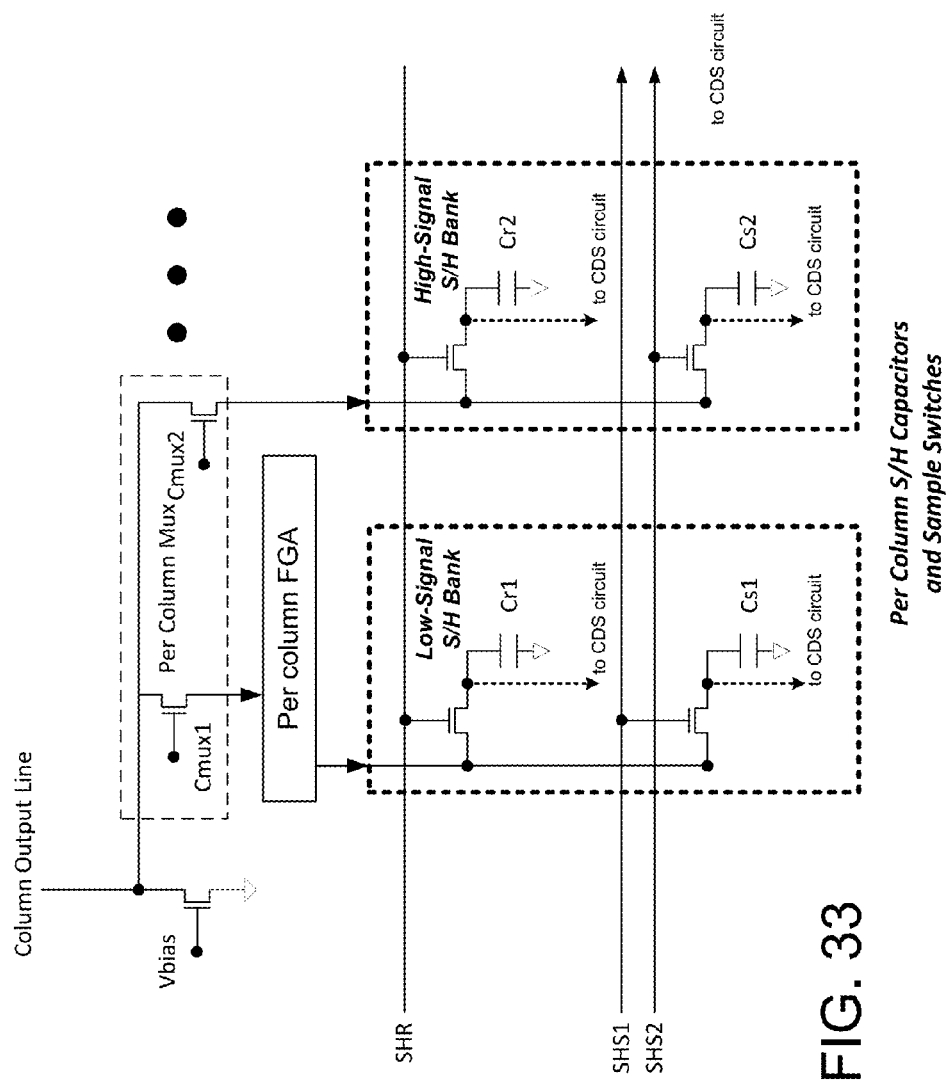
FIG. 33 illustrates embodiments of a per-column multiplexer, per-column FGA (fixed-gain amplifier) and per-column low-signal and high-signal S/H circuit banks that may be implemented within the column line multiplexer, FGA and S/H circuit banks of FIG. 32.

FIG. 33 illustrates embodiments of a per-column multiplexer, per-column FGA and per-column low-signal and high-signal S/H circuit banks that may be implemented within the column line multiplexer 641, FGA 643 and S/H circuit banks 645 and 647 of FIG. 32. In the embodiments shown, multiplexer control signals Cmux1 and Cmux2 (which are delivered to each per-column multiplexer within the larger column multiplexer bank) are used to select between a low-signal pixout routing to per-column FGA (Cmux1=1, Cmux2=0), high-signal pixout routing to high-signal S/H bank (Cmux1=0, Cmux2=1) and simultaneous low-signal/high-signal pixout routing to the per-column FGA and high-signal S/H bank (Cmux1=Cmux2=1). As shown, the low-signal and high-signal S/H banks include respective reset-state capacitive elements (Cr1, Cr2) coupled to the corresponding read-out signal path (i.e., FGA output for low-signal readout path and column mux output for high-signal readout path) by a respective SHR-controlled access-transistor. The low-signal and high-signal sample-and-hold control signals, SHS1 and SHS2 similarly control transistor-switched access to sample-state capacitive elements Cs1 and Cs2 within the low-signal and high-signal S/H banks, respectively. By this operation, the reset-state sample may be captured simultaneously within the low-signal and high-signal S/H banks (i.e., on Cr1 and Cr2, respectively) in response to an SHR pulse, while SHS1 and SHS2 may be pulsed separately, at appropriate times, to capture low-signal and high-signal samples of the floating-diffusion signal-state, all as conveyed in the pixout signal line. Note that, in alternative embodiments, column line multiplexer may have only one switch, Cmux1, to selectively connect and disconnect the input of the FGA. Alternatively, column line multiplexer may be omitted altogether, and the FGA is disabled or powered down (and thus switchably disconnect from the pixout line) during the SHS2 phase. Also, differential amplifiers or other analog-differencing circuits may be provided to generate, as single-ended low-signal and high-signal CDS outputs, differences between the reset-state and signal-state samples captured within the low-signal and high-signal S/H banks (i.e., Vcs1-Vcr1 and Vcs2-Vcr2). In alternative embodiments, the reset-state and signal-state samples from each of the low-signal and high-signal S/H banks are supplied to respective differential inputs of the downstream circuit block and thus constitute respective differential CDS outputs.

In the embodiment of FIG. 32, the CDS outputs from the S/H banks are provided to respective input ports of 2:1 ADC input mux (i.e., per column components of multiplexer bank 649) which, in turn, sequentially delivers the low-signal and high-signal CDS outputs to the ADC circuitry 650. In the embodiment shown, ADC circuitry 650 comprises a single-slope ADC ("SSADC") formed by SSADC controller 651 and a bank of per-column SSADC capture blocks 653. The SSADC controller includes a counter 654 that advances incrementally through a sequence of digital numbers (DNs) and a ramp generator 656 that generates a corresponding voltage ramp to be compared within respective SSADC capture blocks to column CDS values supplied by ADC input multiplexer 649.

An exemplary embodiment of an SSADC capture block 653 is shown in detail view 660 and includes a comparator 661 (the "SSADC comparator"), DN latch or register 665, and trip bit latch or register 667. As shown, the Vout signal (i.e., instance of pixout signal, with or without gain from FGA 643, stored within a S/H bank 645 or 647 and then delivered via ADC input mux 649) is supplied to one input of comparator 661 for comparison with the ADC voltage ramp ("ADC Ramp") generated by ramp generator 656 within SSADC controller 651. The output of the comparator 661, which is reset to a logic low state prior to comparison (e.g., by an auto-zero signal or by virtue of lowering ADC ramp to a near-zero or below-zero level) remains low until the ADC ramp voltage rises above (or at least reaches) the Vout signal level, at which point the comparator "trips," transitioning its output from low to high. Although a respective SSADC capture block 653 is provided per pixel column in the embodiment of FIG. 32 and other embodiments below, in all cases, a single SSADC capture block may be shared (e.g., via time multiplexing) among two or more pixel columns.

In a number of embodiments, the ADC ramp voltage at any step in the ramp is correlated to the value within counter 654 (e.g., ramp generator 656 may be implemented by a digital-to-analog (DAC) circuit which receives the count value and thus generates a monotonically increasing (single-slope) ADC ramp voltage as counter 654 is incremented/sequenced from initial to final count value) so that the ADC count value at the comparator trip point represents the digital value corresponding to the ramp voltage that yielded the trip event, and thus an ADC conversion result. Accordingly, when the comparator trips, the high-going comparator output triggers storage of the current ADC count value within DN latch 665 (thus capturing the ADC conversion result) and setting of the trip bit latch 667 (e.g., implemented by an SR flip-flop or other bi-stable circuit capable of recording the trip event). In the embodiment shown, the trip bit and latched DN/conversion result are output from the per-column SSADC capture block 653 to decision and write logic 655, which in turn, applies/evaluates the trip bit to determine whether to store the accompanying ADC conversion result within digital output buffer 657. For example, in one embodiment, decision/write logic 655 selectively stores the latched DN value (conversion result) within digital output buffer 657 if the trip bit is set. In embodiments that perform sequential ADC conversion with respect to low-signal and high-signal readout, the digital decision/write logic may also include memory to record the low-signal trip bit for each pixel column to signal, for subsequent signal-path selection decision, whether a valid ADC result was generated for the low-signal readout. In alternative embodiments, the low-signal trip bit (i.e., trip bit generated for low-signal ADC operation) may be stored within the digital output buffer itself (e.g., within a bit field that indicates which of the low-signal and high-signal readout paths sourced the corresponding ADC result) instead of within digital decision/write logic 655. Note also, that the trip bit storage element 667 within the SSADC capture may be omitted in alternative embodiments and provided instead within the digital decision/write logic and/or digital output buffer. In further bifurcated-read-path embodiments disclosed below, the digital decision/write logic and digital output buffer are depicted as a unified "output logic/buffer" element.

Still referring to the bifurcated read path embodiment of FIG. 32, readout controller 633 issues control signals to the row decoder/driver 635 and readout circuitry 637 as necessary to appropriately time readout events including, without limitation, operation of the column line multiplexer bank 641, resetting/enabling/disabling per-column FGA 643, enabling reset-state capture within the low-signal and high-signal S/H banks 645, 647 (i.e., generating SHR pulse), enabling signal-state capture within the low-signal S/H bank (SHS1 pulse), enabling signal-state capture within the high-signal S/H bank (SHS2 pulse), operation of ADC input multiplexer 649 (control signal to select, as ADC input source, either low-signal S/H bank or high-signal S/H bank and possibly between reset-state and signal-state samples stored within either bank). With respect to SSADC controller 651 and SSADC capture blocks 653, readout controller 633 outputs one or more control signals to reset the SSADC and/or initiate ADC operation and may also output control signals that select between different profiles for low-signal and high-signal ADC ramps (e.g., as programmed within a ramp profile memory, not shown). For example, as explained in embodiments presented below, the low-signal ADC ramp may have a significantly smaller voltage step per count (DN) increment (i.e., a higher ADC gain) than the high-signal ADC ramp in view of the smaller low-signal pixout/Vout range, and/or non-uniform step duration and/or size. Conversely, the high-signal ADC ramp may have a higher voltage step per DN than the low-signal ramp, and may also have a non-uniform step duration and/or size.

Continuing with FIG. 32, readout controller 633 also outputs signals to decision/write logic 655 and digital output buffer 657 (e.g., to reset and/or arm trip bit storage elements, time/trigger decision operations, and time/enable write operations within digital output buffer 657). Note that, in addition to the operational control signals, readout controller 633 may also include voltage generators to generate threshold voltages (e.g., for single-level comparison and/or ADC voltage ramp generation) and/or multiplexer elements to select between such voltages (e.g., as supplied by other on-chip or off-chip voltage generators) at appropriate times. Row decoder/driver 635, in addition to including logic for sequencing between row addresses (e.g., to perform row-sequential readout) and timing generation of row-select (RS), reset gate (RG), transfer gate (TG or TGr) and feedthrough compensation signals (TG*/Comp, etc.) applied to effect reset and feedthrough-compensated CDS readout operations within a given pixel row, may also include voltage generators and/or selection multiplexers to enable selection/generation of pulse amplitudes and widths as described in various embodiments herein. Also, wherever practicable, effects of different pulse amplitudes may alternatively be implemented within row decoder/driver by generation of pulse sequences (including control pulse variations effected by both amplitude and pulse width and/or pulse sequence modulation).

As with all embodiments disclosed herein, the pixel array 631 itself may be composed of single-mode pixels (e.g., 4T or other types of pixels that lack column-line control over PD-to-FD photocharge transfer and thus support only unconditional readout) and/or dual mode pixels (i.e., 4T or other types of pixels having circuitry/input-point-connection that enables joint column-line (TGc)/row-line (TGr) control over PD-to-FD photocharge transfer and thus support both conditional readout and unconditional readout modes), with such pixels having shared floating diffusion nodes (e.g., pixel unit cells formed by a collection of photodiodes coupled by respective transfer gates to a shared floating diffusion, such as the four-row-by-one-column (4×1) pixel unit cell discussed in reference to FIG. 1B, 2×2 pixel unit cells, etc.) or unshared floating diffusion nodes. Any of the pixels may additionally include in-pixel feedthrough compensation structures as discussed above and the pixel array may be crossed by signal lines dedicated to feedthrough compensation (e.g., lines coupled to in-pixel compensation structures and/or disposed to yield a desired capacitive coupling without wired connection to other pixel components). Accordingly, though column-based transfer-gate control lines (TGc) and/or dedicated row- and/or column-based feedthrough compensation lines may not be explicitly shown in the embodiment of FIG. 32 or others presented herein, in all such cases such signal lines may be provided together with corresponding logic circuitry.

In one embodiment, the gain value within per-column FGA bank 643 is set in conjunction with SSADC reference ramp generator 656 to provide less than or equal to 0.25 electrons per digital number (DN) increment. Because the FGA bank is provided with respect to the low-signal readout path only, no gain-switching is required as would be the case if a programmable gain amplifier (PGA) were used to process both the low and higher signal levels sent to respective S/H banks 645 and 647. Also, because the gain amplifier is a FGA and not a PGA, fewer capacitors are required, enabling more compact implementation than a PGA. In addition, the bandwidth, noise and power of the FGA can be reduced compared to that of an inter-row switchable PGA. The FGA value is also chosen to reduce the input referred noise of the ADC and S/H block to a level where the total sensor temporal readout noise approaches the pixel source follower read noise.

The higher signal bank does not need to be processed by the FGA since the signal will be photon shot noise limited. The gain applied to the higher signal can be provided by the ADC references and/or SSADC ramp. In alternative embodiments, the gain applied to the higher signal path could be effected by a separate FGA or PGA. Further, if a PGA is employed, the PGA may be used to supply the gain required for both the low signal and higher signal readout paths.

Figure 34:
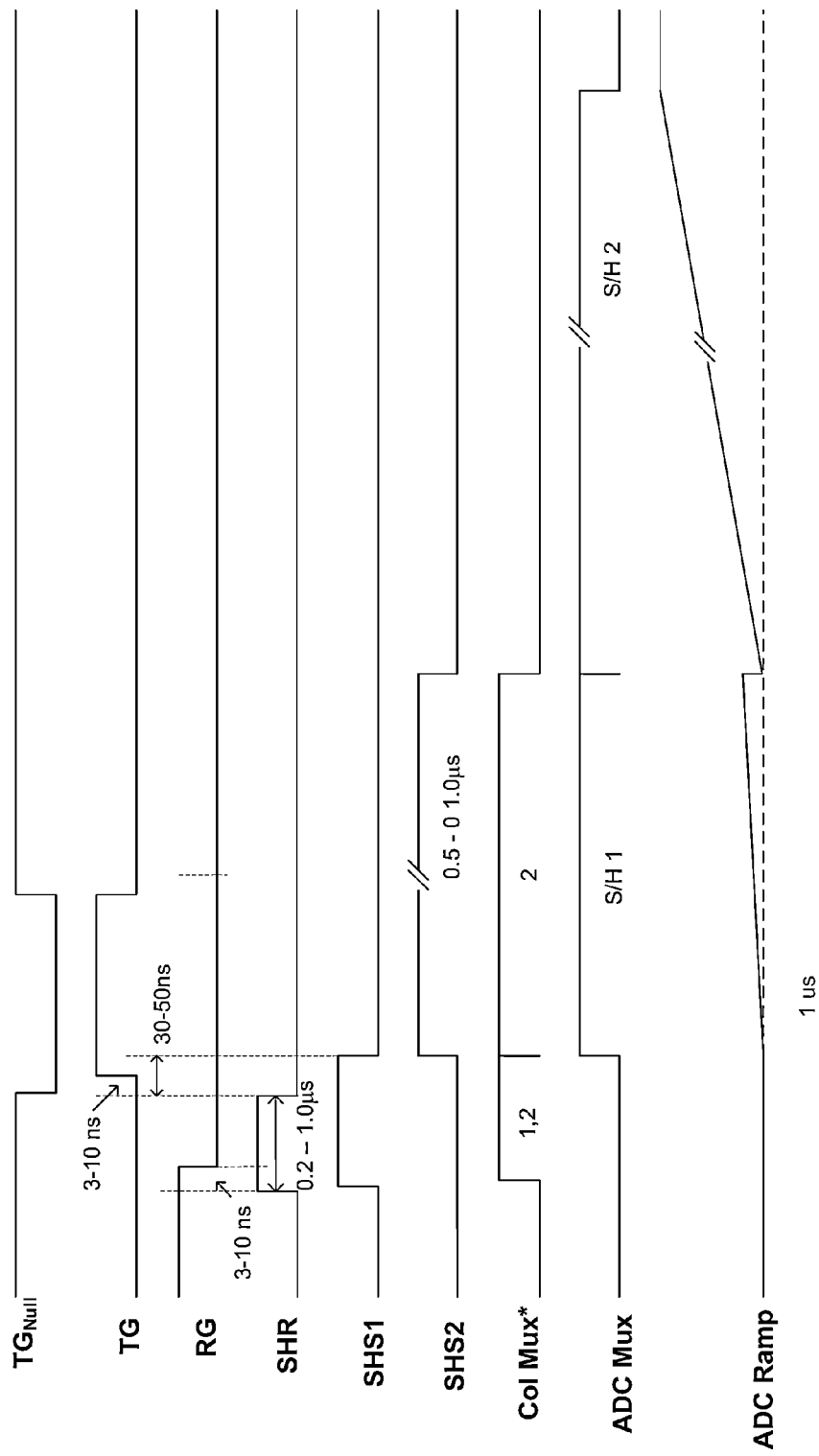
FIG. 34 presents an exemplary timing diagram for a row readout operation within the image sensor architecture of FIG. 32.

FIG. 34 presents an exemplary timing diagram for a row readout operation within the image sensor architecture of FIG. 32. As shown, the SHR and SHS1 pulses go high prior to the falling edge of the reset signal RG, (note that only the falling edge of RG is shown as the details of the prior rising edge timing may vary in different embodiments). The SHS2 signal is held low until after the falling SHS1 edge, to reduce the total capacitance during the SHS1 sampling phase in order to improve settling time of SHS1. Both Cmux1 and Cmux2 (i.e., column multiplexer control signals as shown in FIG. 3b) are asserted to connect the column output line to Cr1 (via the FGA) and Cr2. After the falling edge of RG, the SHR signal goes low, switching off the access transistors shown in FIG. 33 to store the reset signal level on capacitors Cr1 and Cr2 in the low and high signal S/H banks respectively.

A predetermined time after SHR falls, the TG and TGnull signals are pulsed to effect feedthrough-compensated photo-charge transfer from the photodiode to the floating diffusion. In one embodiment, the predetermined time between the SHR falling edge and TG rising edge is just long enough to ensure that, under all conditions, the RG falling edge is complete prior to the TG rising edge. Because the TG rising edge and the TGnull falling edge occur substantially simultaneously or close temporally, the TG feedthrough to the floating diffusion is completely or nearly completely eliminated. Accordingly, the column output signal line will remain at or very close to the reset signal level as charge begins to transfer from the photodiode, making it possible to lower SHS1 very shortly after the TG rising edge and prior to the TG falling edge as discussed above.

In the embodiment of FIG. 34, the time between the rising edge of TG and the falling edge of SHS1 is long enough to: (i) allow photodiode-to-FD transfer of a predetermined amount of photocharge corresponding to the upper end of a "low signal" and (ii) allow the Cs1 capacitor to charge (according to the FGA-amplified pixout line voltage) and the column output line to settle for a range of pixout signal levels that extends to a signal level that is slightly above the upper end of a low signal. For example, the predetermined amount of charge may be 50 electrons (a charge level at which photon shot noise will be considerably higher than the low signal path read noise), and the settling limit (i.e., time between rising TG edge and falling SHS1 edge) may be set for pixout signal that results from a charge slightly more than 50 electrons. The Cs1 capacitor can be made small to improve the setting time since the FGA will reduce the input referred noise of sample-and-hold capacitors within low-signal S/H bank 645. This settling time can be, for example and without limitation, in the 20-40 ns range, thus providing an extremely brief low-signal CDS time in the 30-50 ns range.

After the falling edge of SHS1, SHS2 signal goes high to connect the column output signal to the Cs2 capacitor. At this time the FGA is disconnected from the column output line by de-asserting signal Cmux1, (the FGA may also be powered down at this time to save power). The S/H phase for the low signal S/H bank is complete and the ADC mux is set to connect S/H bank 1 to the SSADCs. Accordingly, the low-signal ADC conversion process proceeds by ramping the ADC ramp voltage (also referred to herein as Vramp or "the reference ramp"—the output of ramp generator 656) over a voltage range corresponding a low-light CDS signal range. In one embodiment, the reference ramp terminates prior to reaching the maximum signal value. As described, this ramp range and attendant FGA gain value will provide sub-electron per digital quantization step (i.e., per DN). In one embodiment, for example, a 0.25 electron per low-light signal count for low signal level is used to account for FPN corrections. Given a predetermined signal of 40-50 electrons, 160-200 ramp steps are sufficient cover the low signal range conversion. Consequently, with an exemplary ramp clock period of 4 ns (i.e., 4 ns per ramp step, though faster or slower ramp clocks may be used), the conversion time for the low signal banks is achieved in 0.64-0.80 µs.

The ADC conversion with respect to outputs of low-signal S/H bank 645 terminates with two possible outcomes. In one case, referred to herein as "low-signal" confirmation (or "valid low-signal ADC result" or "trip" result), the reference ramp eventually rises to a level that exceeds the low-signal CDS level, causing comparator 661 within the SSADC capture block to trip (i.e., output transition from one logic state to another) and thereby latch the corresponding ramp count value (i.e., ADC count generated by counter 654 within ADC controller) within latch or register 665 of the SSADC capture block. In the other case, referred to herein as a "large-signal confirmation," the SSADC capture comparator does not trip, meaning that the low-signal CDS value exceeds the low-light signal range. A single "trip" bit may be used to record the low-signal trip/no-trip result to indicate whether the low-signal readout path yielded a valid conversion for a given pixel column and thus either a low-signal confirmation (low-trip bit=1) or high-signal confirmation (low-trip bit=0). In general, this trip/no-trip operation is assumed/described below with respect to other readout architectures that employ an SSADC, though in all cases alternative circuit arrangements may be used to effect SSADC capture and/or confirm validity of either a low-signal or high-signal CDS output.

After the low-signal ADC ramp has completed (i.e., ramped to the maximum Vramp level), the contents of the SSADC capture latches (i.e., digital values and thus ADC conversion results for columns that yielded low-signal confirmations) are transferred into digital output buffer 657. For columns in which the SSADC capture comparator has not tripped, (i.e. low-trip bit=0), a value of zero may be transferred into the digital line buffer, or alternatively transfer into the digital line buffer write (i.e., the "line buffer write operation") may be inhibited to save power.

In one embodiment, sample capture within high-signal S/H bank 647 begins substantially concurrently with the ADC conversion of the low signal S/H bank (i.e., low-signal Vramp generation). Given that the high-signal S/H bank may need to settle for a full-well signal, exemplary SHS2 pulse widths may be, for example and without limitation, in the 0.5 us to 1.0 us range. As a result, the low-signal ramp profile can be designed to finish just prior to the SHS2 falling edge, meaning that the entire low-signal ADC operation may be hidden under the high-signal CDS time. If a valid low-light signal is converted (i.e., low-signal confirmation as indicated by the trip/no-trip bit), the two sample and hold banks will have stored nominally the same signal value, scaled to account for the FGA in the low-signal readout path. By contrast, if the actual pixel signal is larger than the upper threshold for the low-signal output range, the high-signal CDS output will exceed the low-signal CDS output (i.e., after accounting for the FGA)—a consequence exploited in parallel-low/high-signal conversion embodiments discussed below.

At this point ADC input mux 649 is switched to supply ADC 650 with signals from high-signal S/H bank 647 with each such signal being converted for the full signal range, (e.g. 4096 counts for a linear ramp 12-bit converter, or 512 counts for a VLL-encoded (nonlinear) ramp profile that effects a 3-bit compression and thus a 9-bit converter). Note that the high-signal S/H bank outputs can be converted with an accelerated-ramp SSADC without compromising image quality. In the specific example mentioned above with a VLL-encoded high-signal SSADC ramp, the entire readout will take 712 clocks, a more than 5× reduction in conversion time compared to a 4096-clock linear ramp readout from single S/H bank. Further, because the low-signal ADC conversion is hidden inside the CDS time of the high-signal readout, the effective readout rate increase over a same-output bit-depth conventional sensor is approximately 8×. Further, because the VLL-encoding SSADC is now much faster than a standard or linear ramp SSADC, the VLL SSADC may be multiplexed to more than one column (i.e., shared by two or more columns, performing ADC conversions for each column in sequence) to reduce power and die-area consumption.

At the end of the ADC conversion for high-signal S/H bank 647, decision/write logic 655 transfers the latched high-signal ADC conversion result for a given column to digital output buffer 657 if the trip bit for that column indicates lack of low-signal conversion (i.e., no low-signal confirmation). Otherwise, if the trip bit confirms a low-signal ADC result, no high-signal ADC value is transferred so that the low signal digital value remains in the digital line buffer for the subject column. In a number of embodiments, the trip bit may also be stored within the digital line buffer to indicate to post-ADC correction logic (e.g. logic that performs FPN correction) the low-signal or high-signal source of the ADC output. Alternatively (or additionally), the finalized ADC result may be scaled or otherwise modified/encoded to identify which of the low-signal and high-signal S/H banks sourced the ADC-converted CDS output for a respective pixel. Note also that, for power reduction, high-signal ADC conversion and decision processing may be bypassed altogether for columns in which the low-trip bit indicates a valid low-signal ADC result. Overall, the SSADC is able to encode a maximum value equal to or greater than the full-well capacity of the pixel (e.g., either linearly or as a VLL-encoded value) with, for example and without limitation, accuracy and/or resolution to 0.25 electrons per DN step to enable post-process correction of fixed pattern noise (FPN), row temporal noise (RTN), dark current, etc. The per column FGA can also be used to sufficiently reduce the input referred noise of alternative ADC architectures, including without limitation column-shared ADC architectures such as successive-approximation registration (SAR) ADCs, and alternate per column ADC architectures such as cyclic or sigma-delta converters. For example, a VLL-encoding SAR ADC may be employed to reduce die and capacitor matching requirements and/or to provide higher bit-depth conversion.

Referring again to FIG. 32, readout of digital values (i.e., ADC results) stored within the digital output buffer 657 commences after completion of the large-signal ADC conversion (i.e., after any large-signal confirmed ADC results have been captured within the digital output buffer). In the embodiment shown, the digitized CDS results (i.e., ADC outputs or digital pixel values) may be shifted out of the digital output buffer for transmission to a memory IC and/or image-processing IC via a physical signaling interface (PHY) of the image sensor. In alternative embodiments, multiple digital pixel values may be output in parallel. Also, the digital line buffer may include separate "write-in" and "read-out" buffers (or an alternating buffer pair) to enable pixel data for a given pixel row to be output from the image sensor concurrently with storage of pixel data for the subsequent pixel row. With respect to image reconstruction, because the same ADC is used to digitize the low-light and brighter-light CDS outputs, less correction and calibration may be needed to match the output responses of low-signal and high-signal ADC results within the signal band between low-light and brighter-light signals (i.e., near the signal level corresponding to the predetermined charge limit for the low-signal S/H bank).

The image sensor architecture of FIG. 32 permits a number of other improvements/modifications that may further improve performance. For example, the CDS signal range may be split into three or more regions (instead of just two), with the S/H bank count and ADC operation count being correspondingly increased. As another example, capacitive storage elements in both the low-signal and high-signal S/H banks can be made smaller than in more conventional designs to further improve settling time and reduce circuit area. More specifically, the input-referred noise of the S/H capacitors of the low signal bank is reduced by the FGA gain so that smaller-sized capacitors do not impose a noise penalty. The size of the S/H capacitors for the larger signal bank is selected so that kTC noise will not be discernable in view of the photon shot noise of the higher signal.

Note also, that neither of the low-signal or high-signal readout paths in the architecture of FIG. 32 requires a gain stage for analog ISO gain, (either from a gain amplifier or via the SSADC ramp or references). If the low-signal ADC is designed as an accurate electron counter, there may be little or no advantage to performing ISO gain on the analog signal. Any inaccuracy in counting electrons with respect to high-signal S/H may be disregarded because the read noise is still well below the photon shot noise. Consequently, analog automatic gain control (AGC) may be eliminated (or at least disabled in selected operating modes), thus simplifying the image sensor and host camera system.

Conditional Read Sensor with Mixed SAR and SSADC Readout Architecture

As discussed above, pixels within a conditional-read image sensors may be selectively (conditionally) readout depending on whether integrated photocharge has reached/exceeded a conditional-read threshold. One of the benefits of conditional readout in oversampled readout approaches for high dynamic range is to reduce the data rate and power consumption due to oversampling, as no readout is performed for underthreshold pixels. For an oversampled conditional-read sensor, much of the power saving is achieved by power-down of the analog CDS readout and ADC conversion circuits once the valid pixels have been readout and converted. A sub-electron read noise is generally desired for the threshold detection and low light signal value readout. In general, the SSADC is good for low readout noise, but has less benefit for power reduction when a below-threshold decision is made.

Figure 35:
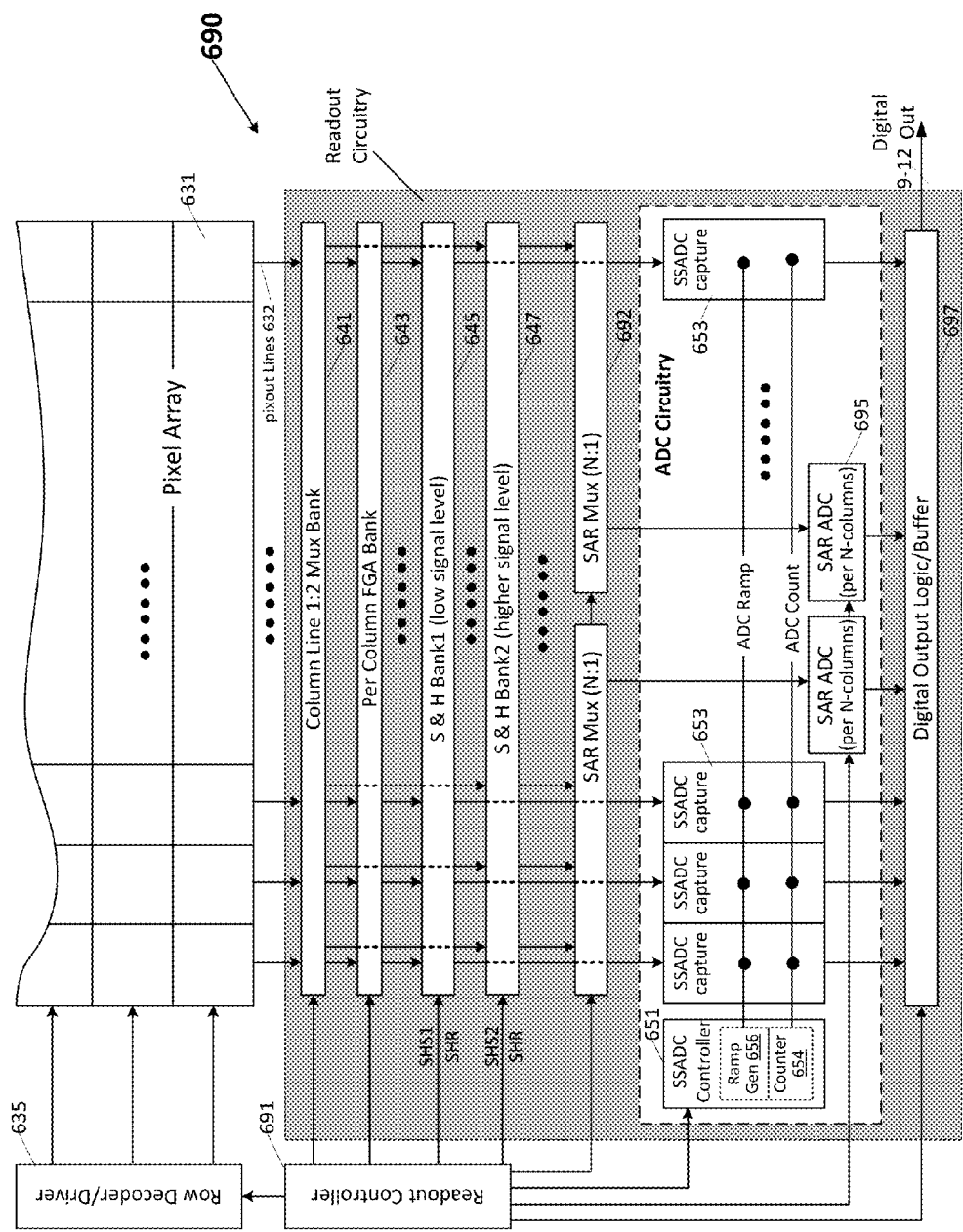
FIG. 35 illustrates a sensor architecture having both a per-column SSADC (single-slope analog-to-digital converter) and a column-shared SAR ADC (successive approximation readout analog-to-digital converter) and thus that provides both sub-electron read noise and low power for oversampled conditional readouts.

FIG. 35 illustrates an embodiment of an image sensor 690 having both a per-column SSADC (formed by controller 651 and capture blocks 653) and a bank of column-shared SAR ADCs 695 and thus that provides both sub-electron read noise and low power for oversampled conditional readouts. With this sensor readout architecture, the per col SSADC is used to provide low power, low noise readout for threshold assessment and for readout of the low signal values. Bifurcated low-signal and high-signal readout paths are provided as generally discussed in reference to FIG. 32 (i.e., FGA and S/H bank 645 in low-signal readout path, and S/H bank 647 in high-signal readout path), with the low-signal S/H bank 645 storing both the reset and signal level for the threshold assessment and for the low-light signal level for above-threshold pixels. A SAR input multiplexer bank is provided in the high-signal readout path (to receive analog CDS values from S/H bank 647) to deliver a sequence of N analog CDS values (one for each of N columns of pixel array 631) to a corresponding column-shared SAR ADC 695. The per-N-column SAR ADC (successive approximation readout ADC) 695 converts/digitizes each of N incoming high-signal analog CDS values, one after another within the time interval allotted to the SSADC conversion of the low-signal CDS values across the pixel array, thus parallelizing the low-signal and high-signal ADC operations. Low ADC noise is not critical with respect to the photon-shot-noise-dominated high signal, so a higher-noise SAR ADC is acceptable. Each of the per-N-column SAR ADCs can be completely powered down after the valid pixels in the N-column block have been converted. Note also that the ramp comparator within per-column SSADC capture circuit 653 may serve as the per-column sense amp/comparator for conditional-read overthreshold detection. Also, readout controller 691 and digital output logic/buffer 697 operate as generally described above in reference to FIG. 32, with modification to control time-multiplexed operations within SAR ADCs 695 (including sequencing of the SAR input multiplexers 692) and to support selective transfer into digital output logic/buffer from either SSADC or SAR ADC according to the SSADC result and/or analog CDS results. Additionally, a second sample and hold bank and attendant set of SHR and SHS control signals can be added in the embodiment of FIG. 35 to enable pipelined storage and readout of the high-signal values. The high-signal readout can then have pipelined storage of values for a given pixel row within the first sample and hold bank while the SAR ADC is converting signal values from a different pixel row that was previously stored in the second sample and hold bank.

Direct-Conversion Readout Architectures

In a number of embodiments described below, analog sample-and-hold circuitry is omitted for either low-signal readout path, the high-signal readout path or both, with the pixout signal instead being delivered to (and thus digitized by) the analog-to digital converter directly—an architecture and operation referred to herein as direct conversion. Said another way, the in-pixel signal driving element (e.g., source-follower transistor in the single-mode and dual-mode pixel architectures discussed above) drives the analog pixout signal to the input of the analog-to-digital converter for digitization, instead of a sample-and-hold element in which a sample of the pixout signal is stored. Direct conversion provides a number of advantages and challenges. For example, elimination of the sample-and-hold capacitor and access transistor saves die area, and simultaneously reduces KTC noise and pixout settling time (i.e., by removing a switch element and capacitive load from the signal output path). By contrast, the ADC conversion interval may exceed the sample-capture time of a sample-and-hold element and thus present noise rejection challenges. These and other considerations are accounted for in various different direct conversion architectures, a number of which may have advantages specific to particular applications.

Dual Direct Conversion and Single Direct Conversion

The bifurcated readout path techniques and architectures discussed above provide a number of direct conversion options. For example, both the low-signal and high-signal readout paths may be directly converted in an architecture/technique referred to herein as "dual direct conversion," or only one of those readout paths may be directly converted ("single direct conversion"), with the other subject to sample-and-hold prior to conversion—a hybrid combination of direct conversion and sample/hold conversion. Both the dual direct and single direct conversion architectures are described below in various embodiments which employ a single-slope ADC (SSADC). In all cases, other types of ADC circuits may be used (e.g., SAR, sigma-delta, etc.).

Single and dual direct conversion architectures and features thereof contemplated for use within image sensor embodiments herein include, for example and without limitation:

Digital CDS: separate ADC conversion of the reset-state and signal-state of a given pixel, with final CDS value generated by differencing (subtracting) in the digital domain;

Analog CDS: CDS differencing done in the analog domain prior to ADC conversion;

Gain amplifier included in low signal readout path, the high signal readout path or both, with options including:
  bypassing/disabling/omitting gain amplifier if post-source-follower noise is low enough to meet desired total read noise target;

bypassing/disabling/omitting gain amplifier if SSADC ramp sufficient to provide desired readout gain;

fixed gain amplifier (FGA) in the low signal readout path, no gain amplifier in high signal readout path;

programmable gain amplifier (PGA) in the low signal readout path, no gain amplifier in high signal readout path; and PGA in both the low signal and high signal readout paths and switched between respective amplification levels for low signal and high signal readouts;

TG-asserted direct conversion and/or sample-and-hold: digitization or sampling is completed (or at least commenced) prior to TG falling edge'

Post-TG direct conversion and/or sample-and-hold: digitization or sampling is commenced after TG falling edge;

Dynamically adjusted readout bandwidth: switching between low and high readout bandwidths (e.g., by switching the readout current source between high and low current levels) for the low-signal and high-signal readouts, respectively, thus achieving reduced noise in the low-signal readout, while providing faster settling for the high-signal readout;

Low-signal SSADC ramp time compression: non-uniform ramp step time (progressively shortening) for the low signal readout to reduce direct conversion time and thus shorten CDS time in proportion to signal level; and High-signal SSADC ramp time/step reduction: non-uniform ramp step size to reduce number of clocks/ramp-steps required to span high-signal range.

Timing diagrams shown in the following sections are based on single-mode 4-transistor (4T) pixel, though dual-mode 4T pixels and other pixel architectures may also be used.

Dual Direct Conversion Architectures:

In addition to the various options discussed above, dual-direct conversion architectures may have separate low-signal and high-signal ADCs, or ADC components, or may share an ADC. Embodiments of these variations are described below in the context of SSADC implementations. As discussed, other types of ADCs may be used in alternative embodiments.

Dual Direct Drive with Separate Low-Signal/High-Signal SSADCs

FIG. 36 illustrates an embodiment of a dual direct conversion image sensor 705 having separate (respective) ADCs for bifurcated low-signal and high-signal readout paths. As shown, image sensor 705 includes, together with readout circuitry 707 containing low-signal and high-signal ADCs 710-L and 710-H, a pixel array 631, row decoder/driver 635 and readout controller 711, all of which may be implemented/operated with the various options discussed above. Also, both the low-signal and high-signal ADCs are implemented by single-slope ADCs (SSADCs) in the example shown, with the low-signal SSADC 710-L being formed by a column-shared low-signal (LS) SSADC controller 651-L (having a counter and ramp generator) and per-column LS ADC capture blocks 653-L, which operate as discussed in reference to FIG. 32 above. The high-signal (HS) SSADC is similarly formed by column-shared HS SSADC controller 651-H and per-column HS ADC capture blocks 653-H. Successive approximation readout (SAR) ADCs, sigma-delta ADCs or any other practicable ADC structures may be used in place of either or both of the SSADCs in alternative embodiments. Readout circuitry 707 also includes digital output logic/buffer 714 which generally performs the functions of both the digital decision and write logic and write buffer described in reference to FIG. 32.

Still referring to FIG. 36, the separate low-signal and high-signal ADC arrangement tends to be particularly effective in applications that require fast row-readout times (i.e., when row time is a critical factor) as the dedicated ADC per readout path enables the different SSADC voltage ramps that may be required for high and low signal readout to be generated concurrently (i.e., at least partly overlapping in time) instead of sequentially. In a number of embodiments, for example, the low signal readout ramp is designed to provide a higher gain than the high signal readout ramp so that, without separate ADC ramp generators and SSADC capture circuits, more time consuming serial ramp generation would be needed.

FIG. 37 illustrates more detailed embodiments of low-signal ADC capture and high-signal ADC capture circuits that may be used to implement the low-signal and high-signal capture blocks 653-L and 653-H in FIG. 36. As shown, each ADC capture circuit includes an auto-zeroing comparator having a first input capacitively coupled (i.e., via C1 and C2, respectively) to the pixout line and a second input coupled to receive a respective one of the ramp voltages (i.e., Vramp_low, Vramp_hi) generated by the low-signal SSADC controller and high-signal SSADC controller.

Still referring to FIG. 37, which includes a simplified model of the pixout generation (i.e., row-select and other elements of a pixel are omitted for simplicity), a source-follower load-bias transistor 725 is biased to effect a source-follower operation within the pixel source-follower transistor ("Pixel SF"). That is, Vbias is set to establish, during a given readout operation, a constant load bias current flowing through the source follower transistor and load-bias transistor from Vdd-pix to ground (or Vss). This constant load current causes the voltage on pixout line to follow the voltage (VFD) on floating diffusion node (FD) by virtue of the relationship between the constant current through the source-follower transistor and its gate-to-source voltage. That is, source-terminal voltage (Vs) of the source-follower transistor follows (i.e., rises and falls with) the gate voltage as needed to maintain the constant load-bias current and thus, a higher or lower FD voltage will yield a correspondingly higher or lower pixout voltage.

As FIG. 37 shows, the pixout line is capacitively coupled (i.e., via capacitive elements C1 and C2) to the inputs of the comparators 727-L and 727-H within the low-signal and high-signal ADC capture blocks 653-L and 653-H, respectively (note that latch and trip bit storage elements of the capture blocks are not shown in FIG. 37). This arrangement enables each comparator to be "zeroed" or auto-zeroed at the FD reset-state level and thus effects a correlated double-sample of the reset-state and signal state of the FD. More specifically, as shown in the exemplary timing diagram of FIG. 38, after the floating diffusion node (FD) has been reset and thus readied for photocharge transfer (i.e., after RG falls), the reset-state of the floating diffusion node is driven onto the pixout line (i.e., by virtue of a row select signal which enables a selected pixel within the pixel column to drive that shared column line). Referring first to the low-signal ADC capture block 653-L (both capture blocks operate identically in the embodiment shown, though the low- and high-signal voltage ramps may be different), because the capacitive coupling formed by C1 isolates (and thus floats) the signal input to comparator 727-L, that floating input rises to a potential corresponding to the reset-state signal on the pixout line. Consequently, when auto-zeroed by switchably coupling the comparator output node to the comparator signal input and then decoupling the comparator output from the signal input (i.e., illustrated conceptually by "az" switch), the signal input is driven to a starting level that accounts for the reset-state potential on the pixout line. Shortly after the auto-zero event, which effectively establishes a reset-state offset at the comparator's signal input, TG is raised to enable photocharge transfer from the photodiode to floating diffusion, thereby driving pixout according to the floating diffusion signal-state. As shown, feedthrough compensation (illustrated generically by "$TGN_{ULL}$", which may include any one or combination of the various feedthrough compensation signals/techniques described above) is provided to cancel (or negate, mitigate or otherwise compensate for) TG feedthrough so that, at least in the case of a low-signal, the pixout line will quickly settle to the signal-state potential. Accordingly, the signal input of the comparator will transition according to the FD signal-state (as conveyed on pixout), offset by the autozero operation to reflect the prior reset-state potential—in effect presenting a reset-state-adjusted signal-state level at the comparator input and thus a correlated double sample of the FD reset-state and signal-state. While pixout is actively driven by the source follower signal (i.e., to establish the CDS signal level at the comparator input), the ramp input to the low-signal comparator is ramped through the low-signal voltage range as shown by the "Vramp_low" waveform, thus triggering a comparator trip at a ramp voltage point corresponding to the CDS signal level at the comparator input if the CDS signal level does in fact fall within the low signal range. Accordingly, as FIG. 38 shows, CDS time is proportional to signal amplitude (i.e., trip point may occur anywhere along low-signal and high-signal ramp) and commences with the falling edge of the autozero pulse (az). Note that trip bit and DN capture circuitry is not shown within the low-signal and high-signal ADC capture blocks in FIG. 37, but may generally operate as discussed above in reference to FIG. 32.

Still referring to FIGS. 37 and 38, because separate SSADC controllers and capture blocks are provided for the low-signal and high-signal readout paths, the high-signal ADC operation may be performed in parallel with the low-signal ADC operation, a circumstance illustrated by the parallel commencement of the high-signal and low-signal ramps in FIG. 38. Because the pixout settling time will generally be longer for a larger (brighter-light) signal and the large-signal range may generally span a wider voltage range, the high-signal ramp voltage may proceed at a different ramp rate and span a broader voltage range than the low-signal voltage ramp and thus continue after the low-signal ramp has concluded. Note also that positive voltage ramps are shown for purposes of explanation only. Without inversion in the read signal path, readout signal polarity will be negative (i.e., more negative to indicate more photocharge) so that the voltage ramps may also have a negative polarity, monotonically decreasing from a higher starting voltage to a lower ending voltage.

In the embodiment of FIG. 38, Vramp_low is ramped as rapidly as possible with the desired voltage step size in order to achieve a short CDS time. Vramp_low ends at voltage level that is designed to cover the low signal swing only (i.e., anticipated range of a low signal). Additionally, when designing for a below-single-electron read noise system, it may be desirable to quantize the low signal readout to less than 1 electron per data number (DN) increment. For example, a quantization of 0.25 electrons per DN step is implemented in a number of embodiments to yield a ramp step less than a single-electron signal produced at the SF output. Larger or smaller quantization steps may be applied in other embodiments. Conversion time will vary according to the amplitude of the low signal—that is, a valid conversion will occur sooner for a lower-amplitude signal and later for a larger-amplitude signal so that the CDS time and attendant noise reduction factor is a function of signal level. Next, after a desired amount of time to allow for a larger signal to transfer and settle, Vramp_hi begins for the high signal readout (i.e., despite the simultaneity shown, large-signal ramp commencement may occur later than low-signal ramp commencement). Vramp_hi ramps at a desired rate and count for the targeted row time and gain, and ends at a voltage level that is designed to cover the full-well signal of the pixel. TG then goes low to conclude the row readout.

Returning briefly to the embodiment of FIG. 37, it can be seen that no gain amplifier is disposed within either of the low-signal or high-signal readout paths. This may be acceptable in cases where the low-signal and high-signal ADCs yield the desired gain (i.e., in terms of step per photocharge carrier). In other embodiments, some of which are discussed below, separate or shared fixed-gain or programmable-gain amplifiers can be added to the low-signal readout path and/or high-signal readout path.

FIG. 39 illustrates an alternative embodiment of a dual direct conversion image sensor 740 implemented generally as shown in FIG. 36, except that the ADC circuitry 743 includes only one SSADC controller 651 (i.e., a single ramp generator and a single step count generator), with separate low-signal and high-signal capture blocks 653-L and 653-H. Readout controller 741 and digital output logic/buffer 745 are modified to reflect the alternative ADC configuration—a configuration that reduces die-area consumption and power consumption at the cost of somewhat increased row time (i.e., as sequential rather parallel ADC ramps are generated for the low-signal and high-signal ranges).

As can be seen in the exemplary low-signal and high-signal capture block embodiments 653-L/653-H shown in FIG. 40 (and in which DN latch and trip-bit storage are not specifically shown), capture block comparators 727-L and 727-H are capacitively coupled to the pixout line (i.e., via C1 and C2, respectively) and thus enable auto-zero-based CDS conversion as discussed above in reference to FIGS. 36-38. FIG. 41 illustrates an exemplary high-level timing diagram corresponding to operation within ADC capture blocks 653-L and 653-H of image sensor 740. As shown, both capture-block comparators auto-zero during reset of the pixel (i.e., while RG is high). After RG goes low, TG is switched on (enabling photocharge transfer from photodiode to floating diffusion) and Vramp starts for low signal path after a brief, predetermined time interval long enough for a signal within the low-signal range to settle on the floating diffusion node and pixout line. In a number of embodiments, Vramp is ramped as rapidly as possible to achieve a short CDS time, but without compromising the desired voltage step size. As shown, Vramp for the low-signal range ends at a predetermined voltage level (i.e., yielding a ramp profile designed to cover the low-signal range) and is then restored to a starting point in preparation for a high-signal ramp. A valid low-signal conversion may occur at any point along the voltage ramp, depending on the low-signal readout level, and thus will occur sooner (and yield a correspondingly shorter CDS time) as signal level (and thus luminance) drops. Thus, CDS time and attendant noise rejection is a function of signal level and thus integrated photocharge.

Still referring to FIG. 41, after a predetermined time designed to ensure full-well large-signal settling prior to high-signal ADC capture, Vramp starts again for the high signal readout. Note that, though not specifically shown, the high-signal Vramp may start above the "zero" level to avoid re-spanning the low-signal range and thus reduce the number of high-signal ramp steps. For example, in a number of embodiments (including those for other ADC arrangements), the high-signal Vramp begins at a level just below the upper level of the low-signal Vramp (i.e., to avoid any gaps in the overall span of the two ramp ranges). In any case, Vramp proceeds at a predetermined or programmable rate and count for the targeted row time and gain. As discussed below, the duration and amplitude of voltage steps may vary across the low-signal ramp range, high-signal ramp range or both (e.g., progressively shorter and/or larger voltage steps, including piecewise linear and/or curve-fit profiles). As in the embodiment of FIG. 36, a separate fixed or programmable gain amplifier can be added to the low-signal or high-signal readout paths, and the low-signal readout may be quantized to less than 1 electron per DN step (e.g., 0.25 electrons per DN step).

Dual Readout Path Valid Signal Determination and Selection:

In general, for the dual ADC embodiment of FIG. 36 and other architectures where the low and high signal conversions occur in parallel, it is not necessary to complete both analog-to-digital conversions per pixel readout operation. For example, if a valid digital conversion is obtained via the low-signal readout path before the high-signal conversion is complete, the analog-to-digital conversion operation for the high signal readout can be aborted (i.e., stopped prior to completion). Similarly, for the shared-ADC-controller embodiment of FIG. 39 and other architectures that execute the low and high signal conversions serially (i.e., one after the other), the high signal conversion can be skipped/omitted altogether (i.e., inhibited from initiating) or aborted at an early stage of the conversion operation. Techniques for signaling or determining that high-signal conversion can or should be aborted/inhibited and/or effecting the abort/inhibit include for example and without limitation:

- Recording the status/result of the low signal readout in a per column latch (i.e., trip bit storage as discussed above).
- Writing a known value to the ADC output latch signifying that the high-signal conversion should be aborted or skipped (e.g., encoding the trip bit value within the ADC output value).
- Explicitly and selectively enabling the high signal conversion process to start (e.g., high-signal-conversion start signal is conditionally asserted)
- Inferring that high-signal conversion should be aborted or skipped based on contents of the ADC output latch (e.g., knowing that a DN value less than a specified value must have come from the low signal readout, high-signal conversion may be selectively enabled/disabled according to whether the DN value resulting from low-signal conversion is within or outside, respectively, a predetermined or programmed range of DN values)

As explained above, analog-to-digital (A/D) conversion of the low-signal readout path terminates in a number of embodiments, with two possible outcomes: (i) a successful conversion in which the comparator trips and latches the attendant counter value as the conversion result, or (ii) no conversion—the comparator does not trip and no conversion result is captured. As discussed above, a single trip bit can be used to record the trip/no-trip result to indicate whether the low signal path had a valid conversion for a given pixel column. This bit can be used to control (i.e., enable or disable) the conversion process for the high signal readout. For example the high signal conversion process can be aborted or inhibited according to the state of the trip/no-trip bit resulting from the low-signal conversion, thus saving power and abbreviating the overall readout operation. After the low signal path is converted, the latched counter values are transferred into the digital line buffer from the SSADC latches. If the comparator has not tripped, (i.e. a non-valid conversion result), a value of zero is transferred into the digital line buffer, or alternately the write is inhibited to save power.

In the no-conversion case, where the comparator has not tripped, the high signal conversion process either continues or is initiated/enabled. At the end of the A/D conversion for the high signal readout, using the digital decision and write logic block (i.e., logic within the digital output logic/buffer components of the image sensors shown in FIGS. 36 and 39 and other embodiments described below), the latched count value in the A/D converter is transferred and stored in the digital line buffer. The same valid conversion bit for the low signal conversions may be used to indicate to the post ADC correction logic (e.g. FPN correction) which readout path sourced the digital data (i.e., low-signal conversion or high-signal conversion). Other techniques can also be employed to identify which readout path was used to generate the digital conversion data for a respective pixel, and, if necessary or desirable, scale the digital conversion data (e.g., to account for applied gain).

In one embodiment, readout of the digital values from the digital output logic/buffer (also referred to herein as the "line buffer") initiates after A/D conversion of the second S/H bank is complete and the appropriate values are written into the digital line buffer. In embodiments in which both the low-signal and high-signal conversions are performed sequentially by a shared ADC, less correction and calibration may be required to match the output responses of the low-signal and high-signal readout paths for CDS results that fall within the signal band between the low-signal and high-signal output ranges (i.e., near the signal level corresponding to the upper photocharge threshold for the low-signal readout path).

In a number of embodiments, including those shown in FIGS. 36 and 39, the image sensor will output, from digital output logic/buffer, one digital value per pixel that will be properly scaled and transmitted according to which of the low-signal and high-signal readout paths sourced the finalized data (and optionally including information that indicates the source readout path). For example a finalized digital CDS value sourced by a low-signal readout path that provides a higher-gain readout than the high-signal readout path, that digital value (DN) may be scaled for consistency with (e.g., to yield uniform gain with) high-signal readout path results. Column FPN correction values can also be collected and applied appropriately given knowledge of which readout the valid data was obtained from.

FIG. 42 illustrates another embodiment of a dual direct conversion image sensor 760, in this case having low-signal/high-signal bifurcated readout path circuitry 762 with a shared SSADC 653 as in FIG. 32 (i.e., "completely shared" SSADC with a single SSADC controller 651 and bank of per-column capture blocks 653) and also a source-follower (SF) bias multiplexer bank 765 that enables different load bias currents to be applied to the per-column pixout lines during low-signal and high-signal readout. Image sensor 760 also includes a readout controller 761, row decoder/driver 635, and pixel array 631 that may be implemented with the various options presented above, and in which readout controller 761 is designed to issue a high/low bias-select signal ("H/L Sel") to SF bias multiplexer bank 765. In addition to the SF bias multiplexer bank and SSADC circuitry 650, readout circuitry 762 includes digital output logic/buffer 766, which generally performs the functions of decision/write logic 655 and digital output buffer 657 shown in FIG. 32.

Continuing with FIG. 42, source-follower bias multiplexer bank 765 enables selection of different load-bias points and thus different readout bandwidths during low-signal and high-signal readout. FIG. 43 illustrates an embodiment of a per-column bias multiplexer 770 that may be implemented within the bias multiplexer bank of FIG. 42 in connection with a shared low-signal/high-signal ADC capture block 653 ("LS/HS ADC Capture"). In the implementation shown, bias multiplexer includes a bias-voltage multiplexer 771 (or other selection element) that selects between high and low load bias voltages ("vbh" and "vbl"), applying one or the other to load-bias transistor 725 (i.e., as "Vbias") in accordance with a high/low bandwidth select signal (H/L Sel) from readout controller 761. By this arrangement, a relatively high current or a relatively low current may be selectively established on the pixout line (i.e., "high" or "low" source follower current according to the bandwidth select signal), thus effecting selection between relatively fast-settling (high-bandwidth), higher-noise pixout signal generation and relatively slow-settling (low-bandwidth), lower-noise pixout signal generation. Comparator 661, capacitive coupling through C1 and auto-zero switch element (i.e., responsive to auto-zero signal, "az") operate generally as discussed above. As further explained below, the high/low bandwidth selection may be leveraged in the embodiment of FIG. 42 and others to yield low-noise, low-bandwidth pixout readout in combination with linear or nonlinear low-signal readout voltage ramp (note that analog gain may be implemented in whole or part via the SSADC voltage ramp), with pixout conversion occurring before or after the falling edge of the TG pulse.

Low Bandwidth (BW) for Low Signal Readout Path:

As discussed, capturing (or converting) a CDS value for the low-signal readout path prior to the falling edge of TG may enable a very brief CDS time (i.e., by not requiring the elapsed time of a full TG pulse—especially for large arrays where the rise and fall time of TG pulses are longer). The residual TG feedthrough, however, will more likely be a FPN component in the low signal readout path as discussed, for example, with respect to FIGS. 31A and 31B.

The selectable load-bias image sensor of FIG. 42 enables alternative readout strategies in which post-TG-pulse (i.e., after TG falling edge) CDS capture or direct CDS conversion are executed in both or either of the low-signal and high-signal readout paths, while retaining brief (low-noise) low-signal CDS times. FIGS. 44 and 45 illustrate an exemplary timing diagram and flow diagram for such a switched-bias readout approach that leverages the image sensor and bias multiplexer embodiments shown in FIGS. 42 and 43.

Starting with FIG. 44, the low signal path CDS and ADC conversion begins after the falling edge of a first TG pulse. The length of this TG pulse is designed to transfer, from photodiode to floating diffusion node, any amount of photocharge up to a predetermined maximum level of the low-signal range. After completion of the first TG pulse, low-signal conversion starts and completes. During this time the Vbias voltage is set to the relatively low level, "vbl," so that the source follower (SF) current (or bias current or load-bias current) is set to a desired lower value. After completion of the low-signal conversion, TG is pulsed a second, potentially longer time to enable any accumulated photocharge above the predetermined maximum for the low-signal range to be transferred to the floating diffusion node. At substantially the same time, Vbias is raised to "vbh" (i.e., by transitioning multiplexer control signal, H/L Sel) to raise the bandwidth of the source-follower output and thus enable more rapid pixout settling for any high-signal level that may be present on the floating diffusion node. After a predetermined high-signal settling time delay, Vramp is sequenced through the high-signal range to complete a high-signal A/D conversion. In the embodiment of FIG. 44, Vbias goes low a predetermined time before the high-signal Vramp commences to avoid a DC offset between the low-signal and high-signal outputs.

Reflecting on FIGS. 42-44, reasons for/benefits of modulating the source follower bias current (i.e., raising and lowering Vbias at different times within a pixel readout) include, without limitation:

- For a conventionally designed sensor with bandwidth designed to readout full signals at reasonable speeds, a CDS time of 50 ns-100 ns may be required to get substantial noise reduction.
- 100 ns CDS time is difficult to achieve with the requirement to convert the signal given a full TG pulse width to transfer signal charge.
- Because noise is reduced by narrowing the CDS bandpass and the bandpass width is itself a function of $\omega_c * \Delta T$ (i.e., product of source follower corner frequency and CDS time), a sufficiently small $\omega_c * \Delta T$, (i.e. less than 2 tau) may be achieved by having a lower bandwidth ($\omega_c$) readout for a conventional TG pulse width and attendant CDS time.
- Reducing bandwidth of the low signal readout path will limit the signal swing for any given readout time, but that is Ok since we are reading out a very small signal, (10e-20e, stopping where the signal is photon shot noise limited).
- Low-signal readout bandwidth may be reduced in various different ways including, for example and without limitation, reducing source-follower bias current, increasing pixout capacitance (e.g., switchably/dynamically coupling a capacitive element to pixout to reduce readout bandwidth), or a combination of both.
- With this approach, source-follower current may be reduced to 0.5 uA and a tau of 0.69 may be obtained (70% 1/f noise reduction) for a CDS time of 133 ns, (instead of 30 ns if the SF bias current were 10 uA).
- This also enables design of a lower bandwidth FGA if one is needed, (this is discussed in a later section), which further provides lower power and lower noise.
- One can increase the current for subsequent SSADC clocks in the readout of progressively higher signals for the low-signal readout phase so that the low signal readout does not add too much row time.

FIG. 45 illustrates an exemplary readout operation with respect to the architecture shown in FIGS. 42 and 43 and timing diagram of FIG. 44 (note that the timing diagram of FIG. 44 is a high level diagram illustrating the timing and operation and is not a detailed to-scale timing diagram and also that bandwidth switching may be achieved using various techniques other than or in combination with the source-follower bias current approach shown). Starting at 781, the SF bias current is set to a first desired high value, providing a higher readout bandwidth (i.e., faster pixout settling). The pixel is reset at 782 (i.e., RG pulse applied) and then, a predetermined time after the falling edge of RG, the SF bias current is set to the lower value at 783, establishing a lower, less noise-responsive readout circuit bandwidth in preparation for low-signal readout. In the direct conversion embodiments of FIGS. 42 and 43, the auto-zero signal, az, may be raised concurrently with RG assertion, but in any case goes low at 784 (shortly after the falling RG edge) to autozero the SSADC comparator and thus enable direct CDS conversion. Note also that the falling edge of RG can optionally be compensated to reduce feedthrough and improve settling time.

Continuing with FIG. 45, after the auto-zero signal goes low, TG and TGnull signals are pulsed with opposite polarity at 785 to effect feedthrough-compensated transfer charge from the photodiode to the floating diffusion node. In the embodiment shown, the length of this initial, "short" TG pulse is designed to enable transfer of a predetermined amount photocharge just above the maximum photocharge level for the signal range allocated to the low signal path, but significantly less than a full-well level of photocharge. After completion of the first TG pulse conversion of the low signal starts and completes as shown at 786 and by the low-signal Vramp profile in FIG. 44. During this time the Vbias remains at a low value.

Figure 46:
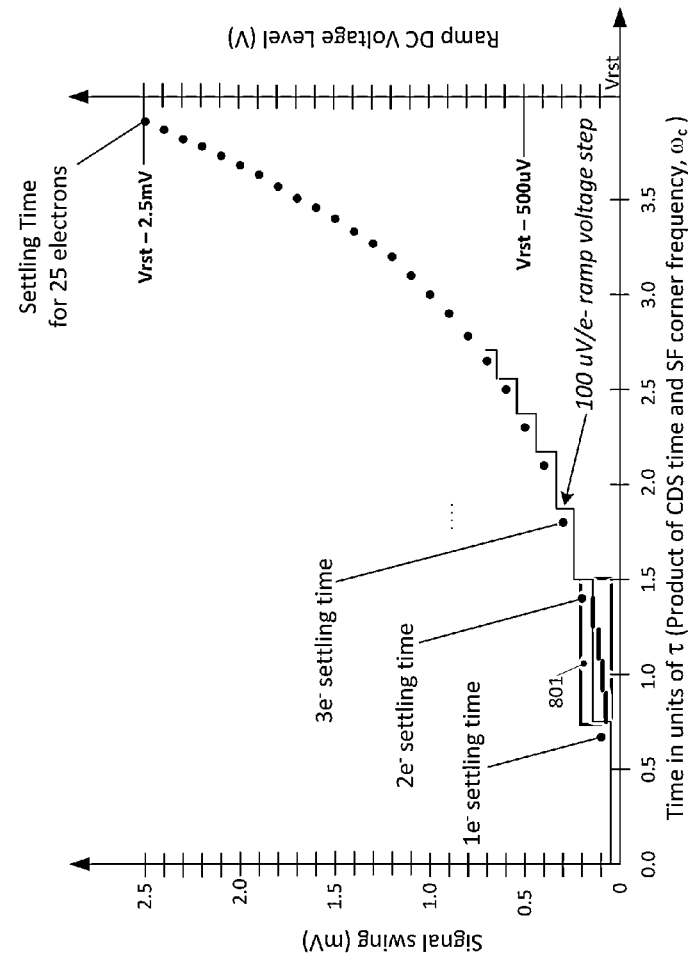
FIG. 46 illustrates an example of a non-linear low-signal voltage ramp that may be implemented within the embodiment of FIG. 42.

The SSADC low-signal ramp may be a linear or non-linear ramp designed in either case to span a predetermined low-signal range. An implementation of one of many possible non-linear low-signal voltage ramps is shown in FIG. 46, which illustrates an exemplary plot showing ramp voltage steps vs. time, with the time axis being marked in units of $\tau$ (i.e., the product of CDS time and source-follower corner frequency, $\omega c$). For example, if $\omega_c$ is 10 MHz, then a CDS time of 100 ns corresponds to a duration of $1.0 \tau$ on the x-axis.

The exemplary ramp shown in FIG. 46 is an accelerated ramp that starts at a ramp rate or ramp step time that is slower than a conventional ramp at the start and becomes progressively faster (i.e., progressively shorter time between successive voltage steps). This permits, for example, the shortest possible CDS time (or at least a progressively shortened time) at each signal level. The CDS time is the time from falling edge of SHR to the valid conversion of signal, wherever that may occur (if at all) along the low-signal ramp range.

The settling time for one electron ("1e") of signal is less than that for two electrons, which is less than three, etc. By designing a ramp that follows the settling time of the signal, (i.e. the ramp reaches the desired specified target signal level just after the signal line can settle to that value), a CDS time proportional to signal level may be achieved that has the nominally shortest CDS time for each signal level, (i.e. there is no delay to wait for start of the ramp due to settling of a $20e^-$ signal). Assuming, for example, that the conversion gain from floating diffusion node to source-follower output is 100 $\mu V/e^-$, the nominal pixout settling time for a $1e^-$ FD charge level and thus a 100 $\mu V$ pixout signal is $0.693\tau$. The nominal settling time for a $2e^-$ FD charge level (i.e. 200 $\mu V$ output signal) is $1.386\tau$, the nominal setting time for a $3e^-$ FD charge level (300 $\mu V$ output signal) is $1.791\tau$, the nominal settling time for a $4e^-$ FD charge level (400 $\mu V$ output signal) is $2.079\tau$, and so forth.

In embodiments or operating modes in which sub-electron quantization is desired, the low-signal readout ramp step can be set to sub-100 $\mu V$ increments. For example, the four 25 $\mu V$ steps at 801, a ramp resolution which could be implemented across the entire low-signal range or in any portion thereof, could be implemented instead of the single 100 $\mu V$ step to provide an approximate quantization of $0.25e^-/DN$.

As mentioned above, if the SSADC comparator trips during the low-signal readout for a particular column (affirmative result in decision 787), ADC conversion of that pixel column is deemed complete and high-signal readout path conversion for that pixel column is unnecessary (and thus may be skipped). If the comparator does not trip during the low signal conversion attempt (negative decision at 787), the counter and ramp generator are paused (held) as shown at 788, the SF bias current is switched to a high value at 789 (i.e., shifting the DC value of the pixel output signal towards ground and away from Vdd and thus in a direction away from the ramp value so the comparator will not trip during the bias change) and, at approximately the same time as the bias current change, TG and TGnull are pulsed a second time at 790, with pulse-widths long enough to transfer a full-well photocharge from the photodiode to floating diffusion node. At the high source-follower bias level, the column output line will settle more quickly to the signal value, thereby avoiding extended settling time that may otherwise be required for the high-signal photocharge range. After delaying at 791 for a time sufficient for pixout settling follow a photocharge transfer in an amount up to the photodiode full-well level (and for settling with respect to any residual feedthrough, which will be small compared to the signal level), the SF bias current is switched back to the low-bandwidth, low-noise setting at 792, thus restoring the high signal DC level to a point where the conversion is valid with respect to the low SF bias reset level. A predetermined time after switching back to the low source-follower bias, the ramp and counter are restarted at 793 and ADC conversion of the high signal readout proceeds to completion, thus finishing A/D conversion of the pixel output. Note that the ramp for the high-signal conversion may start at a point just below the range of the low signal readout to avoid redundant ramp steps or, alternatively, may simply start at "zero." As with the low-signal voltage ramp, the ADC ramp for the high signal conversion may be linear or non-linear in either step duration or step size (voltage per step) at all or any part of the large-signal ramp range. Also, the large-signal ADC ramp may also start sooner than shown in FIG. 44 and follow the signal settling as described for the low-signal readout. Further, a single TG pulse may be generated instead of the two shown in FIG. 44 if, for example, a full-well charge can be transferred in a TG pulse width that is consistent with achieving the desired short CDS time for the low signal readout.

Digital CDS

Figure 47A:
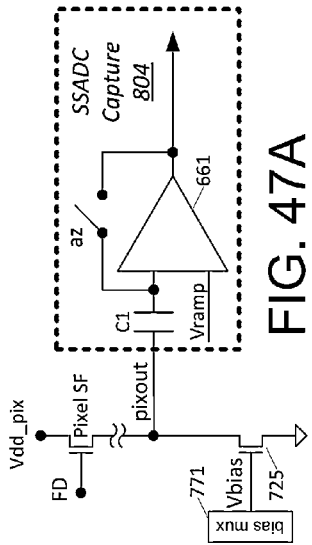
FIGS. 47A and 47B illustrate an alternative SSADC capture block and operational sequence that may be employed within the image sensor of FIG. 42.
Figure 47B:
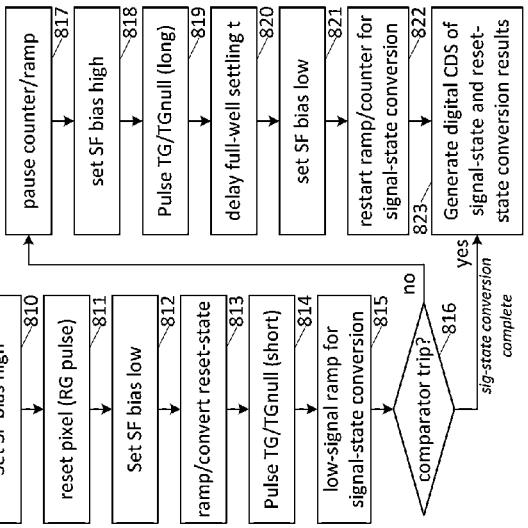

FIGS. 47A and 47B illustrate an alternative SSADC capture block 804 and operational sequence that may be employed within the image sensor of FIG. 42. As shown, SSADC capture block is identical to the capture block shown in FIG. 43, except that digital CDS is performed. FIG. 47B illustrates an exemplary operational sequence at 809-823 that may be employed to effect a digital CDS readout using the SSADC capture block—an operational sequence similar to that of FIG. 45 (i.e., an analog CDS sequence) with modification for comparator reset and analog-to-digital conversion of the floating diffusion reset-state.

Figure 48:
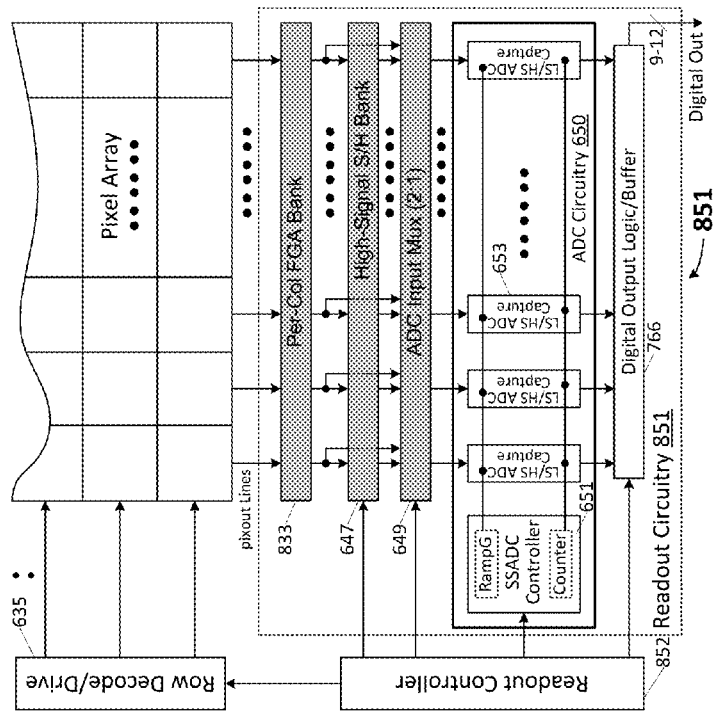
FIG. 48 illustrates an alternative image sensor embodiment in which a fixed-gain amplifier (FGA) bank is provided within readout circuitry to implement a pixout signal gain uniformly in the low-signal and high-signal readout paths.

A number of exemplary embodiments discussed above achieve a desired low-signal readout gain through design of the low-signal SSADC ramp (i.e., yielding a desired step/photocharge resolution). FIG. 48 illustrates an alternative image sensor embodiment 830 in which a fixed-gain amplifier (FGA) bank 833 is provided within readout circuitry 831 to implement a pixout signal gain uniformly in the low-signal and high-signal readout paths. Any additional gain required or desired in the low-signal readout path may be provided by the low-signal SSADC ramp. The fixed gain value is generally set (e.g., through design, calibration and/or programming) to avoid saturating the high-signal readout at full-well and to provide a desired resolution in the low-signal readout (e.g., at or below $0.25e^-$ per DN increment). The FGA value is also chosen to reduce input-referred noise of ADC circuitry 650 and other analog circuits in the readout path after the pixel source follower to a level where the total sensor temporal readout noise approaches the pixel source follower read noise. In alternative embodiments, a programmable gain amplifier (PGA) could be used to supply the gain required for both the low signal and higher signal readout paths, being switched between gain levels accordingly. The image sensor embodiments disclosed herein may, for example, be configurable for either bifurcated low-signal/high-signal readout or for a more conventional single-path readout mode (i.e., no oversampled FD within a given pixel readout operation). In such embodiments, a PGA may be provided to enable the single-path readout mode, so that, leveraging that same PGA to effect different low-signal/high-signal readout path gains in the bifurcated readout mode would consume little or no additional die area. Remaining circuit blocks within image sensor 830 are implemented generally as discussed above, with readout controller 832 modified to generate or output fixed or programmable gain amplifier control signals (e.g., bias, reset, etc.)

Figure 49:
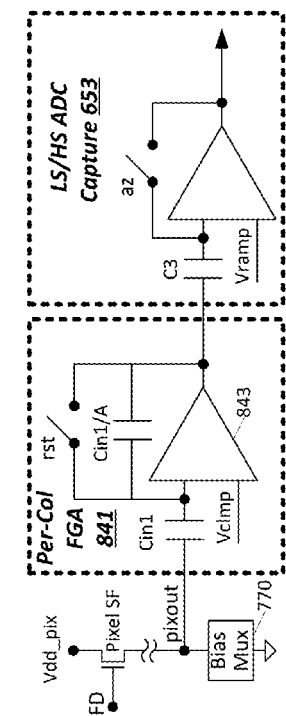
FIG. 49 illustrates an embodiment of a per-column FGA that may be used to implement the FGA bank shown in FIG. 48.

FIG. 49 illustrates an embodiment of a per-column FGA 841 that may be used to implement FGA bank 833 and its interconnection between a bias multiplexer 770 and SSADC capture block 653, both of which may be implemented generally as described above. The FGA is a switched capacitor amplifier. The fixed voltage gain is A and is determined by the ratio of the input capacitor Cin1 and the feedback capacitor Cin1/A. The rst switch is used for putting the FGA into an initial state after completion of a sample measurement to start the next sample measurement. Vclmp is reference voltage to control the bias point of the fixed gain amplifier and serve as a reference for the differential measurement. VLL Ramp for High Signal Conversion:

Although high-signal A/D conversion has generally been described in terms of linear-ramp SSADC (e.g. 4096 counts and corresponding uniform ramp voltage steps for a linear ramp 12 bit converter), a virtually-lossless lookup (VLL) ramp having nonlinear voltage step increases across at least part of the ramp range may be employed in alternative embodiments or operating modes to reduce the number of high-signal ramp steps, thus saving time and compressing the output data size. In one embodiment, for example, a 9-bit (512-step) VLL ramp spans the same high-signal voltage range as a 12-bit (4096 step) linear ramp, thereby reducing the number of ramp steps by 8× and reducing output bit depth by three bits. Continuing the example, an SSADC that generates a 512-step VLL ramp (which may be applied with respect to direct or S/H high-signal conversion without loss of image quality) following a 200-step low-signal ramp, will require a mere 712 clocks in total to complete the bifurcated low-signal/high-signal conversions; a more than 5× conversion time reduction compared to a 12-bit linear ramp readout from a single readout path. When the low-signal bank conversion is hidden under the high-signal conversion (i.e., parallel low-signal and high-signal conversion operations), the effective conversion time reduction grows to 8× over a 12-bit linear ramp, single-readout approach.

Single Direct Conversion Architecture for Low Noise Readout:

In a number of embodiments a hybrid direct-conversion/sampled-hold-conversion is implemented with, for example, direct conversion in the low-signal readout path and sample-and-hold conversion (i.e., inclusion of a S/H bank) in the high-signal readout path. These hybrid embodiments enable row-time reduction by virtue of rapid direct-conversion low-signal readout in combination with row-pipelined readout in the high-signal path ((i.e. ADC conversion of the high signal for one row occurs in temporally overlapped manner with storage of the high signal of another row). Also, the high-signal path sample-and-hold bank enables application of a low-signal path FGA (or PGA) that might otherwise saturate the high-signal path reset-state or signal-state readouts.

Figure 50:
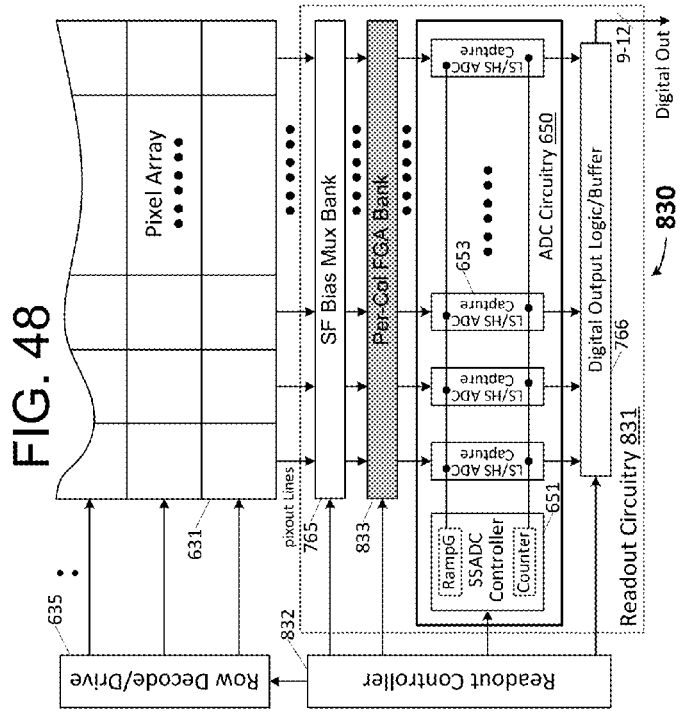
FIG. 50 illustrates an embodiment of a single direct conversion, bifurcated-readout path image sensor.

FIG. 50 illustrates an embodiment of a single direct conversion, bifurcated-readout path image sensor 50 having the optional readout path architectures shown for example in FIGS. 51A and 51B. Note that not all readout path details are shown in FIGS. 51A and 51B. For example, differential amplifiers may be provided to perform analog CDS operations (i.e., subtracting the reset-state sample from the signal-state sample in the analog domain).

Referring to FIGS. 50 and 51A, the low noise, low-signal signal readout path includes per-column Fixed Gain Amplifier (FGA) 860, while the high-signal readout path bypasses the FGA and is connected to a Sample and Hold (S/H) bank 862 for storage of the reset-state and signal-state samples during readout. The low-signal output of FGA 860 and the high-signal output of S/H bank 862 are supplied, via ADC input multiplexer 864, to per-column SSADC capture block 653, which sequentially converts the low-signal and high-signal analog inputs. Readout controller 832, pixel array 631, row decoder/driver 635 and digital output logic/buffer 766 may be implemented generally as described above, with modification to the readout controller 832 to manage the hybrid direct-conversion/sample-hold readout operations.

FIG. 51B illustrates an alternative embodiment of a low-signal readout path that may be implemented within the image sensor of FIG. 50. As shown, the embodiment of FIG. 51B includes a per-column multiplexer 860, high-signal S/H bank 863, ADC input multiplexer 865 and per-column ADC capture block 653, all of which operate similarly to counterpart elements shown in FIG. 51A, except that a single capacitive element (Cr/Cs) and access transistor are provided to sequentially capture samples of the floating diffusion node reset state and signal state. ADC input multiplexer 865 is modified (relative to counterpart 84 in FIG. 51A) to receive the signal-state and reset-state samples sequentially (instead of in parallel or differentially) and to forward each to the per-column ADC capture block 653. In one embodiment, the SSADC controller (e.g., element 651 of FIG. 50) is managed by readout controller 832 such that separate reset-state and signal-state conversions are performed (i.e., as those analog signals are delivered one after the other to SSACD capture block 653 via multiplexer 865), thereby permitting completion of the high-signal path CDS result in the digital domain.

Figure 51C:
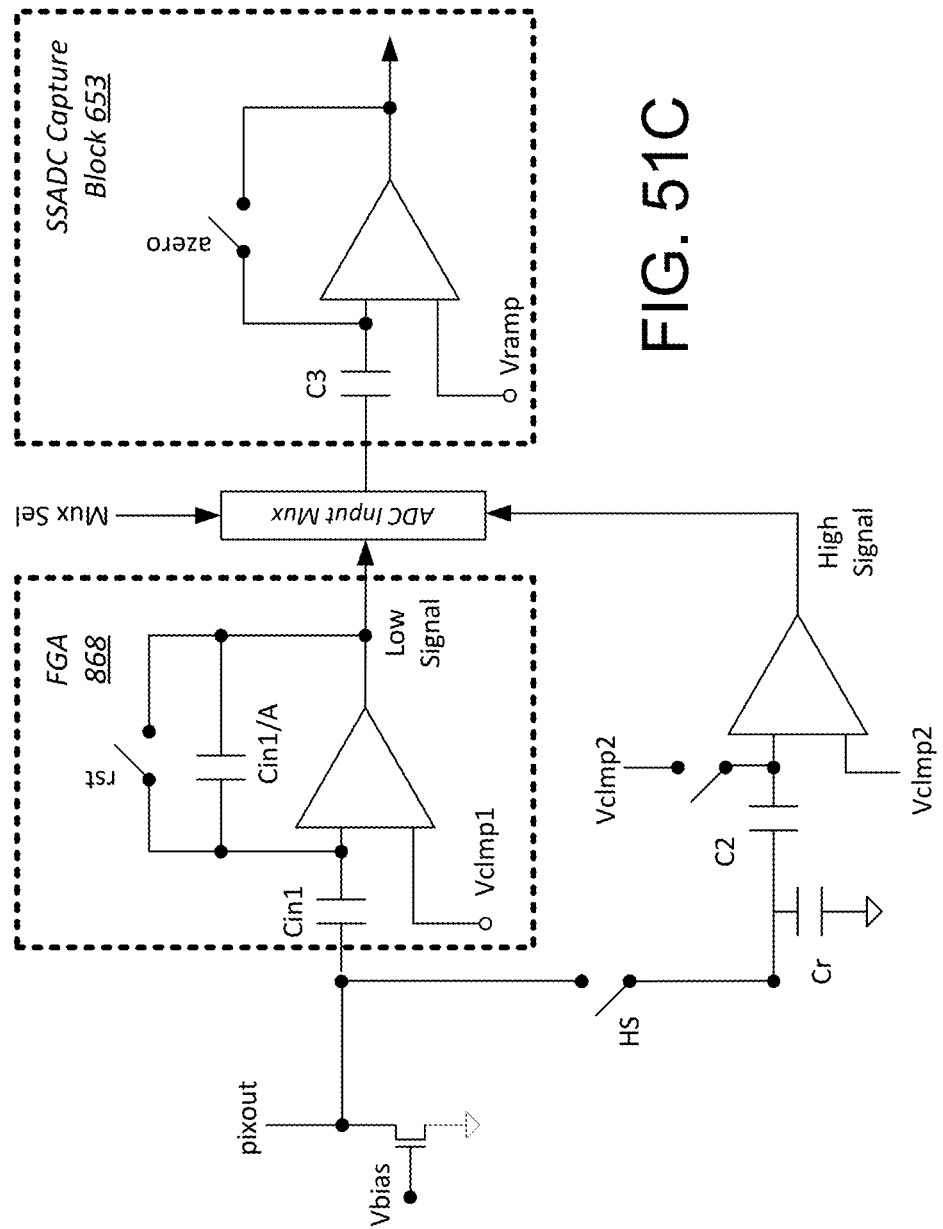
FIG. 51C illustrates a more detailed embodiment of a bifurcated low-signal and high-signal readout path arrangement that may be implemented within the image sensor of FIG. 50.

FIG. 51C illustrates a more detailed embodiment of the bifurcated low-signal and high-signal readout paths, showing an exemplary unity-gain FGA implementation 868 in the low-signal readout path.

In each of the embodiments shown in FIGS. 51A-51C, the low-signal path gain amplifier (860, 864) is implemented by a fixed gain amplifier (FGA) with the gain value set in conjunction with the SSADC reference ramp generator to provide less than or equal to 0.25 electrons per digital number (DN) increment. The FGA is provided in the low-signal readout path only so that gain-switching between low-signal and high-signal readout paths is not required (in contrast to the alternating gains likely applied to low-signal and high-signal readout paths by a programmable gain amplifier (PGA) disposed in both readout paths). Since the gain amplifier is a FGA and not a PGA, fewer capacitors are required and the gain amplifier can be made smaller than that required for a PGA. In addition, since the FGA will generally be applied to a very small signal range, (e.g., pixout signal range corresponding to 0-to-30 electrons), a relatively simple, low bandwidth (and small footprint) FGA may be used (e.g., as shown at 868 in FIG. 51C). In particular, non-switched-capacitor amplifier designs can be used with reduced component count in order to reduce die area consumption and so that, overall, the bandwidth, noise and power consumption of the FGA can be reduced compared to that of a row-rate switchable PGA. The FGA value is also chosen to reduce the input-referred noise of the ADC and other analog circuits in the readout path after the pixel source follower to a level where the total sensor temporal readout noise approaches the pixel source follower read noise.

In the embodiments of FIGS. 50 and 51A-51C, analog gain may be omitted from the high-signal readout path in view of the larger, photon-shot-noise-dominated signal, with any readout gain instead provided during A/D conversion (e.g., by ADC references, SSADC ramp, etc.). In alternative embodiments, programmable or fixed analog gain circuitry may be disposed in (e.g., via multiplexer or hardwiring) the high-signal readout path. For example, a single PGA could be used to supply the gain required for both the low signal and higher signal readout paths. In embodiments that support single-path readout modes that benefit from PGA operation, the single-path PGA may be leveraged in the bifurcated-read-path mode, thus limiting die area increase. Also, by providing sample-and-hold circuitry in the high-signal readout path, a single per-column SSADC capture block can be used for both the low-signal and high-signal readout paths.

In the embodiments of FIGS. 51A-51C, the SSADC capture block is operated in direct conversion mode for the low-signal path. That is, as discussed above, the pixel source-follower directly drives the input to the SSADC comparator during the conversion operation instead of sampling-and-holding the reset-state and signal-state pixout levels. The low-signal direct conversion may be carried out in at least two ways. In a number of embodiments, for example, the low signal level is determined using the SSADC and digital CDS techniques (e.g., as discussed above). In that case, the reset-state and signal-state of the floating diffusion node are digitized one after another in respective direct conversion operations, with the final digitized CDS value generated in the digital domain by subtracting the reset-state conversion result from the signal-state conversion result (i.e., yielding [photocharge signal+reset-state]−[reset-state]=photocharge signal).

Figure 52:
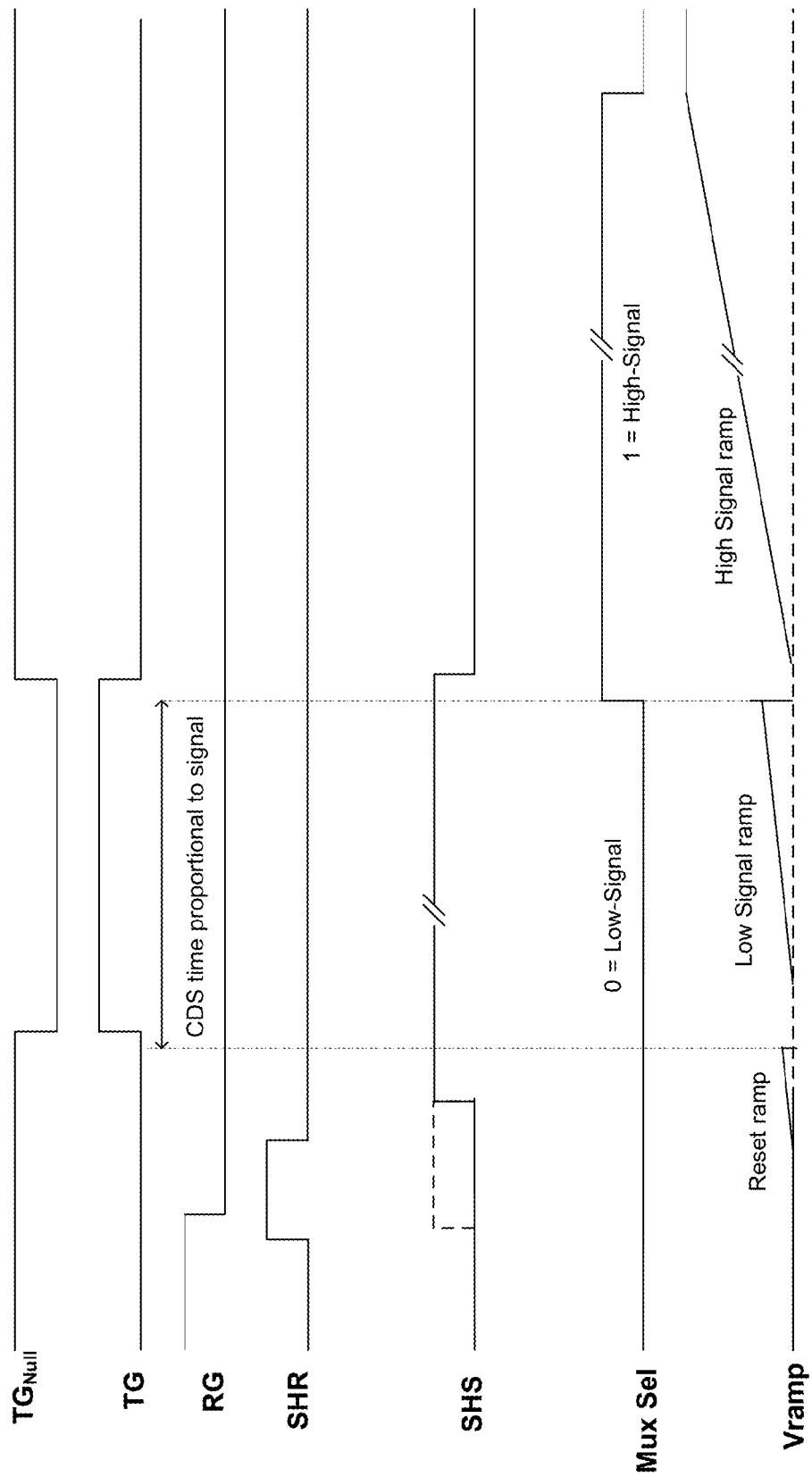
FIG. 52 illustrates an exemplary digital CDS operation that may be carried out within the embodiments of FIGS. 50 and 51A-51C.

FIG. 52 illustrates an exemplary digital CDS operation that may be carried out within the embodiments of FIGS. 50 and 51A-51C. In the example shown, the SHR and optionally the SHS pulse go high prior to the falling edge of the reset signal RG, (note that only the falling edge of RG is shown). After the falling edge of RG, the SHR signal goes low to store the reset signal level on capacitor Cr in the high signal S/H banks. At this time the Mux Sel signal is set to connect the low-signal FGA output to the input of the SSADC. The SSADC ramp and counters begin operation in order to produce a digital output representing the reset level of the pixel. After some predetermined number of counts and elapsed time, the reset level conversion completes.

A predetermined time after the reset ramp completes, the TG and $TG_{null}$ signals are asserted to effect feedthrough-compensated photocharge transfer. Because the TG rising edge and the $TG_{null}$ falling edge occur substantially simultaneously or close temporally, TG feedthrough to the floating diffusion is canceled and the column output signal line will remain at or very close to the reset-state level. Accordingly, the column output line will settle very quickly following photocharge transfer from the photodiode to the floating diffusion node. Despite the feedthrough compensation, a small residual feedthrough may still result due to, for example, spatial variation between the TG-to-FD coupling capacitance and the $TG_{null}$-to-FD coupling capacitance. In general, such residual feedthrough will produce a spatial fixed pattern offset noise (FPN) that may be corrected as discussed.

A predetermined delay is imposed after TG goes high (e.g., sufficient settling time for a pixout signal corresponding to $1e^-$ of photocharge plus residual feedthrough) after which the SSADC controller commences sequencing of the voltage ramp and counter to effect analog-to-digital conversion of the pixout signal level. For a low signal level, (e.g. $1e^-$), the SSADC will reach a valid conversion on the first ramp step and thus yield a very short CDS time. For larger signals within the low-signal range (e.g. 2, 3, 4 . . . 30 electrons), the SSADC will complete conversion at correspondingly later ramp steps/ramp voltages and thus yield correspondingly longer CDS times. That is, the direct conversion CDS time (and therefore noise rejection or immunity) is proportional to the pixout signal level and thus the integrated photocharge. Because low-signal readout is meaningful only over a relatively narrow photocharge range, it will generally require fewer ramp clocks than the high-signal range. For example, if the signal range of the low signal readout corresponds to 30 electrons, conversion will require a maximum of 120 clocks given a $0.25e^-$ (i.e., four ramp steps/counts per electron) ADC quantization. As explained above, attempted conversion of the low-signal path terminates with two possible outcomes: valid conversion (the comparator trips and latches the attendant counter value), or invalid conversion (comparator does not trip). As discussed above, various different techniques may be employed to select between valid low-signal and high-signal conversions, selectively abort/inhibit high-signal conversion, correct fixed pattern noise, scale digital outputs, etc.

Still referring to FIG. 52, the TG signal goes low after low-signal path conversion completes and, a predetermined time after the TG falling edge, SHS signal goes low to store the pixout signal within the high-signal path sample-and-hold bank (i.e., on the Cs capacitive element shown in FIG. 51A. Thereafter, the ADC input mux is switched to select the S/H bank and the SSADC comparator is auto-zeroed again (timing not shown) using the stored reset level on the sample-and-hold reset-state capacitive element (Cr). Because the S/H bank may need to capture (and settle) for a signal as large as a full-well signal, typical SHS pulse widths may be, for example and without limitation, in the 0.5 μs to 1.0 μs range. Accordingly, in a number of embodiments, the low-signal direct-conversion time is designed to occur and finish during the SHS pulse.

At the end of the A/D conversion for the large-signal CDS value stored within the S/H bank, the digital output logic/buffer selects between the low-signal and high-signal conversion results as generally discussed above, passing one value or the other as the digital pixel output, together with optional information that indicates the source readout path (low-signal or high-signal) for purposes of downstream processing (i.e., post-ADC correction logic such as FPN correction, scaling logic, image reconstruction logic, etc.). Note that, though FIG. 52 shows low-signal readout completion prior to the falling edge of TG, low-signal readout may be completed after TG falls in alternative embodiments.

Still referring to FIGS. 50 and 51A-51C, in an embodiment in which high-signal path CDS is achieved digitally through separate conversions of the FD reset state and signal state, a single sample-and-hold capacitive element may be used as in FIG. 51B (e.g., capacitive element Cr used to store, at different times, both the reset-state sample and signal-state sample of the floating diffusion node). By contrast, if analog high-signal path CDS is desired or pipelining of analog storage of high-signal path samples for one pixel row with analog-to-digital conversion of high-signal path samples from another row, a multiple S/H capacitor bank may be provided as in FIG. 51A.

Figure 53:
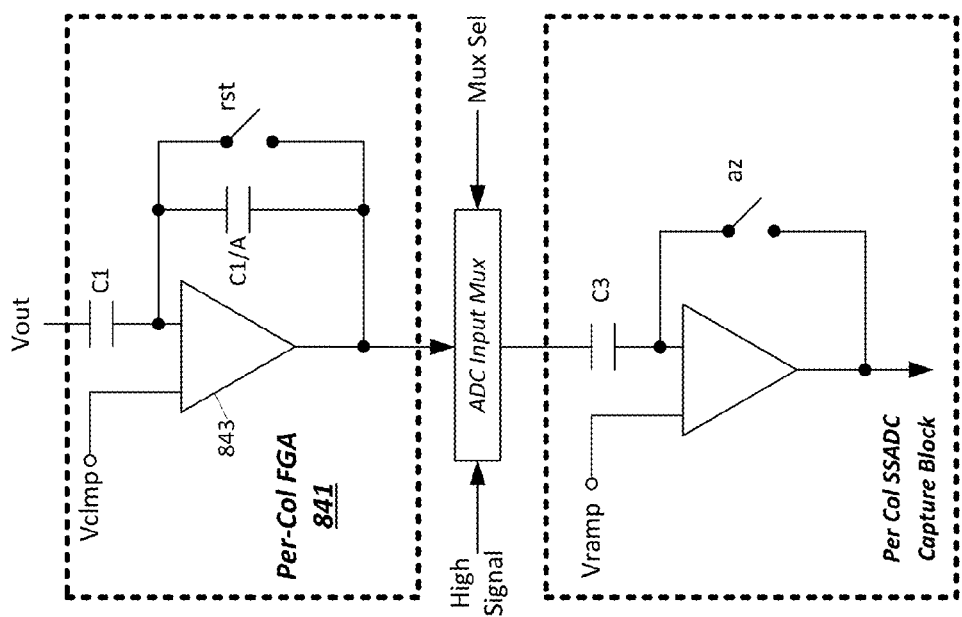
FIG. 53 illustrates an alternative embodiment of a bifurcated readout path that may be implemented within the image sensor of FIG. 50.

In the bifurcated readout path embodiment of FIG. 53, the low-signal path signal-state output is determined using an AC coupled analog CDS technique in which the analog CDS voltage is converted by the SSADC. In the implementation shown, the reset-state level drives input of amplifier 843 via capacitor C1, while the other input is clamped to a reference voltage, Vclmp. This occurs in conjunction with auto-zeroing of the SSADC comparator. An exemplary timing diagram for this approach is shown in FIG. 54A and is similar to the timing diagram of FIG. 52 except there is no ramp conversion for the reset level.

Figure 54A:
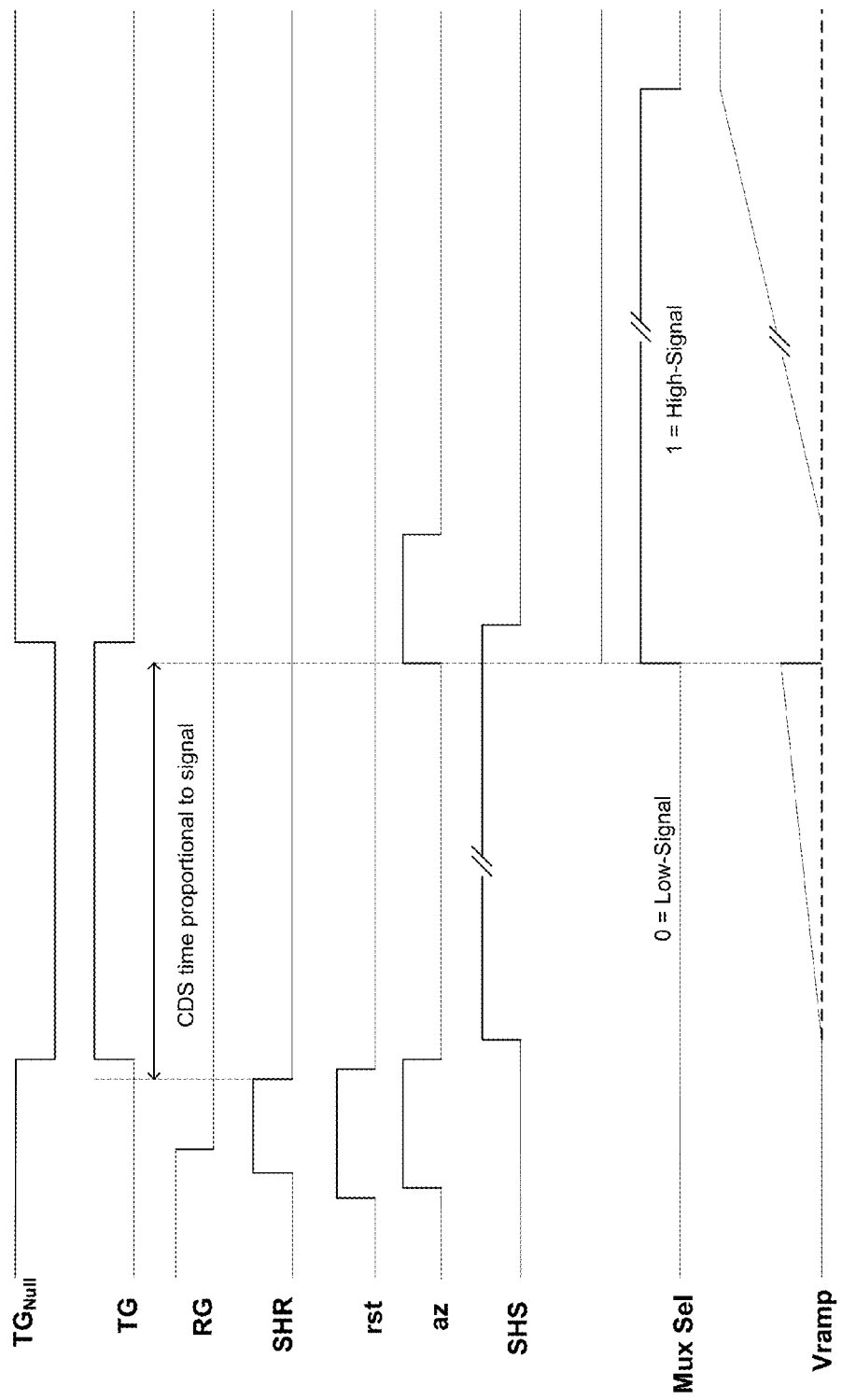
FIG. 54A is a timing diagram illustrating an exemplary operational sequence that may be implemented within the image sensor of FIG. 50 and bifurcated readout path of FIG. 53.

Although the timing diagram in FIG. 54A shows low-path signal readout (i.e., by direct conversion in this example) prior to the falling edge of TG, post-TG-pulse readout may be employed in alternative embodiments or operating modes.

Figure 54B:
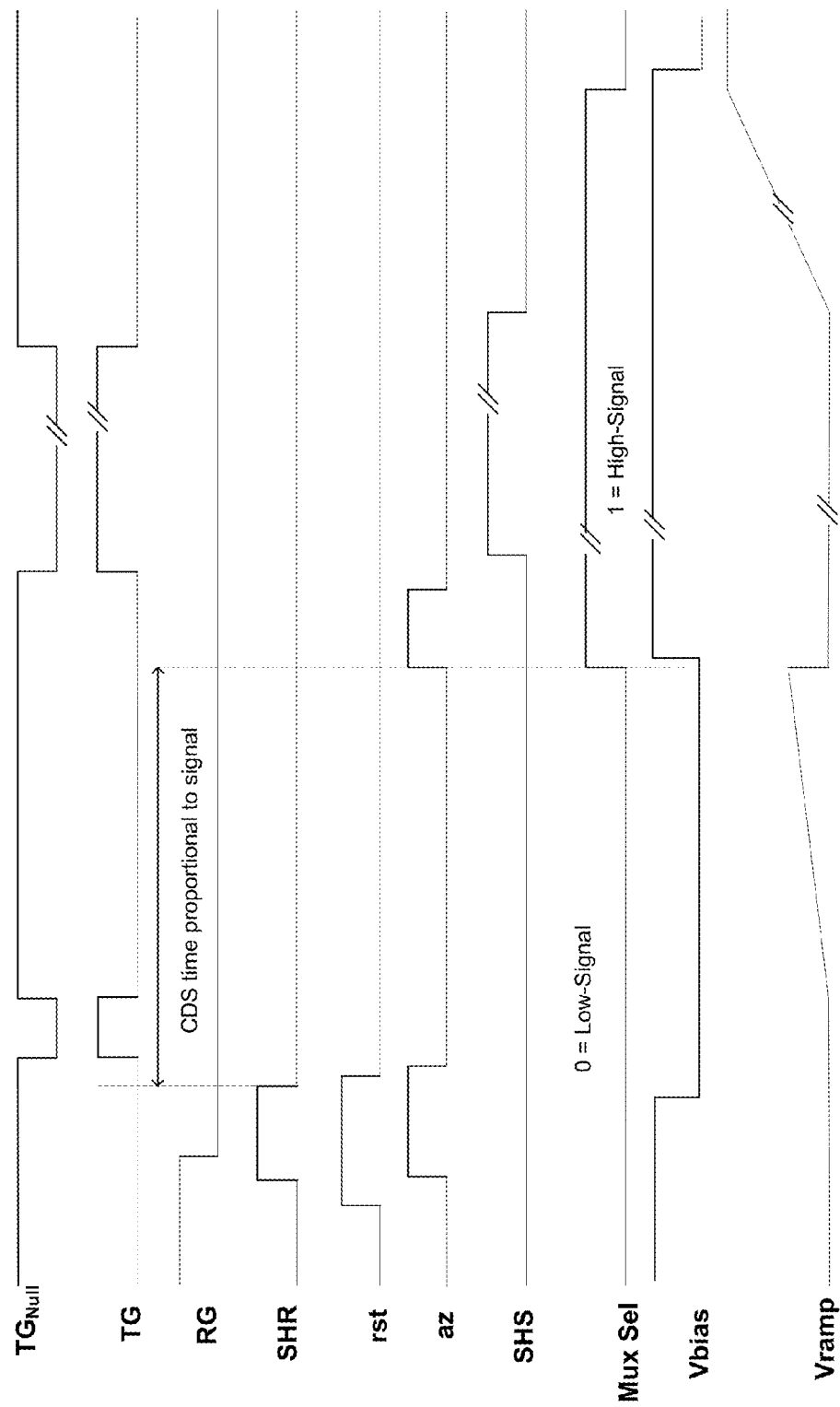
FIG. 54B is a timing diagram illustrating another exemplary operational bifurcated low-signal/high-signal readout sequence.

Single Direct Conversion—Analog CDS for the Low Signal; Switched SF BW and Sample after Falling Edge of TG Signal:

FIG. 54B illustrates another embodiment of a hybrid direct conversion/sampled conversion readout for an image sensor having bifurcated low-signal/high-signal read paths. In general, the readout operations shown in FIG. 54B are similar to those shown and described in reference to FIGS. 52 and 54A except the low-signal path CDS is effected in the analog domain. The reset-state of the floating diffusion node, when driven onto pixout, is used to clamp and auto-zero the FGA and ADC comparator. After low-signal conversion is complete, ADC input multiplexer control signal (Mux Sel) is raised to connect the S/H bank reset capacitor (and attendant buffer—as shown in FIG. 51C) to the ADC capture block input and the autozero signal (az) is pulsed to auto-zero the ADC comparator in preparation for conversion of the high-signal readout.

Also following conversion of the low signal, Vbias (and thus the source follower bias current) is increased to raise the source follower bandwidth for the high signal readout. The SSADC comparator is auto-zeroed from the reset capacitor. TG is pulsed for a second time with a pulse width sufficient to transfer a full-well signal from the photodiode. SHS is enabled after the rising edge of the second TG pulse, and SHS is lowered after the falling edge of the second TG pulse. The SSADC conversion operation for the high signal commences after the falling edge of SHS.

Though depicted as a linear ramp, the low-signal ADC ramp may alternatively be non-linear as described above with respect to dual direct conversion. Also, as in all embodiments herein, any practicable ADC circuitry may be used in addition to or in place of the single-slope ADC circuitry described above. Further, the SSADC ramp signals shown in the timing diagrams of FIGS. 52, 54A and 54B (and elsewhere herein) are intended to show the general operation of the SSADC and readout/conversion of the low and high pixel output signals. The ramp signals may be inverted from those shown in a detailed implementation. Such a case would be a n-type pinned photodiode and source follower where a low light signal is further from a ground potential (i.e., closer to the photodiode reset potential and a high light signal is closer to the ground potential (further from the photodiode reset potential).

Pseudo-Digital CDS

In a digital CDS operation, analog signals representative of the reset-state and signal-state of a pixel's floating diffusion node are separately digitized with the digitized reset-state value subtracted from the digitized signal-state to yield a finalized digital CDS value (i.e., representative of transferred photocharge and lacking the reset-state/noise component)—an operation that, of course, requires two analog-to-digital conversions. The pseudo-digital readout approach described below in reference to FIGS. 55A, 55B and 56 does not require extra circuit elements compared to a baseline per column SSADC with digital CDS architecture and may yield tightly compressed (low-noise) CDS times through TG-asserted pixout sampling. In general, the residual feedthrough cancellation techniques discussed above (e.g., in reference to FIGS. 31A and 31B) may be employed to effect row-by-row digital domain correction for FPN noise that may otherwise occur in the low-signal readout path.

Figure 56:
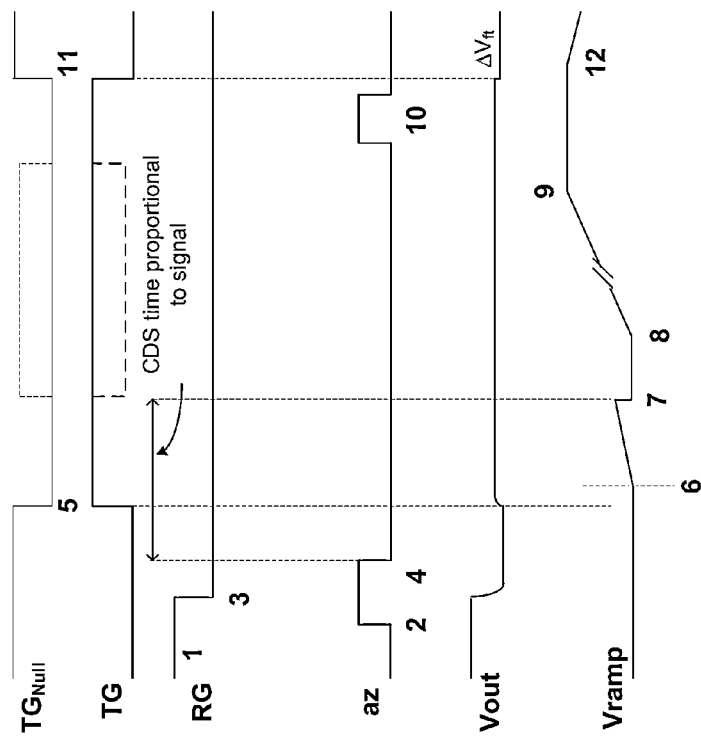
FIG. 56 illustrates an exemplary timing diagram for bifurcated low-signal/high-signal readout operations with respect to the embodiments of FIGS. 55A and 55B.
Figure 55A:
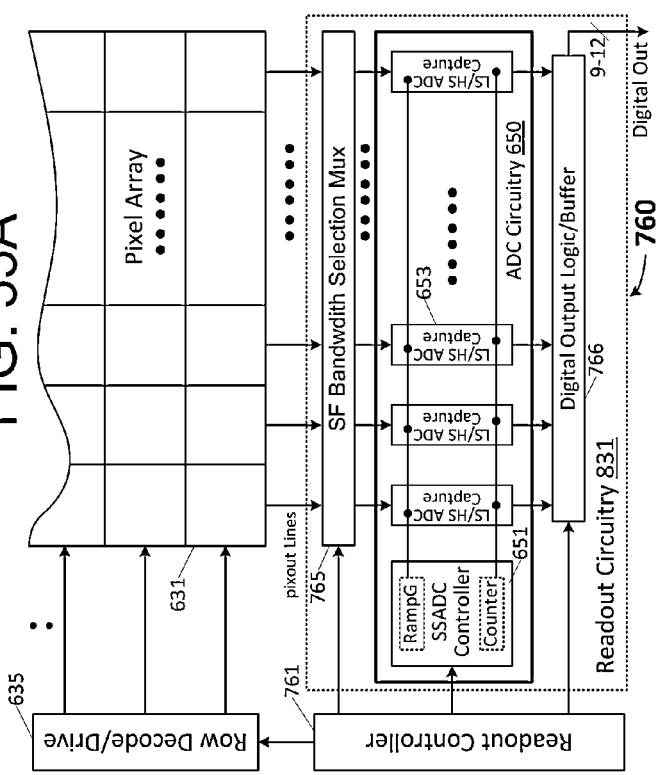
FIG. 55A illustrates an embodiment of another direct-conversion, bifurcated readout image sensor.
Figure 55B:
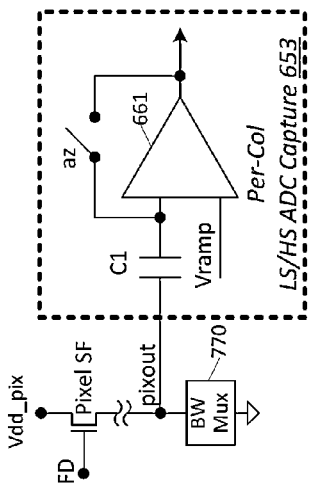
FIG. 55B illustrates a more detailed example of a bias-multiplexed read-out path and SSADC comparator.

FIG. 55A illustrates an embodiment of another direct-conversion, bifurcated readout image sensor 760. In general, image sensor 760 may be implemented as discussed in reference to FIG. 42, except that Source Follower Bias Mux bank may be replaced with a Source Follower Bandwidth Selection Mux. This bandwidth selection mux can use selectable bias current, pixout capacitance, pixout resistance, or other circuit attributes individually or in combination. Similarly, FIG. 55B illustrates a more detailed example of the bias-multiplexed read-out path and SSADC comparator, both of which may operate generally as described above in reference to FIG. 43. FIG. 56 illustrates an exemplary timing diagram for the bifurcated low-signal/high-signal readout operations, enumerated to correspond to the operation sequence listed below. Steps 1-7 are preferably done in a low source follower bandwidth state. After step 7, the source follower is switched to a high bandwidth state. The source follower is switched back to the low bandwidth state prior to step 8. The source Depending on the method used to select source follower bandwidth, steps 7-12 may be done in a high bandwidth state, (e.g. capacitance of the pixout line, since the DC offset is not affected).

1. The floating diffusion is reset, (RG is high).
2. The az signal is asserted while RG is high
3. RG is turned off
4. Az signal is turned off, and the auto-zeroed input is clamped with respect to the FD reset level output signal
5. TG and TGnull are asserted to transfer charge to the FD. The pixout signal decreases by an amount equal to the transferred charge and the residual feedthrough signal. In the timing diagram in FIG. 3, the signal level is a relatively small signal.
6. At a predetermined amount of time after the rising edge of TG, the small signal SSADC ramp commences. The small signal SSADC ramp will typically be a smaller slope than the large signal ramp, and will only cover the predetermined small signal readout range.
7. The small signal SSADC ramp completes. At this point the valid converted digital values will represent (Vsignal+ΔVft)−Vreset.
8. At some predetermined time after the completion of the small signal ramp, the large signal ramp commences. The large signal ramp can start at "0" or start at a signal level near the high signal for the small signal readout range.
9. The large signal SSADC ramp completes. At this point the valid converted digital values will represent (Vsignal+ΔVft)−Vreset.
10. The comparator is auto-zeroed while the pixel output line is at Vsignal (Vsignal+ΔVft).
11. TG and TGnull are turned off and on respectively. The pixel output line will change by ΔVft.
12. A predetermined time after the falling edge of TG, the SSADC ramp is started to convert the digital value representing −ΔVft. This ramp will run at a slope to provide the same mV/DN as the small signal ramp, or a slope that provides ease of scaling for subtraction from the small and large digital values, and provides low enough quantization error. The ramp will be a small number of clocks since the residual feedthrough signal will be very small (e.g. 1-2 mV).

Following the above-readout, a pseudo digital CDS is performed to correct for the ΔVft in each pixel in the row by subtracting the digital value obtained in operation 12 from the respective valid digital signal value obtained at operation 7 or 9. By knowing whether the digital value for the pixel was obtained from the small or large signal readout, the appropriate scaling can be done when ΔVft is subtracted.

Note that the TG does not need to be held high for the entire small-signal and large-signal readout period as shown in FIG. 56. For example, TG may be switched off, (and TGnull correspondingly switched on for feedthrough compensation) a predetermined time prior to completion of the large-signal ADC ramp in order to reduce TG dark current collection time. TG may then be switched back on prior to the second az pulse. This alternate timing is shown in dashed line for TG and TGnull in FIG. 56.

Readout-Switched Conversion Gain

In feedthrough-compensated embodiments for which fast-CDS operation yields sub-electron read noise for the pixel source follower, the total read noise may be dominated by circuits after the pixel source follower. In order to realize sub-electron total read noise, the input-referred noise of the circuits after the pixel source follower (for example, sample and hold circuits, ADC, etc.) as well as the input-referred noise of the source follower itself is reduced in embodiments described below by increasing the pixel conversion gain. For example, by implementing a 500 µV/e– conversion gain instead of 100 µV/e– conversion gain for low-signal readout, post-source-follower noise may be reduced by 5×. As a more specific example, if noise-post source follower is 150 µV, then raising the conversion gain from 100 µV/e⁻ to 500 µV/e⁻ will reduce effective readout noise by a factor of 5 from 1.5e⁻ to 0.3e⁻. Due to compensation of TG feedthrough, higher conversion gain can be employed without causing a large voltage excursion and long pixel output settling time.

While pixel conversion gain may be increased by reducing floating diffusion capacitance, charge storage capacity of the floating diffusion node will be correspondingly reduced and may fall below the capacity required to store the photocharge from a full-well photodiode (i.e., depending upon photodiode capacity, practical floating diffusion swing limitations, etc.) and thus compromising dynamic range at the upper limit of the large-signal range. In a number of embodiments, dynamic range is preserved by using a variable conversion gain pixel architecture that enables the floating diffusion capacitance to be changed dynamically between low-signal and high-signal readout operations. That is, by configuring the pixel in a low capacitance/high-conversion-gain readout mode (i.e., low noise mode) for the low-signal readout, and then switching to a higher-capacitance/lower-conversion-gain readout mode (i.e., larger charge storage capacity) during large-signal readout, the noise benefit of high conversion gain readout may be achieved without compromising the upper end of the large-signal range.

FIG. 57A illustrates an embodiment of a variable-conversion-gain (VCG) pixel 900 together with readout circuitry that includes a S/H bank 224 (e.g., implemented as discussed in reference to FIG. 14B) and a capacitively-coupled, auto-zeroed per-column comparator 903. As shown, variable conversion gain (VCG) pixel 900 is formed by a 4T pinned-photodiode pixel generally implemented as discussed above in reference to FIG. 1A, but additionally having a capacitive element Cx coupled between the supply rail (Vdd) and floating diffusion node 112 via conversion-gain (CG) control transistor 901. By this arrangement, when the control signal (Csel) coupled to the gate of transistor 901 goes high, CG-control transistor switches on to couple Cx to floating diffusion node 112, supplementing the FD capacitance (i.e., effectively extending/increasing FD node capacitance) so that conversion gain is reduced and charge storage capacity is increased. When Csel is low, transistor 901 is switched to a non-conducting state to decouple Cx from the floating diffusion node, thus lowering the effective FD node capacitance and raising the conversion gain of the pixel. Note that the variable-gain arrangement may also be employed with respect to dual-mode/conditional-read pixels (e.g., as shown in FIG. 1B) and that various other switchable conversion gain pixel architectures can be employed, including arrangements in which a single capacitive element Cx is shared across a column of pixels (or at least multiple same-column pixels) and/or transistor 901 is shared by a column of pixels or at least multiple same-column pixels.

FIG. 57B is an exemplary timing diagram corresponding to a readout operation within variable-conversion-gain pixel 900 of FIG. 57A. As shown, Csel is initially low to establish a high conversion gain within VCG pixel 900 (i.e., low effective FD node capacitance). $RG_n$ is pulsed to reset the floating diffusion node and SHR is pulsed to capture the reset-state level within S/H bank 224 (i.e., on Cr). After Cr has charged to the reset-state potential and prior to the falling edge of SHR, auto-zero signal, az, is raised to auto-zero per column comparator 903, clamping the comparator signal input according to the pixout (and Cr) potential on the pixout-side of capacitive element C1. Feedthrough-compensated photocharge transfer from photodiode 110 to floating diffusion node 112 is then enabled by the opposite polarity pulses shown on TG and TGnull, with SHRS being pulsed as shown to store the resultant signal-state of the floating diffusion node on capacitor Cs. By this operation, the difference between the signal-state and reset-state samples (i.e., analog CDS value) develops and is present at the comparator input when compare-enable signal, CmpEn is pulsed. Accordingly, depending on whether the CDS value exceeds threshold voltage Vthr (e.g., corresponding to the upper limit of a low-signal pixout range), comparator 903 will either trip, driving Csel high, or not trip, maintaining the low Csel level. If the comparator does not trip, a low-signal readout is confirmed and the signal-state and reset-state samples stored on Cs and Cr are either supplied as analog CDS input to downstream ADC circuitry, or separately digitized and differenced in the digital domain to yield a digital CDS result. By contrast, if the comparator trips, a high-signal readout is confirmed, and the high-state of Csel enables a rapid transition to the reduced conversion gain/higher-capacity readout mode within VCG pixel 900. In that case, TG may be pulsed again as shown at 921 to enable transfer of all remaining photocharge from photodiode 110 to floating diffusion node 112. Thereafter, SHS is pulsed again at 923 to capture the large-signal pixout signal (signal-state of floating diffusion node 112) within S/H bank 224 on capacitive element Cs. Thereafter, floating diffusion node 112 is reset by RG pulse 925 and the resulting reset-state pixout level is captured within S/H bank 224 on capacitive element Cr in response to SHR pulse 927. The high-signal readout path signal-state and reset-state samples captured within S/H bank 224 may be separately digitized and then differenced to yield a digital double-sampled result, or differenced in the analog domain to yield an analog double-sampled result prior to digitization. In either case, the resulting high-signal readout value constitutes an uncorrelated double sample since the reset level is obtained after the signal level. In general, any potentially higher noise resulting from the lack of reset-state correlation in the two samples will be negligible in view of the more dominant photon shot noise of the larger signal.

FIG. 57C is a table of exemplary CDS times, readout noise levels, conversion gains and dynamic range that may be achieved by a variable-conversion-gain, feedthrough-compensated, bifurcated readout path image sensor embodiment, comparing those performance metrics with those of a more conventional image sensor lacking those features.

Reflecting on FIGS. 57A and 57B, numerous alternative circuit arrangements/techniques may be employed for implementing variable conversion gain and for controlling variable-gain readout. For example, in a number of feedthrough-compensated bifurcated-readout-path embodiments, deterministic low-signal and high-signal readouts are separately performed as part of each pixel readout with high conversion gain being applied in the low-signal readout and low conversion gain applied in the high-signal readout. That is, instead of conditionally executing a low-conversion gain readout depending on the threshold comparison result in per-column comparator 903, that comparator may be omitted (or bypassed in a selected operating mode) and Csel instead controlled by a row control signal (i.e., dedicated to a given pixel row, shared among all pixel rows, or asserted to override to the per-column comparator output) so that every high-conversion-gain output onto pixout is followed by a low-conversion-gain output onto pixout. In that case, the dashed pulses shown at 921, 925, 927 and 923, and the dashed high-going Csel signal may be generated deterministically (i.e., without condition) as part of the readout operation shown. Also, instead of two TG pulses, a single TG pulse (and coincident TGnull pulse) may be applied, with low-signal readout captured in analog or digital samples (i.e., within S/H or converted by ADC) before or after the falling edge of the TG pulse. In that case, the high-signal readout may also be captured (in analog or digital samples) before or after the falling TG edge. Also, the SHR falling edge may be used to capture reset-state samples for both low-signal and high-signal readouts at the same time (and prior to corresponding signal-state captures) so that both the low-signal and high-signal readouts constitute correlated double samples.

Dark Pixel Emulation with Active Floating-Diffusion Stabilization

In various embodiments disclosed herein, image sensors that implement control-signal feedthrough compensation as described above are operated in both full-resolution and reduced-resolution (enhanced low-light sensitivity) read-out modes during respective subframes of an exposure interval, and/or may include one or more columns and/or rows of pixels operated in dark emulation modes (e.g., leveraging the above-described floating-diffusion stabilization techniques), all of which are described below. Accordingly, spatial resolution of the image sensor may be preserved while also enhancing low-light sensitivity. In a number of embodiments, reduced-resolution image data is selectively applied in final image reconstruction according to a light-intensity determination based upon the subframe or frame-to-frame readouts themselves. In other embodiments, subframe intervals are programmably controlled to balance read-out circuitry utilization and limit on-board data storage needs while achieving desired imaging results effects. In yet other embodiments, a binary threshold used to trigger conditional read-out operations is calibrated according to read-out results and/or reference charge injection. These and other features and benefits are described in greater detail below.

There a number of reasons to expect a much larger RC delay of signal lines in the pixel array in the near future. For one, 3D stacking technology will allow a large increase in the active pixel array area creating unique opportunities to use larger optical formats by pushing the analog and digital section beneath the footprint of the pixel array. Also, the pace of pixel pitch reduction is expected to slow, as the pixel pitch approaches the diffraction limit, putting greater pressure on increased optical formats to provide the generational improvements in image resolution. Further, continuing improvement in ISP processing power allows use of larger resolutions.

At least one problem with increased RC delay in image sensors is that the propagation delay across the imaging array begins to enter the transfer function bandwidth of the high-signal correlated-double-sampling (CDS) period. Consider that an RC time constant of 33 ns could enter a high-signal CDS transfer function of 33 Mhz, with 3 sigma settling stressing a 10 Mhz transfer function. A high-signal CDS transfer function may be from 100 khz to 1 MHz (for example and without limitation to such range), so it is easy to expect a feasibility challenge of signal uniformity in the near future. In addition, because row-wise signals are approximate square waves, dispersion due to line inductances is a factor. In practical terms, it has been observed that an 18 Megapixel sensor with 1.25 micron pitch, if driven from one side of the array, achieves visible left to right row noise, due to the RC propagation delay. Even a measured row temporal noise ratio of, for example, 14× is unacceptable in many applications, with designers opting for a differential video mode requiring nearly twice the power consumption.

There are at least two fundamental problems with the conventional row noise correction (RNC) approaches. First, the pixels in dark correction blocks, covered with a light shield or other light block material (e.g., as shown by shaded regions in FIG. 58), have different capacitive loads than the active pixels (i.e., pixels in the light sensitive portion of the array). This can cause a miscorrelation in dark signal performance between active and dark arrays. Second, the RC propagation delay across the array tends to produce a mismatch in both voltage and pulse shape that enters the pixel. As a result, the row noise correction reference pixels are fundamentally inadequate to represent the distribution of pixel behaviors across the array, and there are fundamental limits to the effectiveness of conventional RNC approaches.

Fortunately, the various conditional-read pixel architectures disclosed herein, and specifically the two-dimensional control of the transfer gate between photodiode and floating diffusion, allows for a practical distributed sampling of dark level behavior, solving the fundamental problem at its root source.

FIG. 59 illustrates an exemplary dark-emulation with respect to a full-resolution pixel array. In the example shown, each row of pixels is logically organized in groups of N pixels (e.g., 48 pixels sharing an ADC circuit as discussed above) and in which a random or pseudo-random or otherwise deterministic one (or more) of the pixels within each N-pixel group is "dark-sampled" each subframe or full-frame interval—read-out using a dark-column emulation protocol as discussed below. More specifically, a local "dark level" read is performed in the dark-sampled pixels to obtain an emulated dark-pixel value. Because these active pixels are not covered by metal or other shielding and are light-sensitive, a special control sequence is applied to discard charge from the pixels before executing a CDS read-out, thus emulating the dark read within conventional shielded pixels.

In the particular arrangement shown in FIG. 59, the pixel(s) selected for dark-emulation read-out is dynamically varied for each N-pixel group within a given row and subframe, and with the dynamic selection repeated for each successive row to disperse the dark-emulation read-out in a preferably invisible sequence, but with controlled density, throughout the pixel array. Note that, in one embodiment, a pixel used for dark-pixel emulation in one subframe of a frame may be used as a light-gathering pixel in one or more other subframes of the same frame. Also, in various embodiments, dark-emulation read-out is applied exclusively with respect to green pixels (i.e., pixels covered by or otherwise associated with a green color filter element) in view of the larger proportion of those pixels within the array (e.g., 2× in a Bayer-pattern CFA).

FIG. 60 illustrates exemplary timing diagrams for a number of pixel read-out modes within a conditional-read image sensor, including the conditional and unconditional read-out modes described above as well as a dark-emulation read-out mode. In the timing diagrams shown, the row and column transfer gate control signals (TGr and TGc) are shown in a combined, logically-ANDed form as "transfer-enable" signal, "TxEn"). As shown, both the conditional and unconditional read-out operations commence with a floating diffusion reset operation (pulsing the RG signal as discussed above), followed by a reset-state sampling operation at 951 (pulsing the SHR signal). In the conditional read operation, the partial read operation and threshold evaluation are omitted for ease of understanding, but are carried out as previously described. TxEn is raised only in columns for which an overthreshold pixel state is detected (i.e., conditionally asserting TGc as discussed above, thus enabling full transfer of integrated charge from photodiode to floating diffusion pursuant to pixel read-out), while TGc and thus TxEn is asserted unconditionally. SHS is asserted in both conditional and unconditional instances to trigger signal-state sampling.

Still referring to FIG. 60, dark-emulation read-out begins with assertion of TxEn at 952 for selected columns on a row to transfer integrated charge from photodiode to floating diffusion and thus empty (reset) the photodiode. As discussed below, this operation is controlled through assertion of TGc within pattern-selected pixel columns, with the selection pattern being dynamically varied from row to row and/or from subframe to subframe. After the photodiode reset at 952, the remaining operations are the same as unconditional read mode and thus include the floating diffusion reset (RG pulse, which may overlap the TxEn pulse), reset-state sample (SHR pulse), and signal-state read-out (TxEn pulse followed by SHS pulse), with the signal-state read-out capturing the empty state of the photodiode and thus an emulation of a dark pixel read-out. It is noted that such pixels are not truly "dark" in that they gather light between the two TxEn pulses. Generally, however, these two operations are only a few microseconds apart and vanishingly little to no light will be gathered, compared to the surrounding light-gathering operations that gather light for hundreds of microseconds to hundreds of milliseconds, depending on exposure. In a given embodiment, various techniques can be used to compensate for or reject a "dark" pixel that has received too much actual light or is faulty, including: rejecting a dark value based on eclipse detection; rejecting a dark value based on its variation from other dark values gathered for that row and subframe; rejecting a dark value based on the amount of light gathered by surrounding pixels; or compensating for light gathered by such a pixel by subtracting from its value a proportional fraction of light gathered by surrounding light-gathering pixels.

Figure 61:
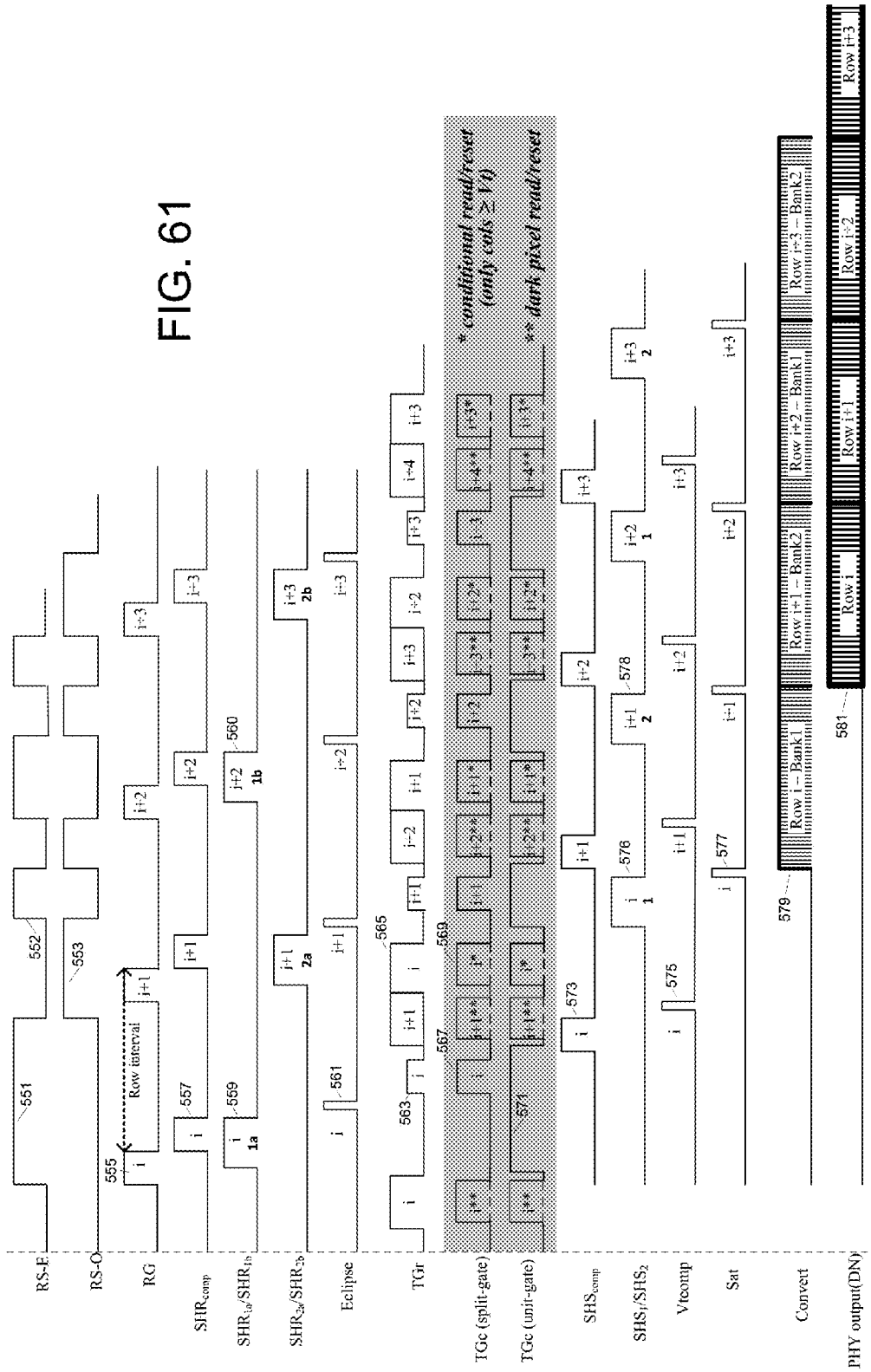
FIG. 61 illustrates a more complete timing diagram for emulated dark-pixel read-out, showing the pipelined sequence of operations within the pixel array, sample-and-hold logic, comparator and ADC circuitry.

FIG. 61 illustrates a more complete timing diagram for emulated dark-pixel read-out, showing the pipelined sequence of operations within the pixel array, sample-and-hold logic, comparator and ADC circuitry. As shown, additional TGc pulses are applied to reset the photodiode in columns selected for dark-emulation read-out in each row. As explained above, conditional-assertion of TGc during the signal-state read-out operation (i.e., TGc signal pulses denoted by '*') applies during conditional-read/reset operations— TGc is asserted unconditionally during the same interval in an unconditional read operation. In either case, pixels that were designated as dark pixels for that row (i.e., operations denoted by '**') are also read at the time of the conditional or unconditional read of the light-gathering pixels on the row for that subframe.

FIG. 62 illustrates an exemplary image sensor architecture 2170 that supports emulated-dark read-out operations discussed above. As shown, the image sensor includes row logic 961 (i.e., row decoder/driver) and readout controller 963, both of which operate generally as discussed above, except that row logic 961 is modified to generate an additional TGr pulse shown to enable pre-read photodiode reset operations in selected dark-emulation pixels, and readout controller 963 is modified to provide one or more additional dark-emulation control signals as discussed below. As in the embodiments discussed above, the pixel array includes a number of m*n pixel blocks, only one of which is shown (i.e., pixel block 'i' 965), and the column read-out circuitry includes a corresponding number of constituent read-out logic blocks, only one of which is shown (read-out block 'i' 967). While the pixel array is implemented generally as described above, each of the read-out blocks 967 is modified to support dark-emulation read-out. More specifically, read-out block 967 includes multi-bank sample/hold circuitry 968, multiplexers 969 and 970, column-shared PGA 971 and column-shared ADC 972 (e.g., a SAR ADC, though an SSADC formed by column-shared SSADC controller and per-column SSADC capture blocks may alternatively be used), status bit buffers 973 and 974, and output buffers 975 and 976. Note that status flags stored with buffers 973 and 974 (e.g., indicating eclipsed, saturated, underthreshold status, and/or low-signal high-signal readout path source) may signify instances of dark-emulation read-out data as discussed below. Per-column comparator circuitry 977 may operate generally as discussed above, except that additional control logic is provided to accommodate dark-emulation read-out, including dark-column pattern controller 978 to control the pixel column or columns selected for dark-emulation read-out within a given row and/or subframe.

FIG. 63 illustrates an embodiment of a dark-column pattern controller 980 that may be used to implement pattern controller 978 of FIG. 62. In the implementation shown, pattern controller 980 includes a pseudo-random number generator 981 that outputs a pseudo-random M-bit number to M:n decoder 982. Decoder 982 decodes the incoming pseudo-random number to assert one of n dark-emulation enable signals (EnDE), thus enabling a dark-emulation operation within the corresponding pixel column. As each successive pixel row is selected for conditional or unconditional read-out, the pseudo-random number generator produces a new pseudo-random number, thereby selecting a different pixel column for dark-emulation and randomizing the pattern of dark-emulation pixels within the pixel block. In one embodiment, pseudo-random number generator 981 may be designed to ensure a minimum pixel offset between pixels in successive rows and may also be seeded (or constructed) differently than the pseudo-random number generator for neighboring pixel blocks to randomize the dark-emulation pixel pattern from block to block. For example, a single generator may be used with different scramblings of M bit-lines to each block—the pseudo-random number may be larger than M bits as well, with different subgroups of the bits supplied to each block Also, M:n decoder 982 and/or pseudo-random number generator 981 may include circuitry to ensure assertion of an adjacent green pixel in response to a pseudo-random number that would otherwise select a red or blue pixel column within a given column, thus effecting a green-pixel-only dark-emulation embodiment.

In other embodiments, the controller can comprise a circuit to feed a bit pattern into one end of a linear shift register, with one register element per column of the array. A pattern of '0' and '1' bits is fed into the shift register, along with calculated shift lengths between rows, to provide the EnDE[i] signals. For decimated modes, the register can be loaded with a fixed pattern that does not change between rows, subframes, and frames. In other embodiments, various other circuits may be employed to control which columns are designated for dark-emulation read-out within each row and subframe.

FIG. 64 illustrates an embodiment of a read-enable logic 985 (e.g., that may be implemented within logic block 977 of FIG. 62) having circuitry to support dark-emulation read-out. More specifically, eclipse and overthreshold flags are supplied, together with the EnDE bit for the subject pixel column (i.e., EnDE[i]), to a read/dark-emulation logic circuit 987 which asserts the TGc signal for that pixel column (i.e., TGc[i]) according to those inputs and a set of control inputs from the read-out control logic (i.e., element 967 of FIG. 62). In one embodiment, shown for example in FIG. 65, read/dark-emulation logic 990 asserts TGc[i] in response to one of three circumstances: (i) a conditional read is to be carried out as indicated by either an eclipsed state (in which the conditional read is executed to clear the photodiode and floating diffusion) or an overthreshold determination; (ii) an unconditional read is to be executed as signaled by an all-column unconditional-read signal from the read-out control logic; or (iii) the dark-read enable bit, EnDE[i], is asserted for the subject pixel column. In the depicted implementation, the EnDE bit is logically ANDed with a dual-pulse dark-emulation timing signal from the read-out control logic ("Dark Read") to generate a two-pulse TGc signal assertion; an initial pulse to enable the photodiode emptying operation discussed above, and a final pulse to enable the signal-state capture operation at the same time that signal-states are captured for light-gathering pixels.

Returning to FIG. 64, the EnDE[i] bit is also supplied to ADC-enable/dilation logic circuit 989 to enable generation of status flags, RE and MP. In the embodiment shown, an asserted RE bit signals an ADC-enable event as discussed above, and when RE is low, the MP bit (multi-purpose bit) is high or low to indicate the reason for the ADC suppression (i.e., MP=0 if pixel underthreshold, MP=1 if pixel eclipsed or saturated). In contrast to embodiments in which one of the status flags (e.g., the AB bit described above) is unused and reallocated to ADC bit conveyance in the event of a logic '1' RE bit, the MP bit is retained in the ADC-enable case and used to indicate whether the read-out is a dark-emulation read-out (MP=1) or an image data read-out (MP=0). One consequence of this arrangement is that the net data stream size may be increased by one bit relative to the double-duty AB-bit/ADC-bit embodiments, though the status flags may be encoded within the ADC value itself (e.g. reserving upper and/or lower ADC values to signal the different status conditions shown), thus avoiding data bandwidth increase.

Figure 66:
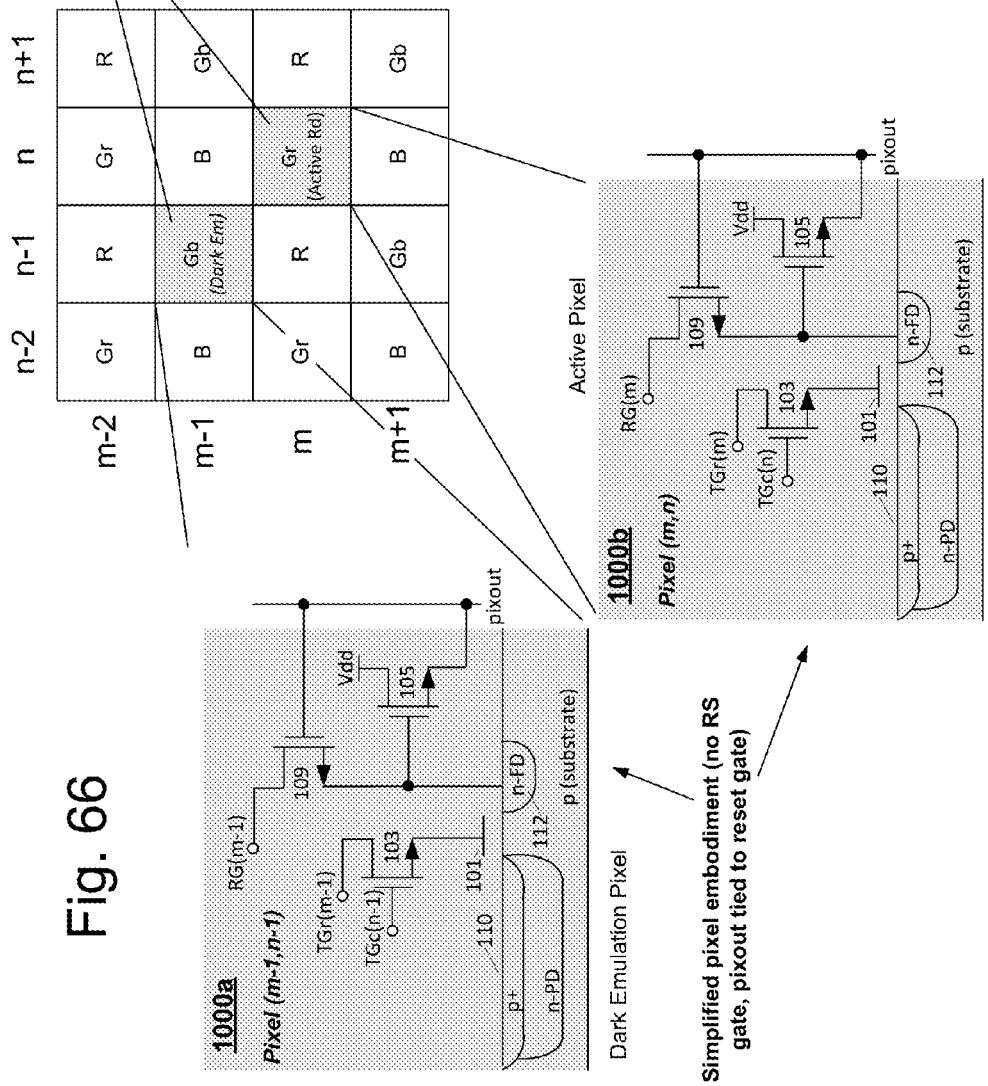
FIGS. 66 and 67 relate to an image sensor architecture that enables simultaneous readout of two diagonal pixels within a four-pixel Bayer pattern—one that provides dark emulation and another that provides an active image signal.
Figure 67:
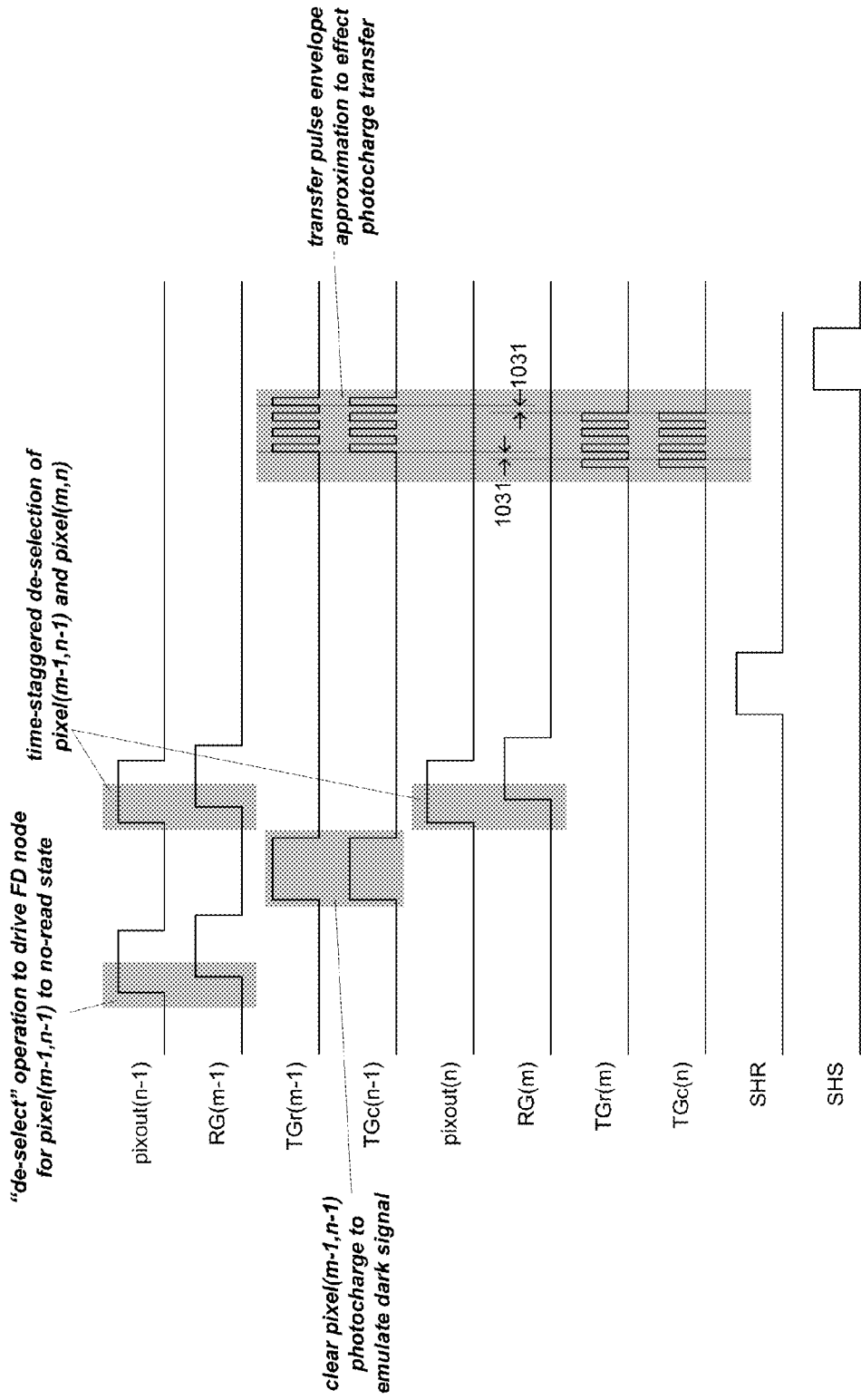

FIGS. 66 and 67 relate to an image sensor architecture that enables simultaneous readout of two diagonal pixels within a four-pixel Bayer pattern—one that provides dark emulation and another that provides an active image signal (i.e., pixel value corresponding to a region of a scene). For conventional architecture, individual diagonal pixel readout is not readily feasible since there is no two-dimensional transfer-gate activation. Diagonal alternating is possible by staggering the tx and rs control signals diagonally (and it would be hardwired with no flexibility), and sensor companies have continuously been challenged with the task of trying diagonal metal routing jogging strategies with little to no luck (diagonal readout can give higher resolution binning) due to the challenges and asymmetries of the layout.

The pixel control schematic of FIG. 66 can achieve diagonal readout through the timing sequence shown in FIG. 67. Note that in the example shown the tx pulse train is implemented to achieve high RNC correlation between two different rows by envelope matching. That is, pulse envelope approximation may be an effective technique that minimizes phase error between FD and pixout that is slew-rate limited by column-driven Vin. In the embodiment shown, transfer envelopes can be approximated from one column to the next and one row to the next without destroying active pixels by shifting as shown at 1031. Such TG line pulsing may be omitted in other embodiments that carry out dark pixel emulation with active floating-diffusion stabilization. Further embodiments of dark-emulation pixels in which active floating-diffusion stabilization may be employed are described below.

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

The section headings in the above detailed description have been provided for convenience of reference only and in no way define, limit, construe or describe the scope or extent of the corresponding sections or any of the embodiments presented herein. Also, various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation within an integrated-circuit image sensor having a pixel array, the method comprising:
   generating, on a first signal line of the pixel array that is connected to a transfer gate of a first pixel within the pixel array, a control pulse that enables photocharge accumulated within a photosensitive element of the first pixel to be transferred to a floating diffusion node, the first signal line having a capacitive coupling to the floating diffusion node;
   generating, on a second signal line of the pixel array that also has a capacitive coupling to the floating diffusion node, a first feedthrough compensation pulse having a pulse polarity opposite a pulse polarity of the control pulse and that is timed to coincide with the control pulse such that capacitive feedthrough of the control pulse to the floating diffusion node is reduced; and
   wherein the pixel array comprises a first pixel row constituted by a first plurality of pixels, including the first pixel, connected to the first signal line, and a second pixel row constituted by a second plurality of pixels connected to the second signal line, and wherein the second signal line is coupled to a respective transfer gate within each pixel of the second plurality of pixels.

2. A method of operation within an integrated-circuit image sensor having a pixel array, the method comprising:
   generating, on a first signal line of the pixel array that is connected to a transfer gate of a first pixel within the pixel array, a control pulse that enables photocharge accumulated within a photosensitive element of the first pixel to be transferred to a floating diffusion node, the first signal line having a capacitive coupling to the floating diffusion node;
   generating, on a second signal line of the pixel array that also has a capacitive coupling to the floating diffusion node, a first feedthrough compensation pulse having a pulse polarity opposite a pulse polarity of the control pulse and that is timed to coincide with the control pulse such that capacitive feedthrough of the control pulse to the floating diffusion node is reduced; and
   wherein the pixel array comprises a first pixel row constituted by a first plurality of pixels, including the first pixel, connected to the first signal line, and a second pixel row constituted by a second plurality of pixels connected to the second signal line, and wherein the second signal line is coupled to a respective reset transistor within each pixel of the second plurality of pixels.

3. A method of operation within an integrated-circuit image sensor having a pixel array, the method comprising:
   generating, on a first signal line of the pixel array that is connected to a transfer gate of a first pixel within the pixel array, a control pulse that enables photocharge accumulated within a photosensitive element of the first pixel to be transferred to a floating diffusion node, the first signal line having a capacitive coupling to the floating diffusion node;
   generating, on a second signal line of the pixel array that also has a capacitive coupling to the floating diffusion node, a first feedthrough compensation pulse having a pulse polarity opposite a pulse polarity of the control pulse and that is timed to coincide with the control pulse such that capacitive feedthrough of the control pulse to the floating diffusion node is reduced; and
   wherein the first pixel comprises a row-select transistor to switchably couple the first pixel to an output line of the pixel array such that a signal corresponding to a charge level of the floating diffusion node is generated on the output line, and wherein the second signal line is coupled to the row-select transistor.

4. The method of claim 3 further comprising raising the second signal line to a first predetermined voltage level to switch the row-select transistor from a non-conducting state to a conducting state, and wherein generating the first feedthrough compensation pulse having a polarity opposite the polarity of the control pulse comprises lowering the second signal line from the first predetermined voltage level to a second predetermined voltage level and then restoring the second signal line to the first predetermined voltage level, the second predetermined voltage level being sufficiently high to maintain the row-select transistor in the conducting state.

5. A method of operation within an integrated-circuit image sensor having a pixel array, the method comprising:
   generating, on a first signal line of the pixel array that is connected to a transfer gate of a first pixel within the pixel array, a control pulse that enables photocharge accumulated within a photosensitive element of the first pixel to be transferred to a floating diffusion node, the first signal line having a capacitive coupling to the floating diffusion node;
   generating, on a second signal line of the pixel array that also has a capacitive coupling to the floating diffusion node, a first feedthrough compensation pulse having a pulse polarity opposite a pulse polarity of the control pulse and that is timed to coincide with the control pulse such that capacitive feedthrough of the control pulse to the floating diffusion node is reduced; and
   generating, on a third signal line of the pixel array that also has a capacitive coupling to the floating diffusion node, a second feedthrough compensation pulse having a pulse polarity opposite the pulse polarity of the control pulse and that is timed to coincide with the first feedthrough compensation pulse such that the first and second feedthrough compensation pulses act jointly to reduce capacitive feedthrough of the control pulse to the floating diffusion node.

6. A method of operation within an integrated-circuit image sensor having a pixel array, the method comprising:
   generating, on a first signal line of the pixel array that is connected to a transfer gate of a first pixel within the pixel array, a control pulse that enables photocharge accumulated within a photosensitive element of the first pixel to be transferred to a floating diffusion node, the first signal line having a capacitive coupling to the floating diffusion node;

generating, on a second signal line of the pixel array that also has a capacitive coupling to the floating diffusion node, a first feedthrough compensation pulse having a pulse polarity opposite a pulse polarity of the control pulse and that is timed to coincide with the control pulse such that capacitive feedthrough of the control pulse to the floating diffusion node is reduced; and generating one or more other feedthrough compensation pulses on one or more other signal lines of the pixel array, respectively, each of the one or more other feedthrough compensation pulses having a pulse polarity opposite the pulse polarity of the control pulse and being timed to coincide with the first feedthrough compensation pulse such that (i) the first feedthrough compensation pulse and the one or more other feedthrough compensation pulses act in combination to reduce capacitive feedthrough of the control pulse to the floating diffusion node, and (ii) amplitudes of each of the first and one or more other feedthrough compensation pulses are substantially uniform, wherein the amplitudes of each of the first and one or more other feedthrough compensation pulses is less than an amplitude required to eliminate feedthrough compensation from the control pulse to the floating diffusion in absence of the one or more other feedthrough compensation pulses.

7. An integrated-circuit image sensor comprising:
a first pixel having a photosensitive element, floating diffusion node and transfer gate disposed between the photosensitive element and floating diffusion node;
a first signal line connected to the transfer gate and having a capacitive coupling to the floating diffusion node;
a second signal line having a capacitive coupling to the floating diffusion node;
control circuitry to generate (i) a control pulse on the first signal line that when applied to the transfer gate, enables photocharge accumulated within the photosensitive element to be transferred from the photosensitive element to the floating diffusion node, and (ii) a first feedthrough compensation pulse on the second signal line having a pulse polarity opposite a pulse polarity of the control pulse and timed to coincide with the control pulse such that capacitive feedthrough of the control pulse to the floating diffusion node is reduced; and
additional pixels that, together with the first pixel, form a pixel array, wherein the first signal line is connected in common to respective transfer gates of pixels in a first row of the pixel array, including the first pixel, and wherein the second signal line is connected in common to pixels in a second row of the pixel array, and wherein the second signal line is coupled to a respective transfer gate within each of the pixels in the second row of the pixel array.

8. An integrated-circuit image sensor comprising:
a first pixel having a photosensitive element, floating diffusion node and transfer gate disposed between the photosensitive element and floating diffusion node;
a first signal line connected to the transfer gate and having a capacitive coupling to the floating diffusion node;
a second signal line having a capacitive coupling to the floating diffusion node;
control circuitry to generate (i) a control pulse on the first signal line that, when applied to the transfer gate, enables photocharge accumulated within the photosensitive element to be transferred from the photosensitive element to the floating diffusion node, and (ii) a first feedthrough compensation pulse on the second signal line having a pulse polarity opposite a pulse polarity of the control pulse and timed to coincide with the control pulse such that capacitive feedthrough of the control pulse to the floating diffusion node is reduced; and
additional pixels that, together with the first pixel, form a pixel array, wherein the first signal line is connected in common to respective transfer gates of pixels in a first row of the pixel array, including the first pixel, and wherein the second signal line is connected in common to pixels in a second row of the pixel array, and wherein the second signal line is coupled to a respective reset transistor within each of the pixels in the second row of the pixel array.

9. An integrated-circuit image sensor comprising:
a first pixel having a photosensitive element, floating diffusion node and transfer gate disposed between the photosensitive element and floating diffusion node;
a first signal line connected to the transfer gate and having a capacitive coupling to the floating diffusion node;
a second signal line having a capacitive coupling to the floating diffusion node;
control circuitry to generate (i) a control pulse on the first signal line that, when applied to the transfer gate, enables photocharge accumulated within the photosensitive element to be transferred from the photosensitive element to the floating diffusion node, and (ii) a first feedthrough compensation pulse on the second signal line having a pulse polarity opposite a pulse polarity of the control pulse and timed to coincide with the control pulse such that capacitive feedthrough of the control pulse to the floating diffusion node is reduced; and
wherein the first pixel comprises a row-select transistor to switchably couple the first pixel to an output line of the pixel array such that a signal corresponding to a charge level of the floating diffusion node is generated on the output line, and wherein the second signal line is connected to the row-select transistor.

10. The integrated-circuit image sensor of claim 9 wherein the control circuitry comprises circuitry to raise the second signal line to a first predetermined voltage level to switch the row-select transistor from a non-conducting state to a conducting state and to generate the first feedthrough compensation pulse by lowering the second signal line from the first predetermined voltage to a second predetermined voltage level and then restoring the second signal line to the first predetermined voltage level.

11. An integrated-circuit image sensor comprising:
a first pixel having a photosensitive element, floating diffusion node and transfer gate disposed between the photosensitive element and floating diffusion node;
a first signal line connected to the transfer gate and having a capacitive coupling to the floating diffusion node;
a second signal line having a capacitive coupling to the floating diffusion node;
control circuitry to generate (i) a control pulse on the first signal line that, when applied to the transfer gate, enables photocharge accumulated within the photosensitive element to be transferred from the photosensitive element to the floating diffusion node, and (ii) a first feedthrough compensation pulse on the second signal line having a pulse polarity opposite a pulse polarity of the control pulse and timed to coincide with the control pulse such that capacitive feedthrough of the control pulse to the floating diffusion node is reduced; and wherein the control circuitry to generate the control pulse on the first signal line and the first feedthrough compensation pulse on the second signal line comprises circuitry to generate, on a third signal line of the pixel array that also has a capacitive coupling to the floating diffusion node of the first pixel, a second feedthrough compensation pulse having a pulse polarity opposite the pulse polarity of the control pulse and that is timed to coincide with the first feedthrough compensation pulse such that the first and second feedthrough compensation pulses act jointly to reduce capacitive feedthrough of the control pulse to the floating diffusion node.

12. An integrated-circuit image sensor comprising:
a first pixel having a photosensitive element, floating diffusion node and transfer gate disposed between the photosensitive element and floating diffusion node;
a first signal line connected to the transfer gate and having a capacitive coupling to the floating diffusion node;
a second signal line having a capacitive coupling to the floating diffusion node;
control circuitry to generate (i) a control pulse on the first signal line that, when applied to the transfer gate, enables photocharge accumulated within the photosensitive element to be transferred from the photosensitive element to the floating diffusion node, and (ii) a first feedthrough compensation pulse on the second signal line having a pulse polarity opposite a pulse polarity of the control pulse and timed to coincide with the control pulse such that capacitive feedthrough of the control pulse to the floating diffusion node is reduced; and
wherein the control circuitry comprises circuitry to generate one or more other feedthrough compensation pulses on one or more other signal lines of the pixel array, respectively, each of the one or more other feedthrough compensation pulses having a pulse polarity opposite the pulse polarity of the control pulse and being timed to coincide with the first feedthrough compensation pulse such that (i) the first feedthrough compensation pulse and the one or more other feedthrough compensation pulses act in combination to reduce capacitive feedthrough of the control pulse to the floating diffusion node, and (ii) amplitudes of each of the first and one or more other feedthrough compensation pulses are substantially uniform, and wherein the amplitudes of each of the first and one or more other feedthrough compensation pulses is less than an amplitude required to eliminate feedthrough compensation from the control pulse to the floating diffusion in absence of the one or more other feedthrough compensation pulses.

13. An integrated-circuit image sensor comprising:
a pixel array;
means for generating, on a first signal line of the pixel array that is connected to a transfer gate of a first pixel within the pixel array, a control pulse that enables photocharge accumulated within a photosensitive element of the first pixel to be transferred to a floating diffusion node, the first signal line having a capacitive coupling to the floating diffusion node;
means for generating, on a second signal line of the pixel array that also has a capacitive coupling to the floating diffusion node, a first feedthrough compensation pulse having a pulse polarity opposite a pulse polarity of the control pulse and that is timed to coincide with the control pulse such that capacitive feedthrough of the control pulse to the floating diffusion node is reduced; and
wherein the pixel array comprises a first pixel row constituted by a first plurality of pixels, including the first pixel, connected to the first signal line, and a second pixel row constituted by a second plurality of pixels connected to the second signal line, and wherein the second signal line is coupled to a respective transfer gate within each pixel of the second plurality of pixels.

* * * * *